(12) United States Patent
Jung et al.

(10) Patent No.: US 12,051,722 B2
(45) Date of Patent: Jul. 30, 2024

(54) SEMICONDUCTOR DEVICES

(71) Applicant: SAMSUNG ELECTRONICS CO., LTD., Suwon-si (KR)

(72) Inventors: Sujin Jung, Suwon-si (KR); Kihwan Kim, Suwon-si (KR); Sunguk Jang, Suwon-si (KR); Youngdae Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/205,671

(22) Filed: Jun. 5, 2023

(65) Prior Publication Data
US 2023/0307498 A1 Sep. 28, 2023

Related U.S. Application Data

(63) Continuation of application No. 17/559,347, filed on Dec. 22, 2021, now Pat. No. 11,670,680, which is a
(Continued)

(30) Foreign Application Priority Data

May 17, 2019 (KR) .................. 10-2019-0057955

(51) Int. Cl.
*H01L 29/10* (2006.01)
*H01L 29/06* (2006.01)
(Continued)

(52) U.S. Cl.
CPC ...... *H01L 29/1037* (2013.01); *H01L 29/0653* (2013.01); *H01L 29/0665* (2013.01);
(Continued)

(58) Field of Classification Search
CPC ............ H01L 29/1037; H01L 29/0653; H01L 29/0665; H01L 29/0847; H01L 29/1608; H01L 29/42392; H01L 29/785; H01L 29/78696; H01L 29/0673; H01L 21/823481; H01L 21/823425; H01L 29/165; H01L 27/088; H01L 29/0669; H01L 29/66439; H01L 29/775; H01L 29/78; H01L 29/0603; H01L 29/0684; H01L 29/417; H01L 29/423;
(Continued)

(56) References Cited

U.S. PATENT DOCUMENTS 8,815,691 B2   8/2014  Colinge et al.
9,647,098 B2   5/2017  Obradovic et al.
(Continued)

*Primary Examiner* — Jonathan Han
(74) *Attorney, Agent, or Firm* — F. CHAU & ASSOCIATES, LLC

(57) ABSTRACT

A semiconductor device including: an active pattern on a substrate, the active pattern including a recess, the recess having a "V" shape; a growth prevention pattern on the recess; gate structures on portions of the active pattern at opposite sides of the recess; channels spaced apart from each other in a vertical direction perpendicular to an upper surface of the substrate, each of the channels extending through one of the gate structures; and a source/drain layer on the growth prevention pattern, the source/drain layer contacting the channels.

20 Claims, 51 Drawing Sheets

Related U.S. Application Data continuation of application No. 16/751,726, filed on Jan. 24, 2020, now Pat. No. 11,211,456.

(51) Int. Cl.
*H01L 29/08* (2006.01)
*H01L 29/16* (2006.01)
*H01L 29/423* (2006.01)
*H01L 29/78* (2006.01)
*H01L 29/786* (2006.01)

(52) U.S. Cl.
CPC ...... *H01L 29/0847* (2013.01); *H01L 29/1608* (2013.01); *H01L 29/42392* (2013.01); *H01L 29/785* (2013.01); *H01L 29/78696* (2013.01)

(58) Field of Classification Search
CPC ............. H01L 21/8234; H01L 29/1025; H01L 29/41775; H01L 29/4236; B82Y 10/00
See application file for complete search history.

(56) References Cited

U.S. PATENT DOCUMENTS

| | | | |
|---|---|---|---|
| 9,941,405 B2 | 4/2018 | Kittl et al. | |
| 9,947,804 B1* | 4/2018 | Frougier | H01L 29/165 |
| 10,128,379 B2 | 11/2018 | Song et al. | |
| 10,170,638 B1* | 1/2019 | Reznicek | H01L 29/0649 |
| 11,211,456 B2 | 12/2021 | Jung et al. | |
| 2016/0204228 A1* | 7/2016 | Tapily | H01L 29/78618 438/151 |
| 2018/0006139 A1 | 1/2018 | Seo | |
| 2018/0047832 A1* | 2/2018 | Tapily | H01L 29/66545 |
| 2018/0294331 A1 | 10/2018 | Cho et al. | |
| 2018/0301564 A1 | 10/2018 | Kwon et al. | |
| 2018/0374946 A1 | 12/2018 | Pawlak | |
| 2019/0157414 A1* | 5/2019 | Ando | H01L 21/02603 |
| 2019/0305104 A1* | 10/2019 | Xie | H01L 29/4908 |
| 2020/0365692 A1 | 11/2020 | Jung et al. | |
| 2022/0115514 A1 | 4/2022 | Jung et al. | |

\* cited by examiner

FIG. 5
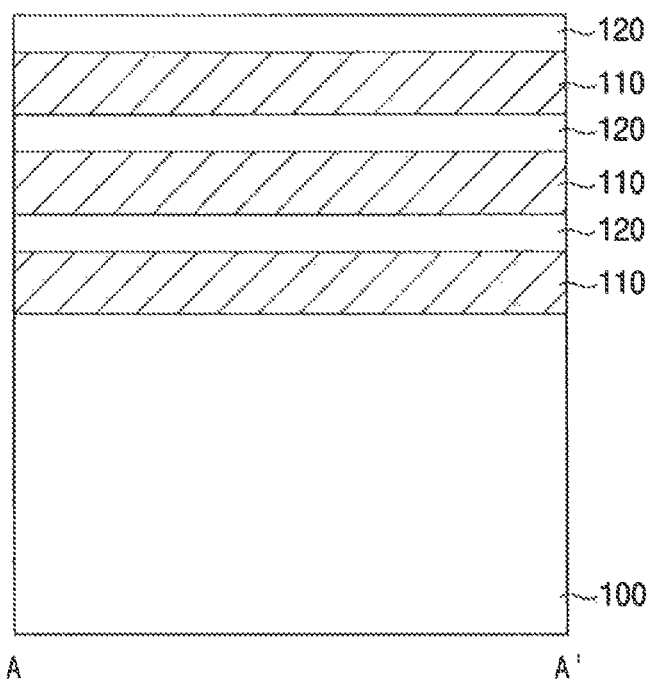
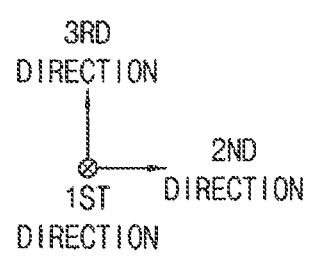

FIG. 7
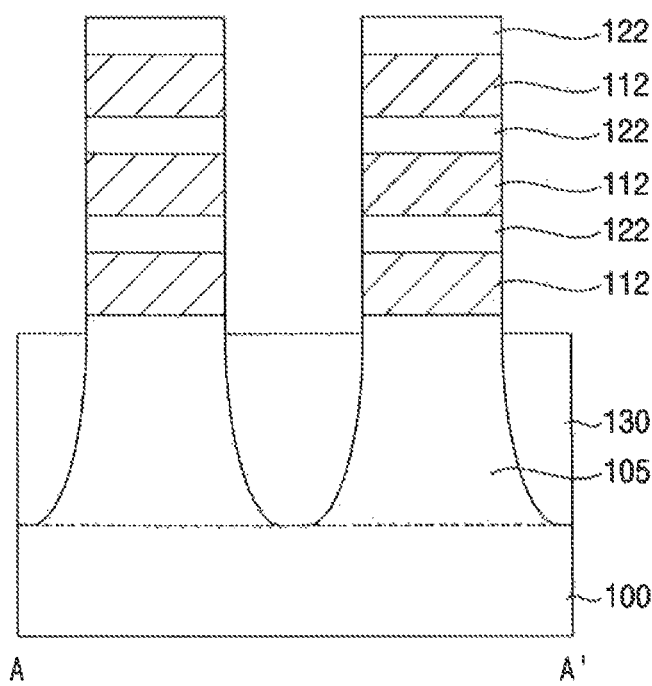
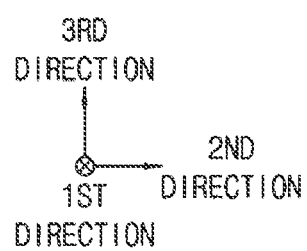

FIG. 9
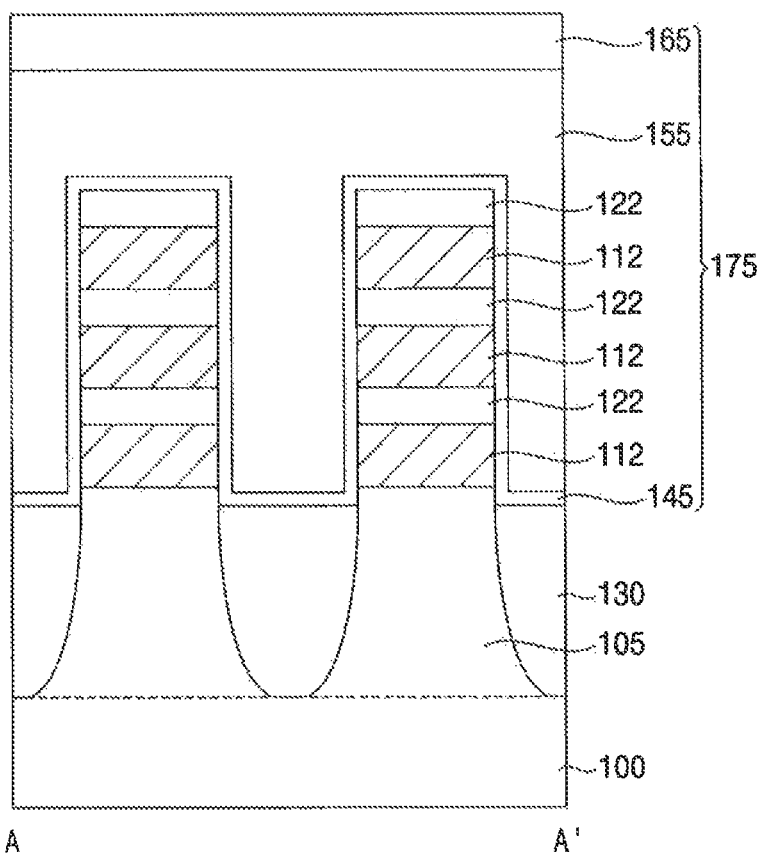
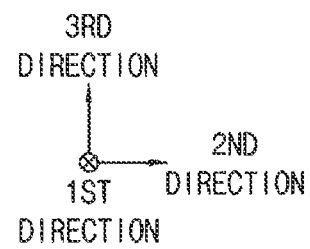

FIG. 33
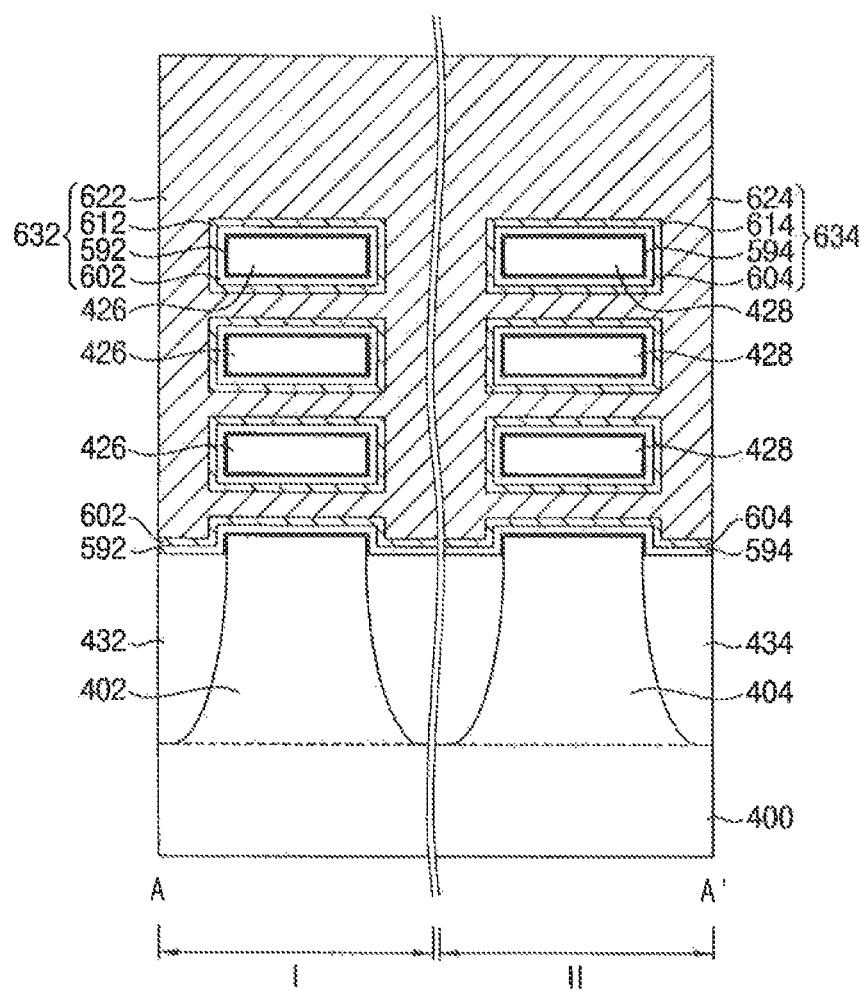
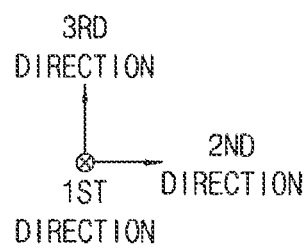

FIG. 39
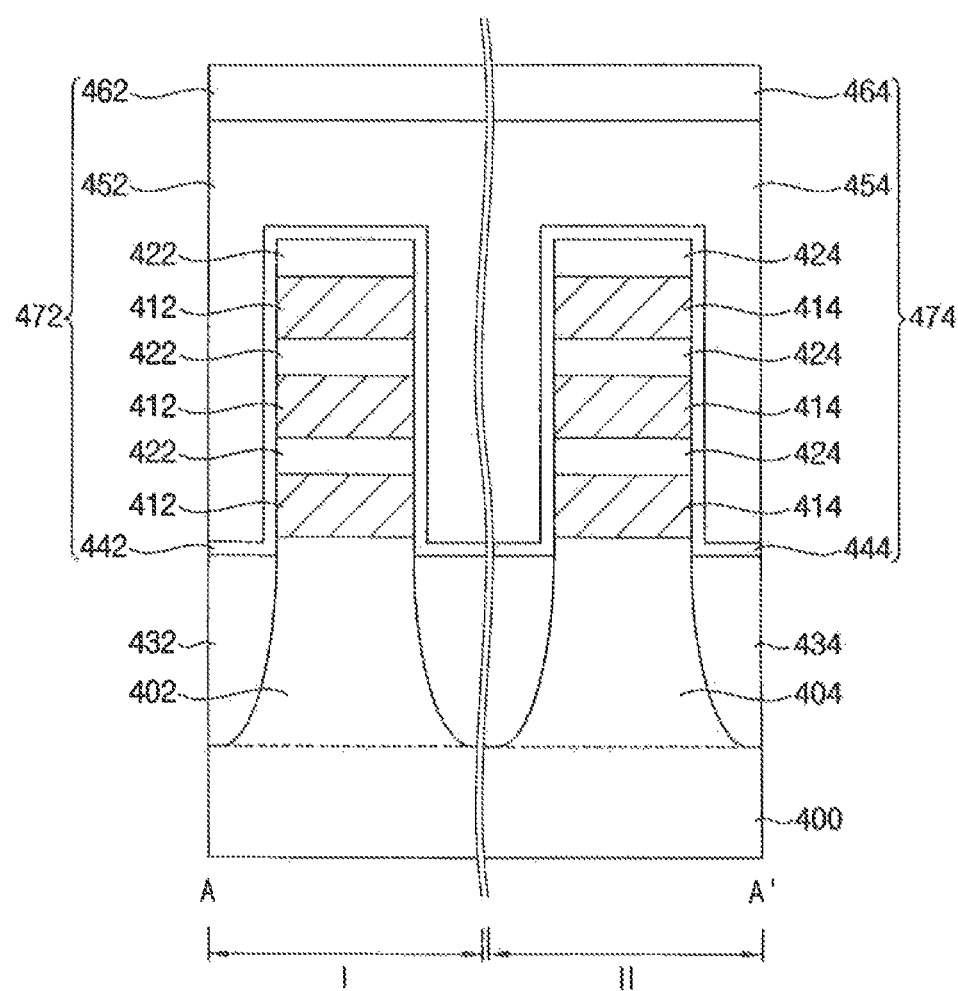
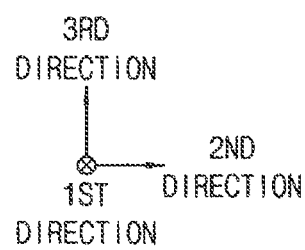

FIG. 42
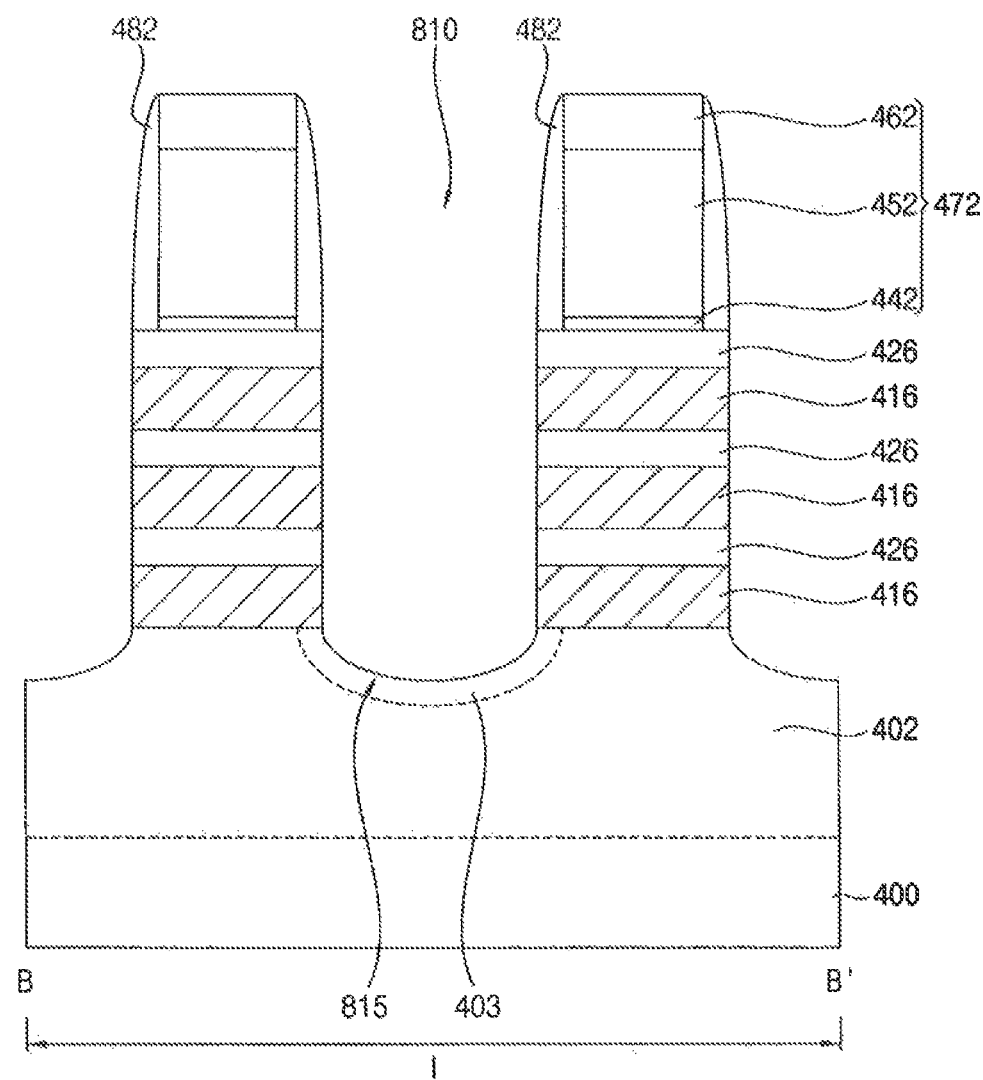
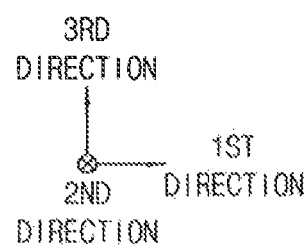

FIG. 44
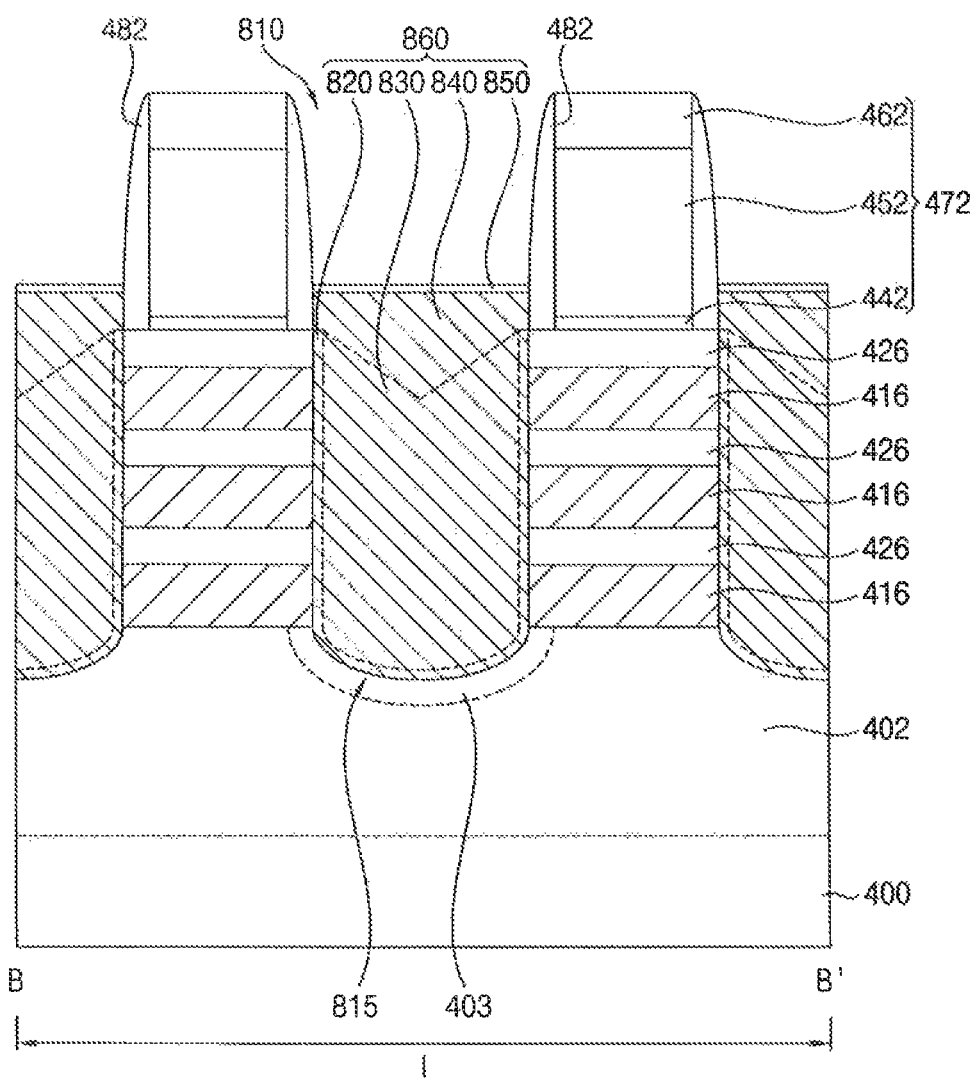
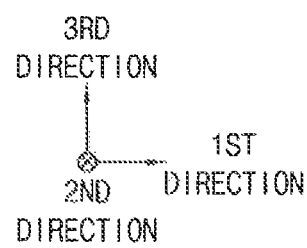

FIG. 46
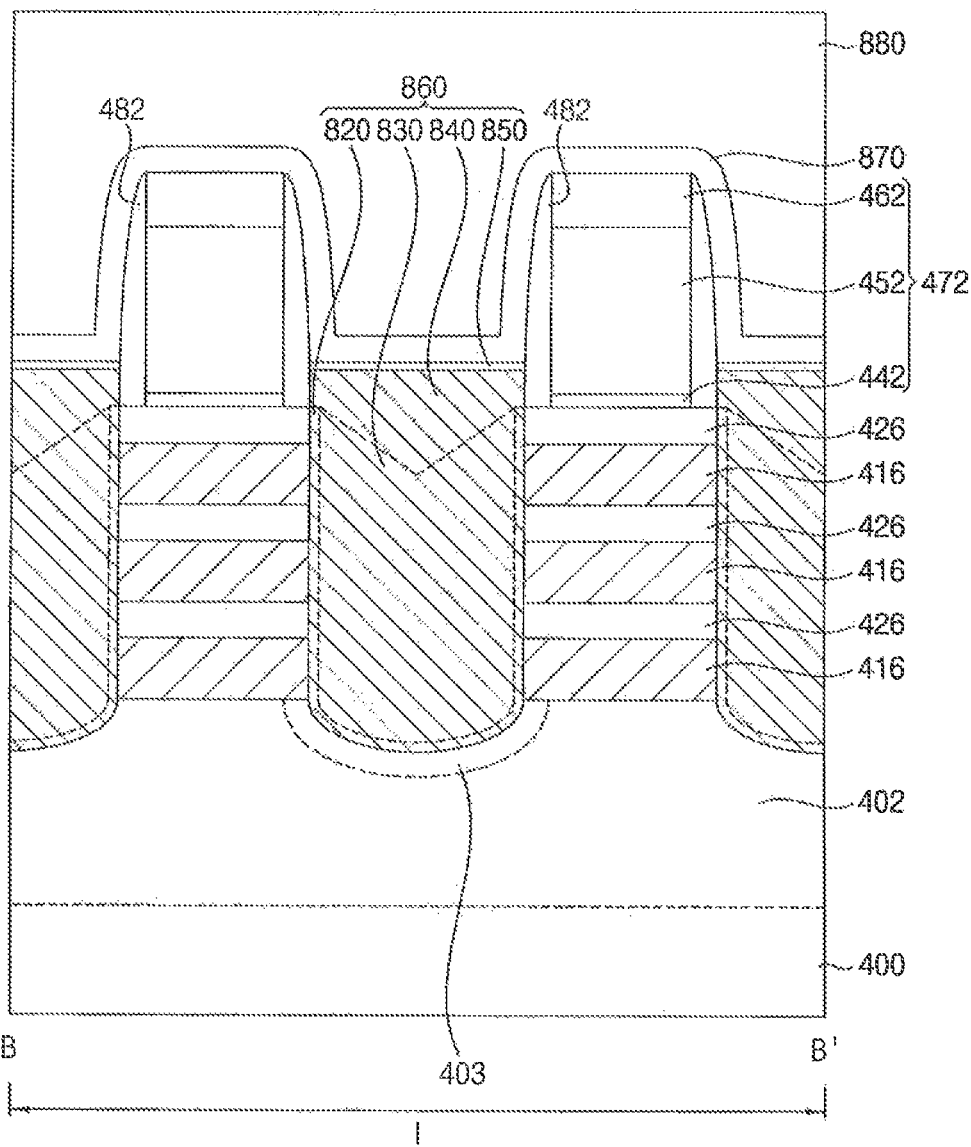
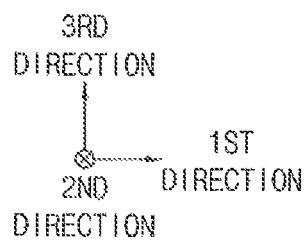

FIG. 49
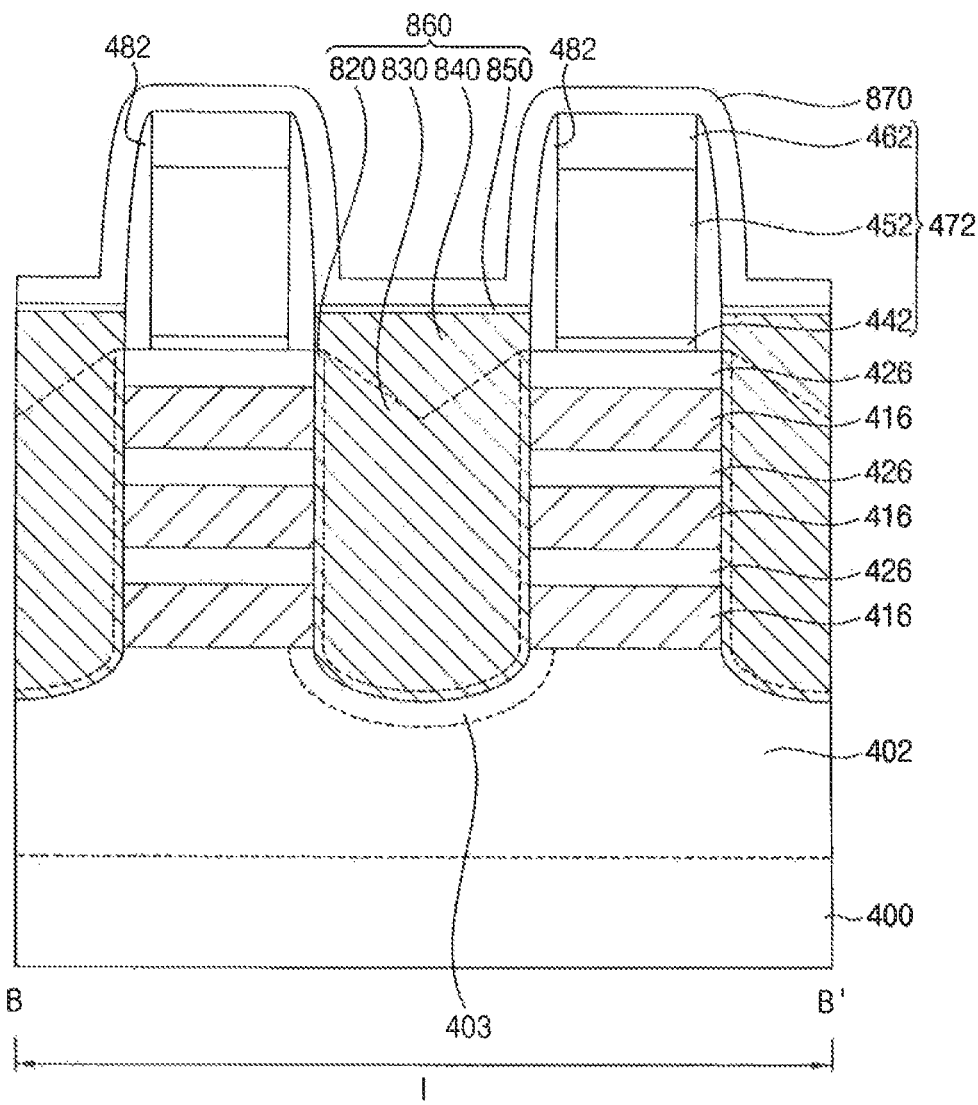
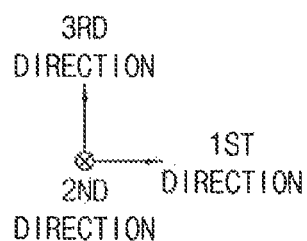

FIG. 50
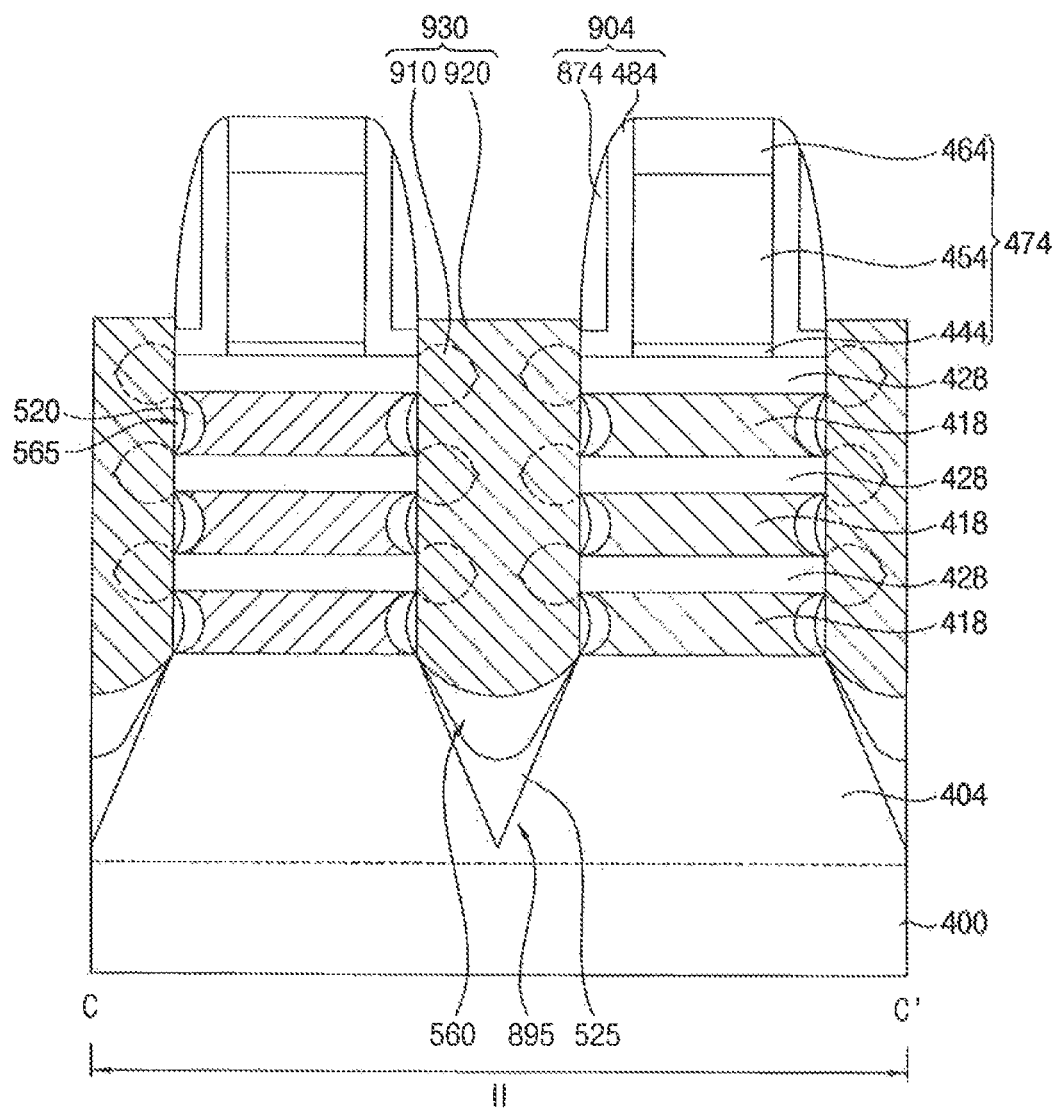
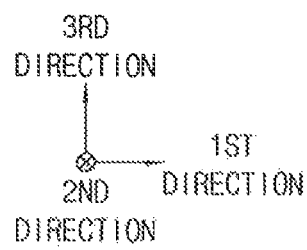

SEMICONDUCTOR DEVICES

CROSS-REFERENCE TO RELATED APPLICATIONS

This application is a continuation of U.S. patent application Ser. No. 17/559,347 filed on Dec. 22, 2021, which is a continuation of U.S. patent application Ser. No. 16/751,726 filed on Jan. 24, 2020, now U.S. Pat. No. 11,211,456 issued on Dec. 28, 2021, which claims priority under 35 U.S.C. § 119 to Korean Patent Application No. 10-2019-0057955, filed on May 17, 2019 in the Korean Intellectual Property Office (KIPO), the disclosures of which are incorporated by reference herein in their entireties.

TECHNICAL FIELD

Exemplary embodiments of the inventive concept relate to semiconductor devices. More particularly, exemplary embodiments of the inventive concept relate to semiconductor devices having vertically stacked channels.

DESCRIPTION OF THE RELATED ART

When a multi-bridge-channel metal-oxide-semiconductor field-effect transistor (MBC MOSFET) including a plurality of vertically stacked channels is fabricated, a source/drain layer may be formed to commonly contact the channels. The source/drain layer may include a plurality of layers having different concentrations of impurities from each other. If the impurity concentrations of the source/drain layer near the channels are not properly controlled, the channels may have non-uniform electrical characteristics.

SUMMARY

According to an exemplary embodiment of the inventive concept, there is provided a semiconductor device including: an active pattern on a substrate, the active pattern including a recess, the recess having a "V" shape; a growth prevention pattern on the recess; gate structures on portions of the active pattern at opposite sides of the recess; channels spaced apart from each other in a vertical direction perpendicular to an upper surface of the substrate, each of the channels extending through one of the gate structures; and a source/drain layer on the growth prevention pattern, the source/drain layer contacting the channels.

According to an exemplary embodiment of the inventive concept, there is provided a semiconductor device including: an active pattern on a substrate; channels spaced apart from each other in a first direction perpendicular to a surface of the substrate; a gate structure on the active pattern, the gate structure surrounding at least a portion of a surface of each of the channels; and a source/drain layer on a portion of the active pattern at each of opposite sides of the gate structure and contacting the channels, the source/drain layer including a semiconductor material doped with impurities and including: a first epitaxial layer on a sidewall of each of the channels, the first epitaxial layer including a first impurity concentration; and a second epitaxial layer on the active pattern, the second epitaxial layer surrounding the first epitaxial layers and having a second impurity concentration greater than the first impurity concentration, wherein a growth prevention pattern is formed between the active pattern and the source/drain layer.

According to an exemplary embodiment of the inventive concept, there is provided a semiconductor device including: an active pattern on a substrate; a gate structure on the active pattern; channels spaced apart from each other in a direction perpendicular to an upper surface of the substrate, each of the channels disposed in the gate structure; a blocking layer on a portion of the active pattern at each of opposite sides of the gate structure; a source/drain layer on the blocking layer, the source/drain layer being connected to the channels; a spacer on a sidewall of a first portion of the gate structure between the channels and on a sidewall of a second portion of the gate structure between an upper surface of the active pattern and a lowermost one of the channels; and an air gap between the spacer and the source/drain layer.

According to an exemplary embodiment of the inventive concept, there is provided a semiconductor device including: an active pattern on a substrate, the active pattern including a recess on its upper surface; gate structures on a first portion of the active pattern at a first side of the recess and a second portion of the active pattern at a second side of the recess; channels spaced apart from each other in a vertical direction perpendicular to an upper surface of the substrate, each of the channels extending through one of the gate structures; and a source/drain layer on the active pattern, the source/drain layer being connected to the channels and including a semiconductor material doped with impurities, wherein an impurity concentration of the source/drain layer between the channels at the same level varies from a first sidewall of a first channel of the channels to a second sidewall of a second channel of the channels facing the first sidewall of the first channel, the impurity concentration having a first impurity concentration, a second impurity concentration, and a third impurity concentration in this order from the first sidewall to the second sidewall.

According to an exemplary embodiment of the inventive concept, there is provided a semiconductor device including: a first transistor including: a first active pattern on a first region of a substrate, the first active pattern including a first recess on its upper surface, and the substrate including the first region and a second region; first gate structures on portions of the first active pattern at opposite sides of the first recess; first channels spaced apart from each other in a vertical direction perpendicular to an upper surface of the substrate, each of the first channels extending through one of the first gate structures; and a first source/drain layer on the first recess of the first active pattern, the first source/drain layer being connected to the first channels; and a second transistor including: a second active pattern on the second region of the substrate, the second active pattern including a second recess on its upper surface, the second recess having a "V" shape; a growth prevention pattern on the second recess of the second active pattern; second gate structures on portions of the second active pattern at opposite sides of the second recess; second channels spaced apart from each other in the vertical direction, each of the second channels extending through one of the second gate structures; and a second source/drain layer on the growth prevention pattern, the second source/drain layer being connected to the second channels.

According to an exemplary embodiment of the inventive concept, there is provided a semiconductor device including: first channels on a first region of a substrate, the first channels being spaced apart from each other in a vertical direction perpendicular to an upper surface of the substrate, the substrate including the first region and a second region; a first gate structure on the first region of the substrate, the first gate structure disposed adjacent to at least a portion of a surface of each of the first channels; a first source/drain layer on a portion of the substrate at each of opposite sides of the first gate structure, the first source/drain layer being connected to the first channels and including: a first epitaxial layer extending in the vertical direction on sidewalls of the first channels; and a second epitaxial layer on a surface of the first epitaxial layer, the second epitaxial layer having a second impurity concentration greater than the first impurity concentration; second channels on the second region of the substrate, the second channels being spaced apart from each other in the vertical direction; a second gate structure on the second region of the substrate, the second gate structure disposed adjacent to at least a portion of a surface of each of the second channels; a second source/drain layer on a portion of the substrate at each of opposite sides of the second gate structure, the second source/drain layer being connected to the second channels and including: a third epitaxial layer extending in the vertical direction on a sidewall of each of the second channels, the third epitaxial layer having a third impurity concentration; and a fourth epitaxial layer on a surface of the third epitaxial layer, the fourth epitaxial layer having a fourth impurity concentration greater than the third impurity concentration.

BRIEF DESCRIPTION OF THE DRAWINGS

FIGS. 4, 5, 6, 7, 8, 9, 10, 11, 12, 13, 14, 15, 16, 17 and 18 are plan views and cross-sectional views illustrating a method of manufacturing a semiconductor device in accordance with exemplary embodiments of the inventive concept;

FIGS. 32, 33, 34 and 35 are a plan view and cross-sectional views illustrating a semiconductor device in accordance with exemplary embodiments of the inventive concept;

FIGS. 36, 37, 38, 39, 40, 41, 42, 43, 44, 45, 46, 47, 48, 49 and 50 are plan views and cross-sectional views illustrating a method of manufacturing a semiconductor device in accordance with exemplary embodiments of the inventive concept.

DETAILED DESCRIPTION OF THE EMBODIMENTS

Figure 1:
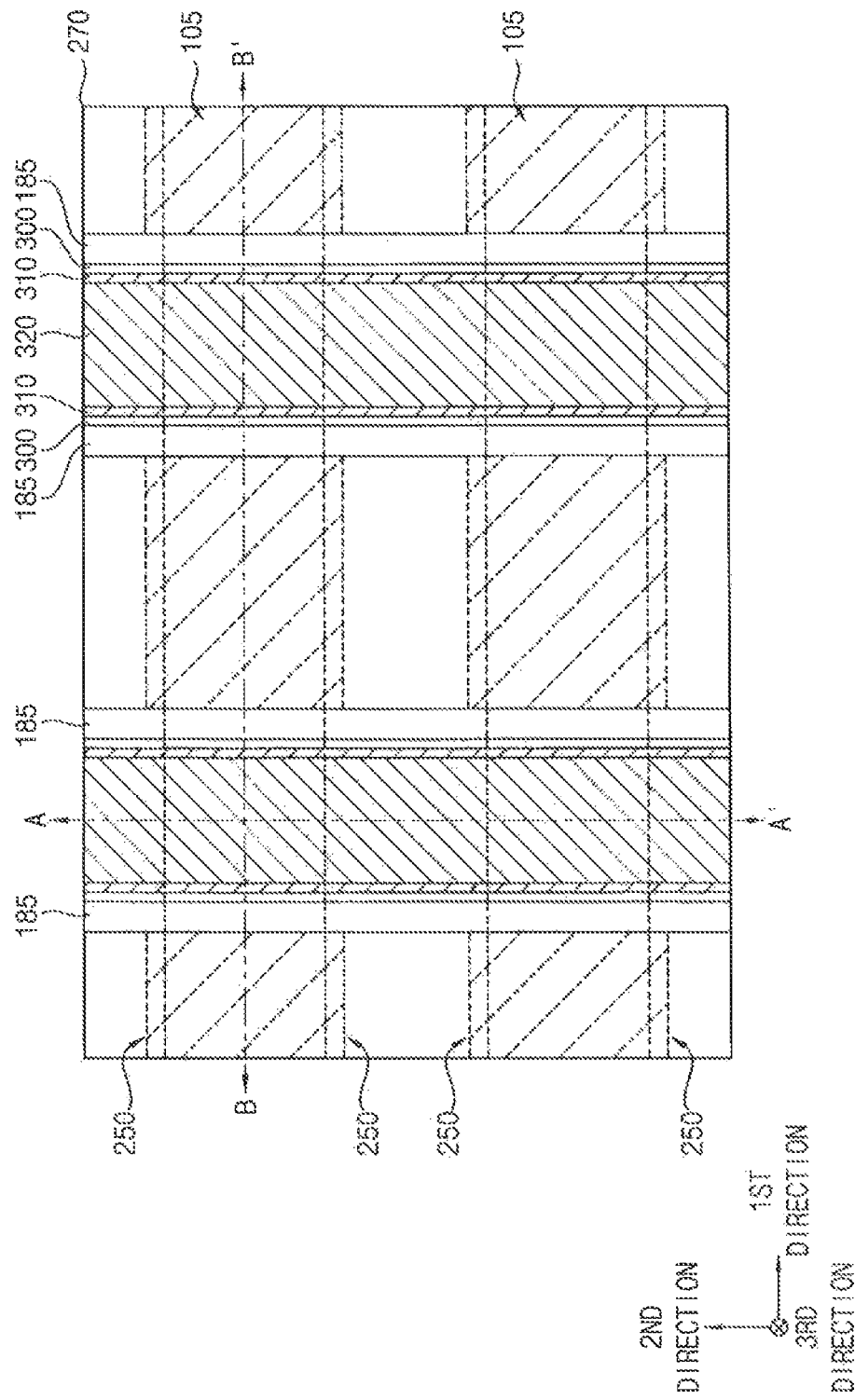
FIGS. 1, 2 and 3 are a plan view and cross-sectional views illustrating a semiconductor device in accordance with exemplary embodiments of the inventive concept.
Figure 2:
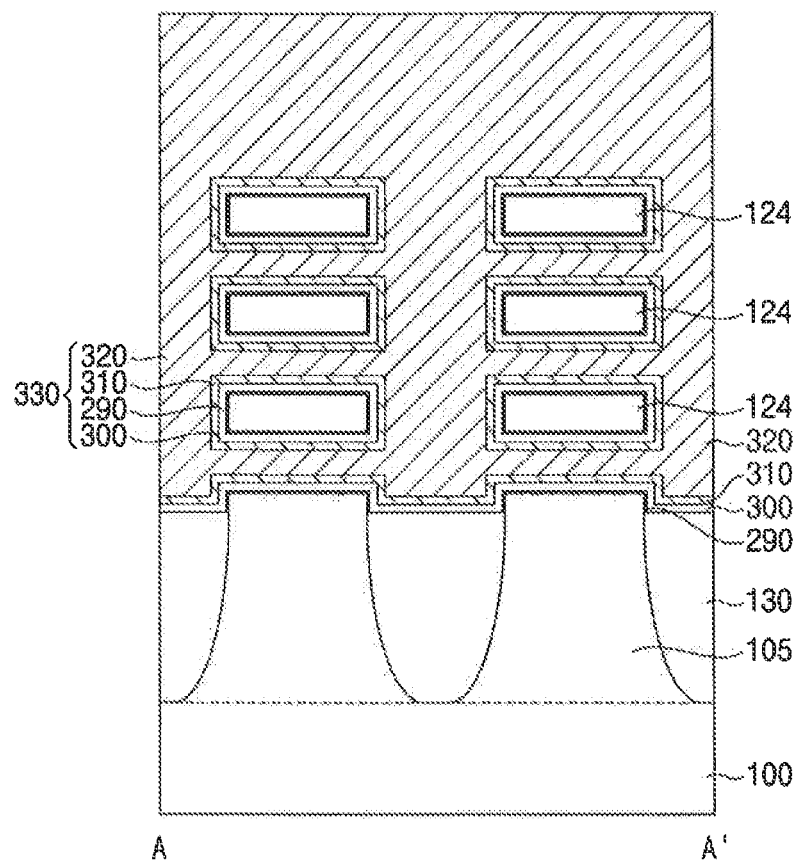
Figure 3:
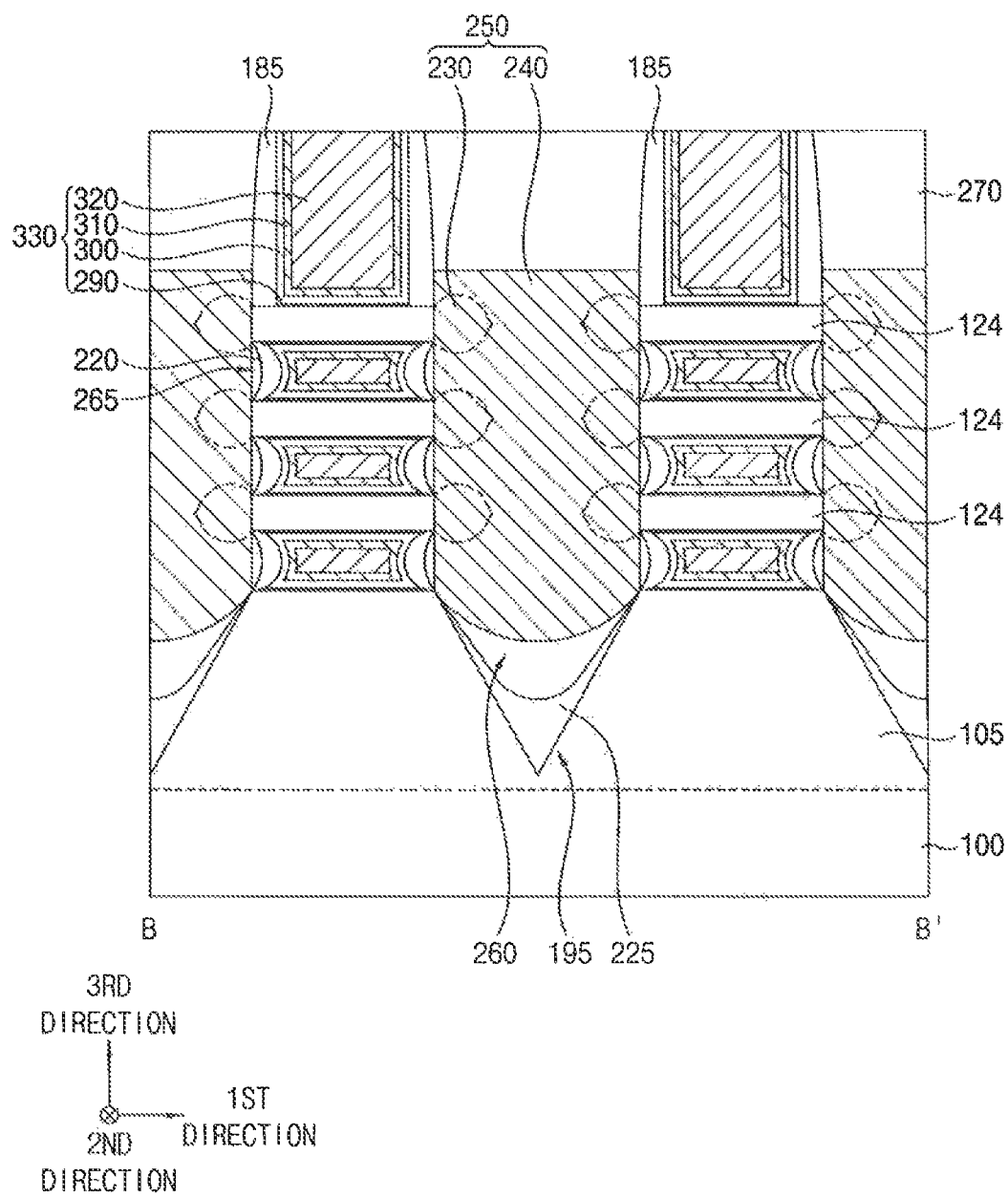

FIGS. 1 to 3 are a plan view and cross-sectional views illustrating a semiconductor device in accordance with exemplary embodiments of the inventive concept. FIG. 1 is the plan view, FIG. 2 is a cross-sectional view taken along a line A-A' of FIG. 1, and FIG. 3 is a cross-sectional view taken along a line B-B' of FIG. 1.

Hereinafter, two directions substantially parallel to an upper surface of a substrate 100 and crossing each other may be referred to as first and second directions, respectively, and a direction substantially perpendicular to the upper surface of the substrate 100 may be referred to as a third direction. In exemplary embodiments of the inventive concept, the first and second directions may be substantially perpendicular to each other.

Referring to FIGS. 1 to 3, the semiconductor device may include an active pattern 105, a growth prevention pattern 225, a gate structure 330, a semiconductor pattern 124, and a source/drain layer 250 on the substrate 100. The semiconductor device may further include a gate spacer 185, an inner spacer 220, an isolation pattern 130, and an insulation layer 270.

The substrate 100 may include a semiconductor material, e.g., silicon, germanium, silicon-germanium, etc., or III-V semiconductor compounds, e.g., GaP, GaAs, GaSb, etc.

The active pattern 105 may protrude from the substrate 100 in the third direction, and may extend in the first direction. In the figures, two active patterns 105 are shown, however, the inventive concept may not be limited thereto. Thus, more than two active patterns 105 may be spaced apart from each other in the second direction. The active pattern 105 may be formed by partially removing an upper portion of the substrate 100, and thus, the active pattern 105 may include a material substantially the same as that of the substrate 100.

A sidewall of the active pattern 105 may be covered by the isolation pattern 130. The isolation pattern 130 may include an oxide, e.g., silicon oxide.

A first recess 195 may be formed on an upper surface of the active pattern 105 to have a cross-section in the first direction with a "V" shape.

In exemplary embodiments of the inventive concept, the growth prevention pattern 225 may be formed on the first recess 195. A portion of the growth prevention pattern 225 on a central portion of the first recess 195 in the first direction may have a greatest thickness, and a portion of the growth prevention pattern 225 on each of opposite edges of the first recess 195 in the first direction may have a smallest thickness. In other words, the growth prevention pattern 225 at the center of the first recess 195 may be thicker than the growth prevention pattern 225 at opposite edges of the first recess 195 along the first direction. In exemplary embodiments of the inventive concept, the growth prevention pattern 225 may entirely cover an upper surface of the active pattern 105 exposed by the first recess 195. The growth prevention pattern 225 may include a nitride, e.g., silicon nitride.

A plurality of semiconductor patterns 124 may be formed at a plurality of levels, respectively, to be spaced apart from each other in the third direction from an upper surface of the active region 105. In the figures, the semiconductor patterns 124 are shown at three levels, respectively, however, the inventive concept may not be limited thereto.

In the figures, only two semiconductor patterns 124 spaced apart from each other in the first direction are shown at each level on the active pattern 105 extending in the first direction, however, the inventive concept may not be limited thereto. For example, more than two semiconductor patterns 124 may be spaced apart from each other in the first direction at each level on the active pattern 105.

In exemplary embodiments of the inventive concept, the semiconductor pattern 124 may be nanosheets or nanowires including a semiconductor material, e.g., silicon, germanium, etc. In exemplary embodiments of the inventive concept, the semiconductor pattern 124 may serve as a channel of a transistor. In this case, the semiconductor pattern 124 may be referred to as the channel.

The gate structure 330 may be formed on the substrate 100, and may surround a central portion of the semiconductor pattern 124 in the first direction. In the figures, the gate structure 330 is shown to cover the semiconductor patterns 124 on two active patterns 105, however, the inventive concept may not be limited thereto. In other words, the gate structure 330 may extend in the second direction on the substrate 100 having the isolation pattern 130 thereon, and may cover the semiconductor patterns 124 on more than two active patterns 105 spaced apart from each other in the second direction.

In the figures, two gate structures 330 are shown on the substrate 100, however, the inventive concept may not be limited thereto. For example, more than two gate structures 330 spaced apart from each other in the first direction may be formed on the substrate 100.

In exemplary embodiments of the inventive concept, the gate structure 330 may be formed on a portion of the active pattern 105 at each of opposite sides of the first recess 195 in the first direction.

The gate structure 330 may include an interface pattern 290, a gate insulation pattern 300, a workfunction control pattern 310, and a gate electrode 320 sequentially stacked from a surface of each of the semiconductor patterns 124 or the upper surface of the active pattern 105.

The interface pattern 290 may be formed on the upper surface of the active pattern 105 and the surfaces of the semiconductor patterns 124, and the gate insulation pattern 300 may be formed on a surface of the interface pattern 290, and inner sidewalls of the gate spacer 185 and the inner spacer 220. The workfunction control pattern 310 may be formed on the gate insulation pattern 300. The gate electrode 320 may fill a space between the semiconductor patterns 124 spaced apart from each other in the third direction and the inner spacers 220 spaced apart from each other in the first direction. The gate electrode 320 may also fill a space between the gate spacers 185 spaced apart from each other in the first direction on an uppermost one of the semiconductor patterns 124.

The interface pattern 290 may include an oxide, e.g., silicon oxide, and the gate insulation pattern 300 may include a metal oxide having a high-k dielectric constant, e.g., hafnium oxide, tantalum oxide, zirconium oxide, etc. The workfunction control pattern 310 may include, e.g., titanium nitride, tantalum nitride, tungsten nitride, aluminum oxide, etc. The gate electrode 320 may include a metal, e.g., titanium, aluminum, etc., a metal alloy, or a nitride or carbide of the metal.

The gate structure 330 may be electrically insulated from the source/drain layer 250 by the gate spacer 185 and the inner spacer 220.

The gate spacer 185 may cover each of opposite sidewalls of an upper portion of the gate structure 330 in the first direction. The inner spacer 220 may cover each of opposite sidewalls of a lower portion of the gate structure 330 in the first direction. In exemplary embodiments of the inventive concept, the inner spacer 220 may have a cross-section in the first direction with a shape of a horseshoe or a shape of a semicircle having a recess on an outer sidewall thereof. Alternatively, the inner spacer 220 may have a cross-section in the first direction with a shape of a rounded rectangle having a recess on an outer sidewall thereof.

The gate spacer 185 may include a nitride, e.g., silicon oxynitride, silicon oxycarbonitride, etc., and the inner spacer 220 may include a nitride, e.g., silicon nitride.

In exemplary embodiments of the inventive concept, the inner spacer 220 may include a material substantially the same as that of the growth prevention pattern 225. In exemplary embodiments of the inventive concept, a lowermost one of the inner spacers 220 may contact and be connected to the growth prevention pattern 225.

The source/drain layer 250 may extend in the third direction on the growth prevention pattern 225, and may commonly contact respective sidewalls of the semiconductor patterns 124 in the first direction at the plurality of levels to be connected thereto.

The source/drain layer 250 may include first and second epitaxial layers 230 and 240. In exemplary embodiments of the inventive concept, each of the first epitaxial layers 230 may protrude from the sidewall of each of the semiconductor patterns 124 in the first direction, and may have a cross-section in the first direction with a shape of, e.g., a candle or an ellipse. In exemplary embodiments of the inventive concept, the second epitaxial layer 240 may extend from the growth prevention pattern 225 in the third direction to contact a lower sidewall of the gate spacer 185.

In exemplary embodiments of the inventive concept, each of the first and second epitaxial layers 230 and 240 may include single crystalline silicon carbide doped with n-type impurities or single crystalline silicon doped with n-type impurities. The first and second epitaxial layers 230 and 240 may have first and second impurity concentrations, respectively, and the second impurity concentration may be greater than the first impurity concentration.

In exemplary embodiments of the inventive concept, the first epitaxial layer 230, the second epitaxial layer 240 and the first epitaxial layer 230 may be sequentially arranged in the source/drain layer 250 between neighboring ones of the semiconductor patterns 124 in the first direction at the same level. In this case, the source/drain layer 250 may have a varying impurity concentration in the first direction, e.g., the first impurity concentration, the second impurity concentration and the first impurity concentration in the first direction.

In exemplary embodiments of the inventive concept, a first air gap 260 may be formed between the source/drain layer 250 and the growth prevention pattern 225 due to the crystallinity of the second epitaxial layer 240, and a second air gap 265 may be formed between the source/drain layer 250 and the inner spacer 220.

Since the source/drain layer 250 includes n-type impurities, the gate structure 330, the source/drain layer 250, and each of the semiconductor patterns 124 serving as a channel may form an n-type metal-oxide semiconductor (NMOS) transistor. A plurality of semiconductor patterns 124 may be sequentially stacked in the third direction, and thus the semiconductor device may be a multi-bridge-channel metal-oxide-semiconductor field-effect transistor (MBC MOS-FET).

The insulation layer 270 may surround an outer sidewall of the gate spacer 185 to cover the source/drain layer 250. The insulation layer 270 may include an oxide, e.g., silicon oxide.

The semiconductor device may further include contact plugs, wirings, etc., electrically connected to the source/drain layer 250 and/or the gate structure 330.

As described above, in the semiconductor device, the source/drain layer 250 may include not only the first epitaxial layer 230 having a relatively low impurity concentration but also the second epitaxial layer 240 having a relatively high impurity concentration between the channels at the same level. Thus, transistors including the channels may not experience performance deterioration due to the impurity concentration of the source/drain layer 250. This will be explained in more detail later.

Additionally, the growth prevention pattern 225 including an insulating material may be formed between the source/drain layer 250 and the active pattern 105, and thus, leakage currents from the source/drain layer 250 into the active pattern 105 may be prevented.

FIGS. 4 to 18 are plan views and cross-sectional views illustrating a method of manufacturing a semiconductor device in accordance with exemplary embodiments of the inventive concept. FIGS. 4, 8, 11 and 16 are the plan views, FIGS. 5-7, 9-10, 12-15 and 17-18 are the cross-sectional views.

FIGS. 5, 7 and 9 are cross-sectional views taken along lines A-A' of corresponding plan views, and FIGS. 10, 12-15 and 17-18 are cross-sectional views taken along lines B-B' of corresponding plan views.

Figure 4:
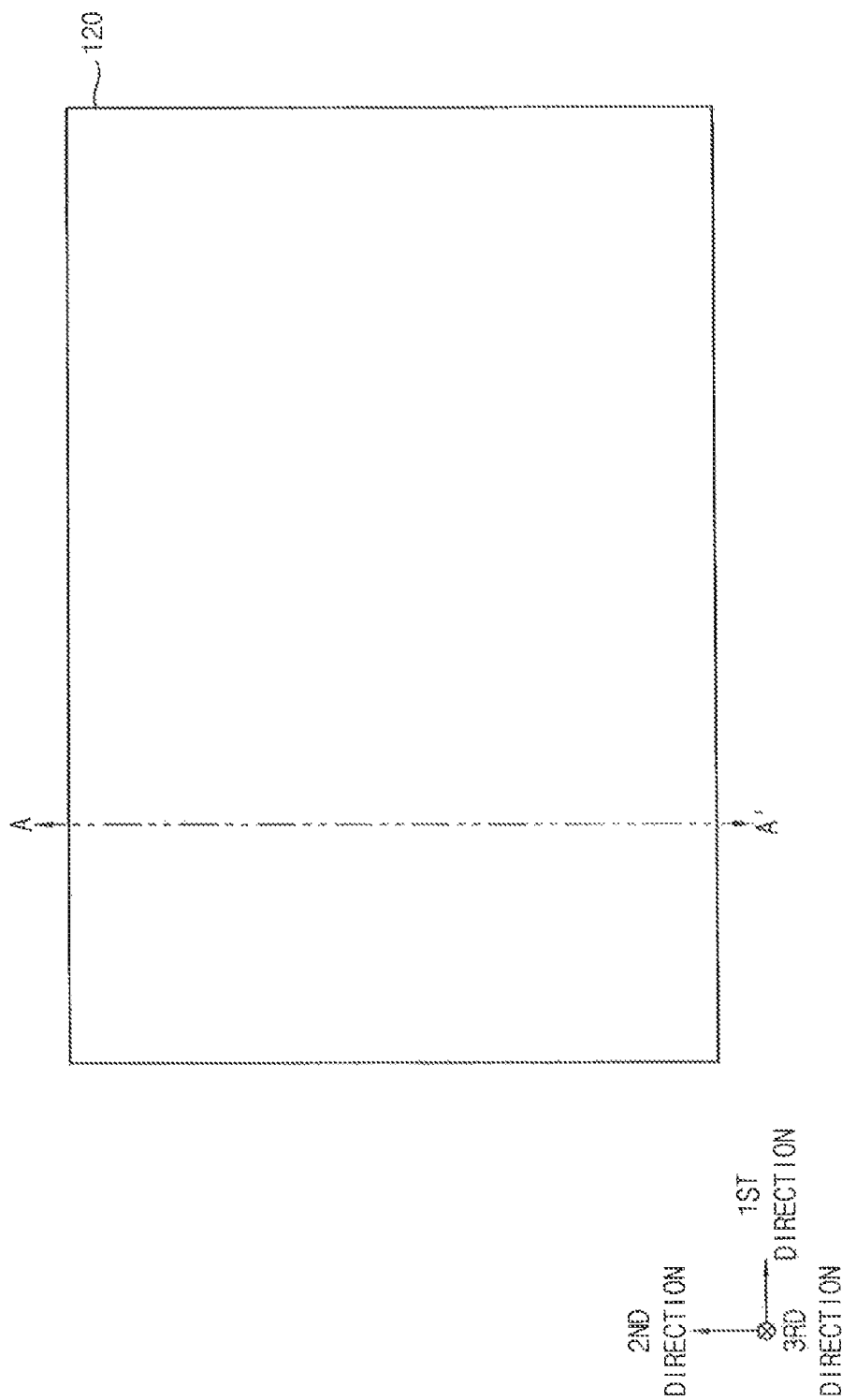

Referring to FIGS. 4 and 5, a sacrificial layer 110 and a semiconductor layer 120 may be alternately and repeatedly stacked on a substrate 100.

In the figures, three sacrificial layers 110 and three semiconductor layers 120 are stacked on the substrate 100, however, the inventive concept may not be limited thereto.

The sacrificial layer 110 may include a material having an etching selectivity with respect to the substrate 100 and the semiconductor layer 120. For example, the sacrificial layer 110 may include, e.g., silicon-germanium.

Figure 6:
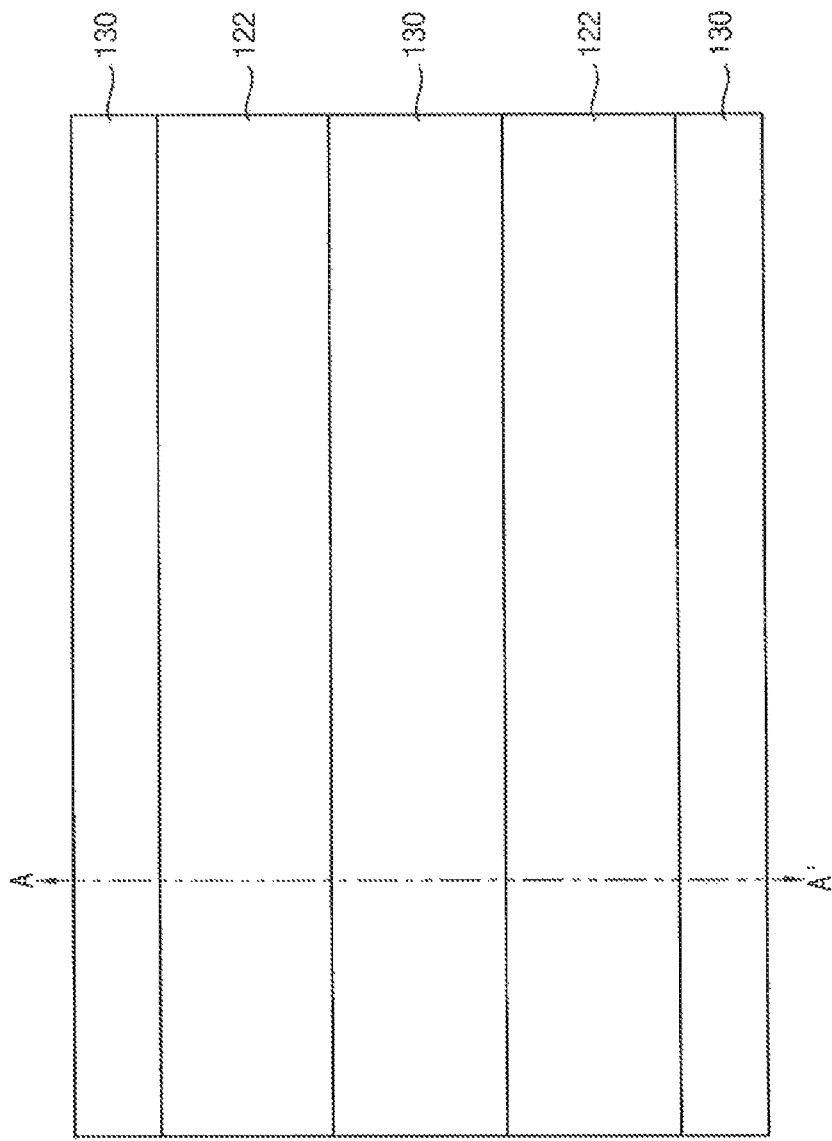

Referring to FIGS. 6 and 7, an etching mask may be formed on an uppermost one of the semiconductor layers 120 to extend in the first direction, and the semiconductor layers 120, the sacrificial layers 110, and an upper portion of the substrate 100 may be etched using the etching mask.

Thus, an active pattern 105 may be formed on the substrate 100 to extend in the first direction, and a fin structure including sacrificial lines 112 and semiconductor lines 122 alternately and repeatedly stacked may be formed on the active pattern 105. In exemplary embodiments of the inventive concept, a plurality of fin structures may be formed to be spaced apart from each other in the second direction on the substrate 100.

An isolation pattern 130 may be formed on the substrate 100 to cover a sidewall of the active pattern 105.

Figure 8:
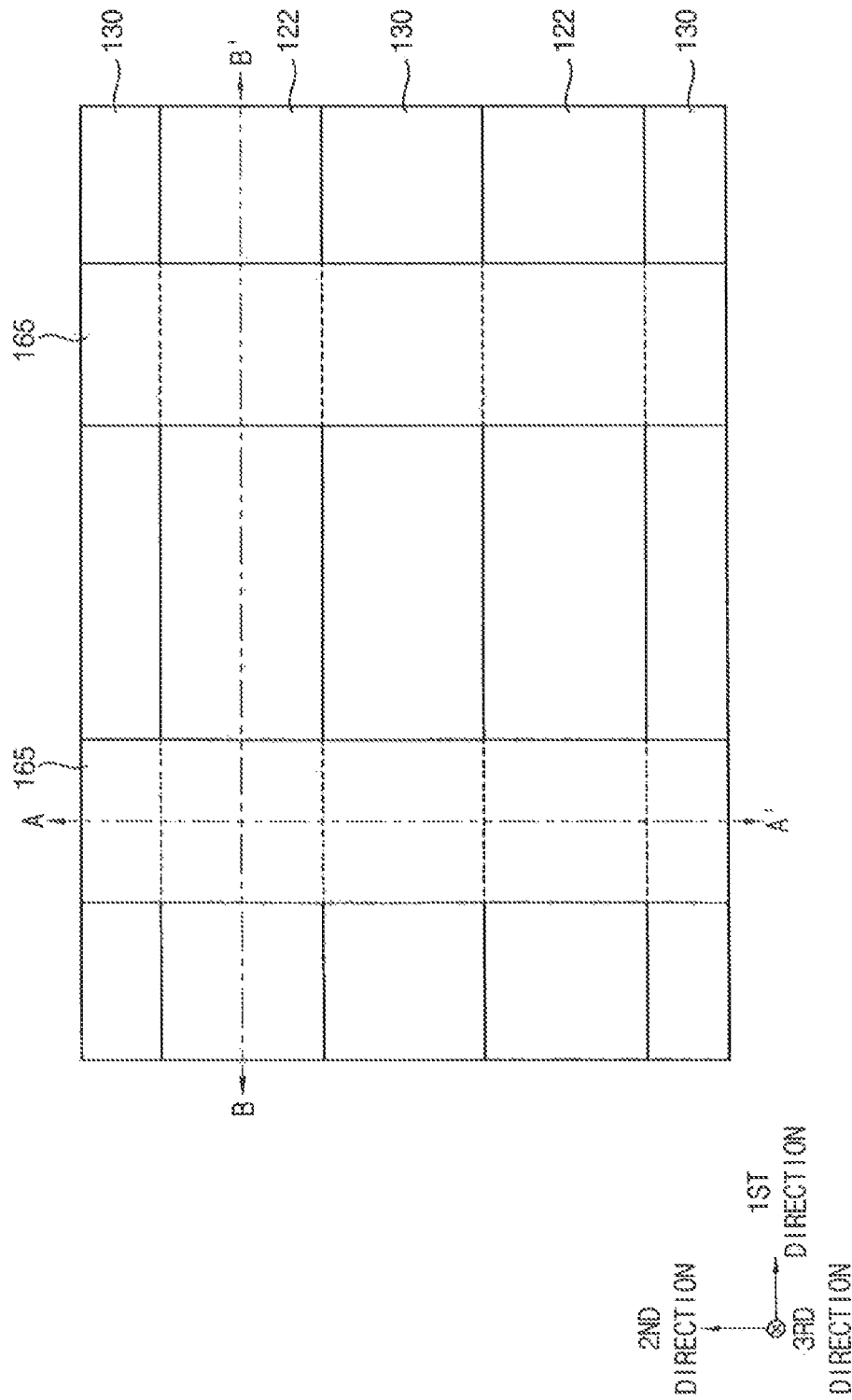
Figure 10:
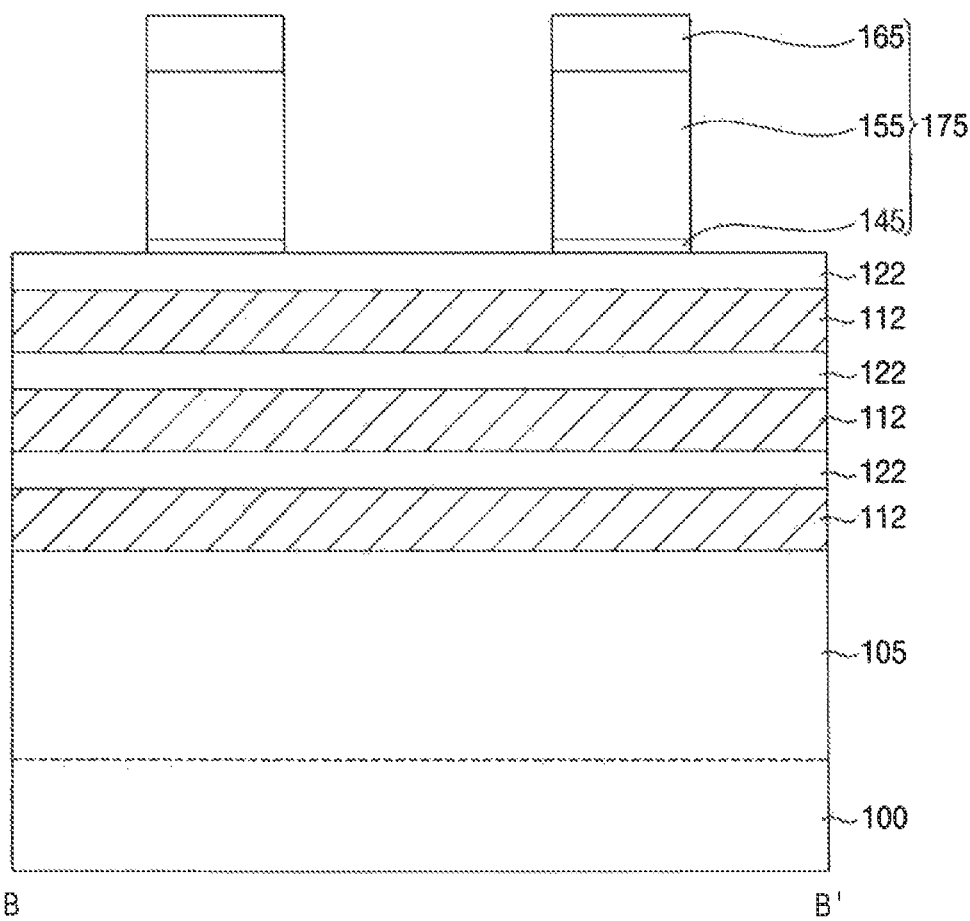

Referring to FIGS. 8 to 10, a dummy gate structure 175 may be formed on the substrate 100 to partially cover the fin structure and the isolation pattern 130.

For example, a dummy gate insulation layer, a dummy gate electrode layer, and a dummy gate mask layer may be sequentially formed on the substrate 100 having the fin structure and the isolation pattern 130 thereon, an etching mask may be formed on the dummy gate mask layer, and the dummy gate mask layer may be etched using the etching mask to form a dummy gate mask 165.

The dummy gate insulation layer may include an oxide, e.g., silicon oxide, the dummy gate electrode layer may include, e.g., polysilicon, and the dummy gate mask layer may include a nitride, e.g., silicon nitride.

The dummy gate electrode layer and the dummy gate insulation layer may be etched using the dummy gate mask 165 as an etching mask to form a dummy gate electrode 155 and a dummy gate insulation pattern 145, respectively on the substrate 100.

The dummy gate insulation pattern 145, the dummy gate electrode 155, and the dummy gate mask 165 sequentially stacked on the active pattern 105 and a portion of the isolation pattern 130 adjacent to the active pattern 105 may form the dummy gate structure 175. In exemplary embodiments of the inventive concept, the dummy gate structure 175 may extend in the second direction on the fin structure and the isolation pattern 130 to cover an upper surface and opposite sidewalls in the second direction of the fin structure.

Figure 11:
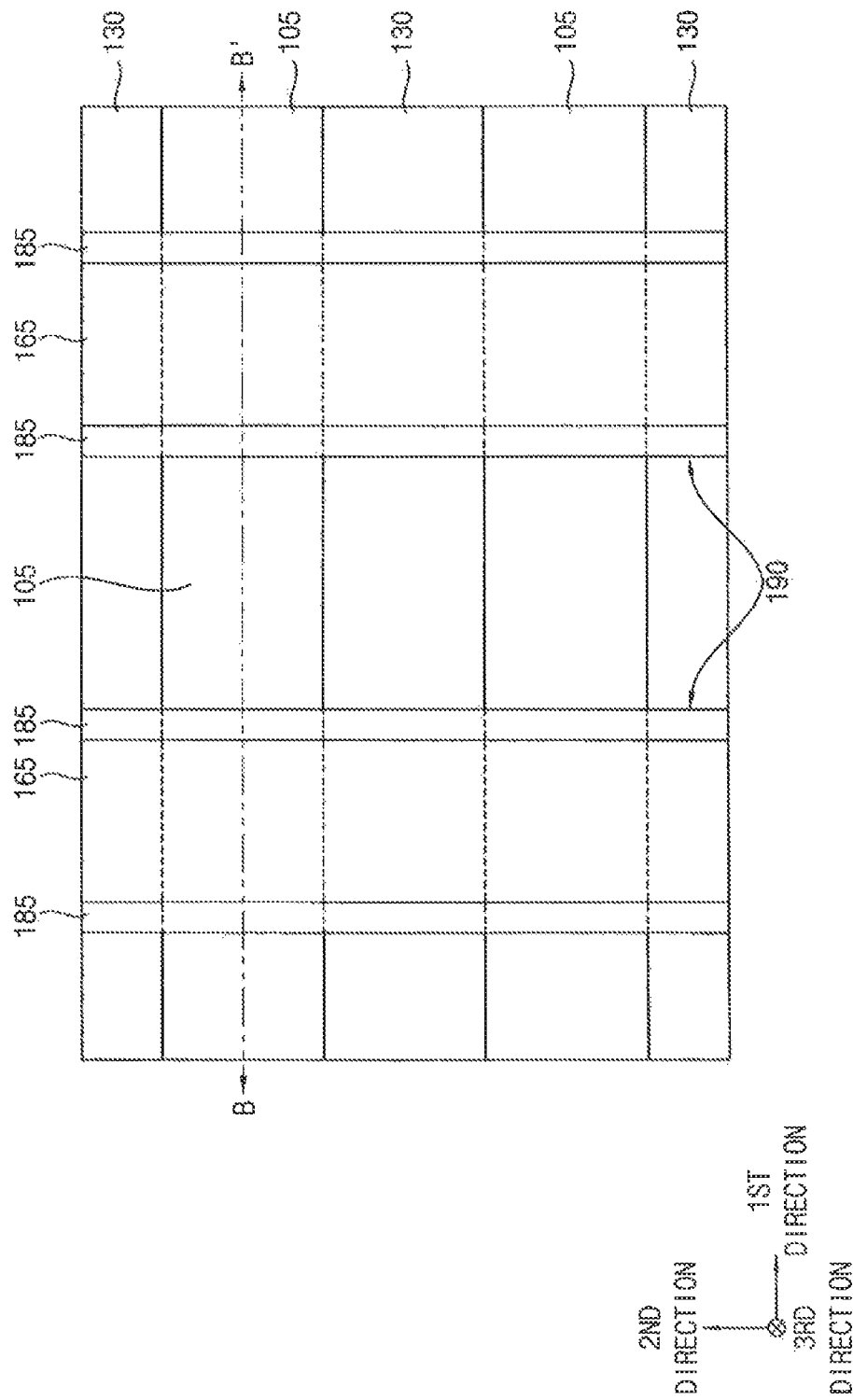
Figure 12:
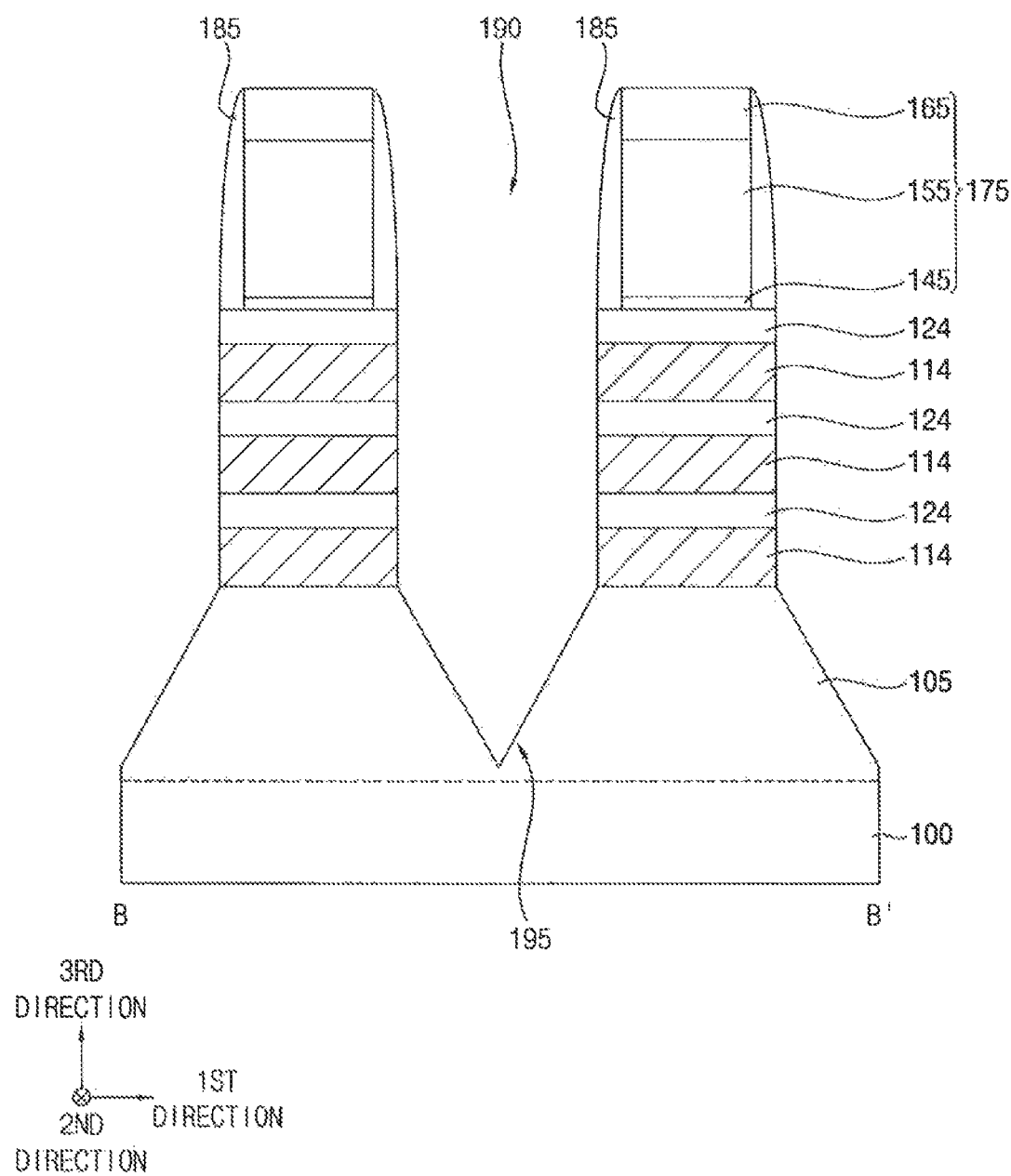

Referring to FIGS. 11 and 12, a gate spacer 185 may be formed on a sidewall of the dummy gate structure 175.

For example, a first spacer layer may be formed on the substrate 100 having the fin structure, the isolation pattern 130, and the dummy gate structure 175 thereon, and may be anisotropically etched to form the gate spacer 185 covering each of opposite sidewalls of the dummy gate structure 175 in the first direction.

The fin structure may be etched using the dummy gate structure 175 and the gate spacer 185 as an etching mask to form a first opening 190 exposing an upper portion of the active pattern 105 and a portion of the isolation pattern 130 adjacent to the active pattern 105 in the second direction, and the exposed upper portion of the active pattern 105 may be further etched to form a first recess 195 connected to the first opening 190.

Thus, the sacrificial lines 112 and the semiconductor lines 122 under the dummy gate structure 175 and the gate spacer 185 may be transformed into sacrificial patterns 114 and semiconductor patterns 124, respectively, and the fin structure extending in the first direction may be divided into a plurality of parts spaced apart from each other in the first direction.

Hereinafter, the dummy gate structure 175, the gate spacer 185 on each of opposite sidewalls of the dummy gate structure 175, and the fin structure under the dummy gate structure 175 and the gate spacer 185 may be referred to as a first structure. In exemplary embodiments of the inventive concept, the first structure may extend in the second direction, and a plurality of first structures may be formed to be spaced apart from each other in the first direction.

In exemplary embodiments of the inventive concept, the first recess 195 may have a cross-section in the first direction with a "V" shape.

Figure 13:
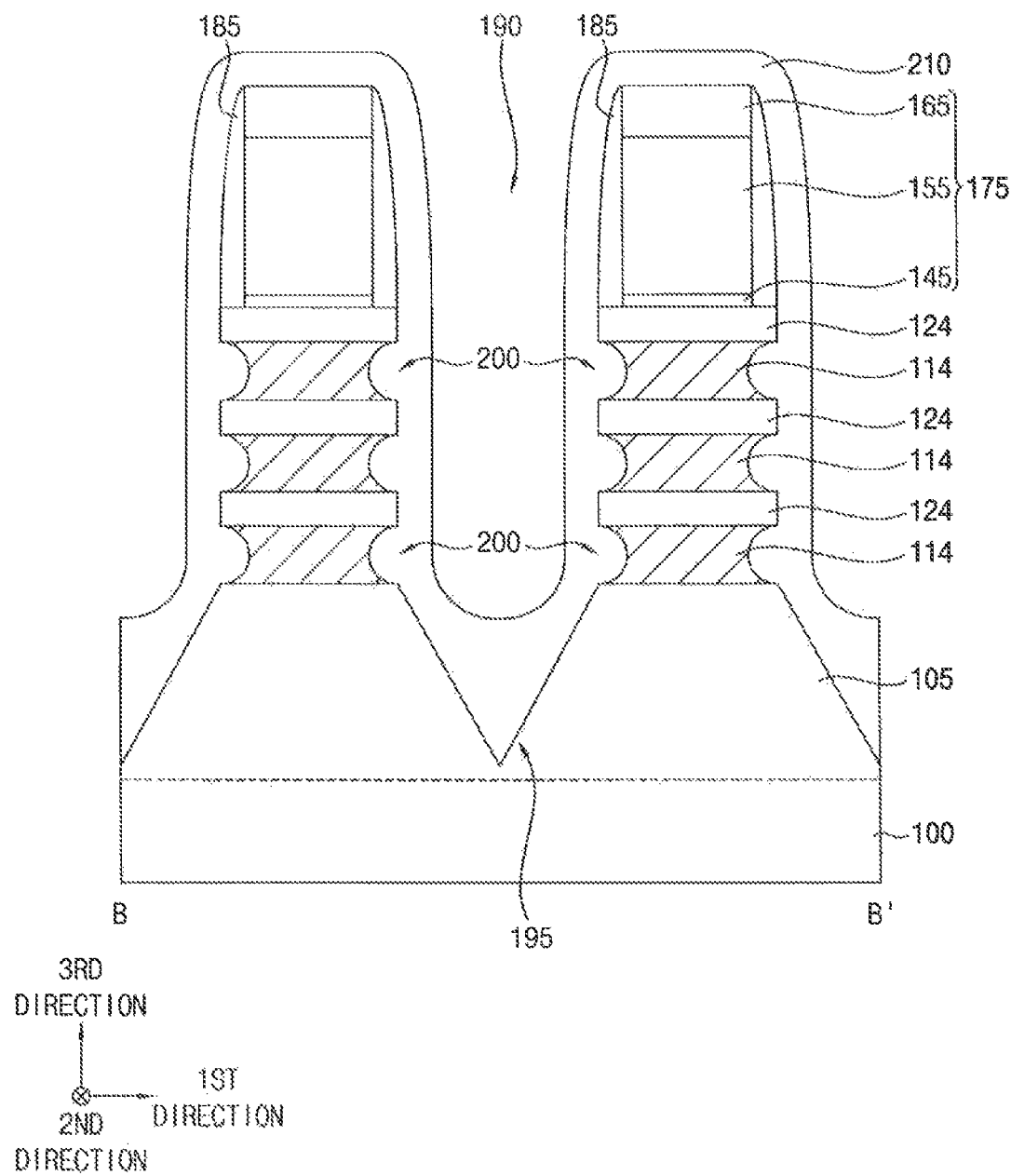

Referring to FIG. 13, opposite sidewalls in the first direction of the sacrificial patterns 114 exposed by the first opening 190 may be etched to form second recesses 200, respectively.

In exemplary embodiments of the inventive concept, the second recesses 200 may be formed by a wet etching process on the sacrificial patterns 114. Thus, each of the second recesses 200 may have a convex shape toward a central portion of each of the sacrificial patterns 114 in the first direction. In exemplary embodiments of the inventive concept, each of the second recesses 200 may have a cross-section in the first direction with a shape of a semicircle. Alternatively, each of the second recesses 200 may have a cross-section in the first direction with a rounded rectangle shape.

A second spacer layer 210 may be formed on the dummy gate structure 175, the gate spacer 185, the fin structure, the active pattern 105, and the isolation pattern 130 to fill the first recess 195 and the second recesses 200.

In exemplary embodiments of the inventive concept, the first recess 195 may have a cross-section with the "V" shape, and thus, a portion of the second spacer layer 210 on a central portion of the first recess 195 in the first direction may have a relatively large thickness. For example, the portion of the second spacer layer 210 on the central portion of the first recess 195 in the first direction may be thicker than a portion of the second spacer layer 210 on side portions of the first recess 195 in the first direction.

Figure 14:
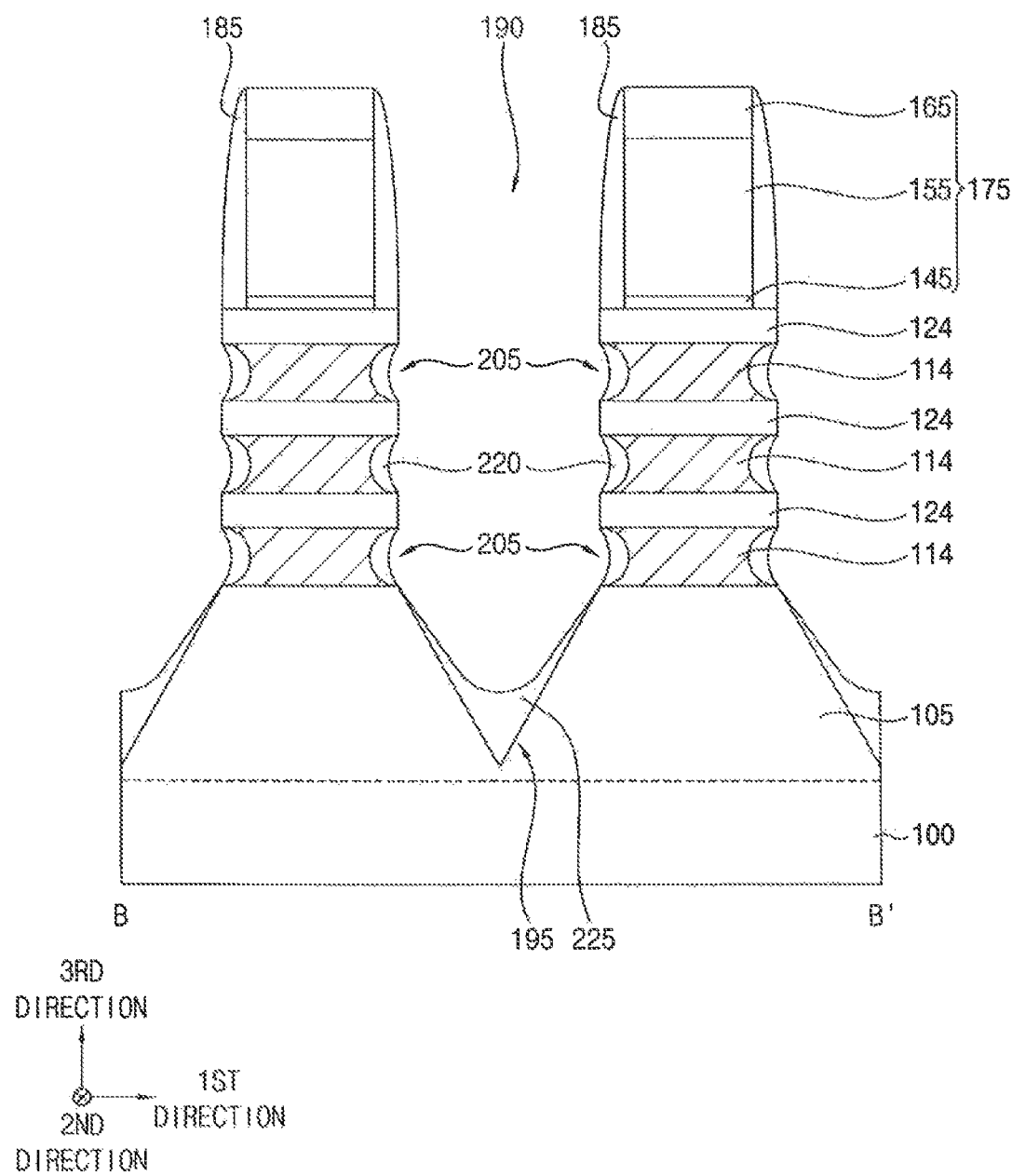

Referring to FIG. 14, the second spacer layer 210 may be anisotropically etched to form an inner spacer 220 at least partially filling each of the second recesses 200, and a third recess 205 may be formed on an outer sidewall of the inner spacer 220. The third recess 205 may be concave in the first direction.

During the anisotropic etching process, a portion of the second spacer layer 210 in the first recess 195 having the cross-section of the "V" shape may not be completely removed. In this case, the remaining portion of the second spacer layer 210 may be referred to as a growth prevention pattern 225 hereinafter.

A portion of the growth prevention pattern 225 on the central portion of the first recess 195 in the first direction may have a greatest thickness, and a portion of the growth prevention pattern 225 on each of opposite edges of the first recess 195 in the first direction may have a smallest thickness.

In exemplary embodiments of the inventive concept, the growth prevention pattern 225 may entirely cover an upper surface of the active pattern 105 exposed by the first recess 195, and thus, may be connected to the inner spacer 220.

Figure 15:
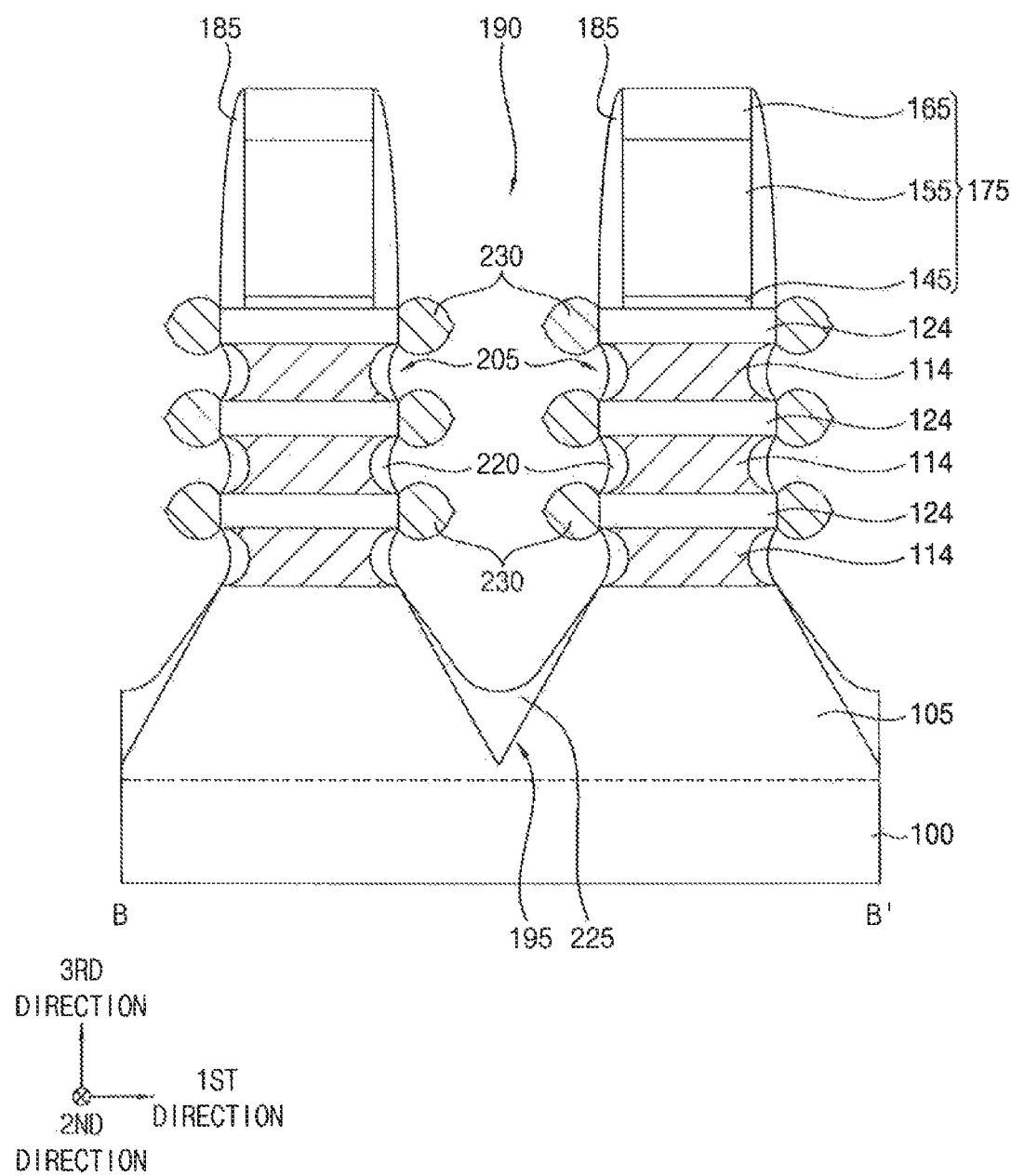

Referring to FIG. 15, a first selective epitaxial growth (SEG) process may be performed using sidewalls of the semiconductor patterns 124 exposed by the first opening 190 as a seed to form a first epitaxial layer 230 on each of the sidewalls of the semiconductor patterns 124.

Before the first SEG process, the growth prevention pattern 225 was formed on the upper surface of the active pattern 105 and the inner spacer 220 was formed on each of the sidewalls of the sacrificial patterns 114. Therefore, the active pattern 105 and the sacrificial patterns 114 may not serve as a seed during the first SEG process.

The first SEG process may be performed using a silicon source gas, e.g., disilane ($Si_2H_6$), a carbon source gas, e.g., $SiH_3CH_3$, and an n-type impurity source gas, e.g., $POCl_3$, $P_2O_5$, etc., to form a single crystalline silicon carbide (SiC) layer doped with n-type impurities. Alternatively, the first SEG process may be performed using the silicon source gas and the n-type impurity source gas to form a single crystalline silicon layer doped with n-type impurities. The first epitaxial layer 230 may have a first impurity concentration.

In exemplary embodiments of the inventive concept, the first epitaxial layer 230 may protrude from each of the opposite sidewalls of the sacrificial patterns 114 in the first direction, and may have a cross-section in the first direction with a shape of, e.g., a candle or an ellipse.

Figure 16:
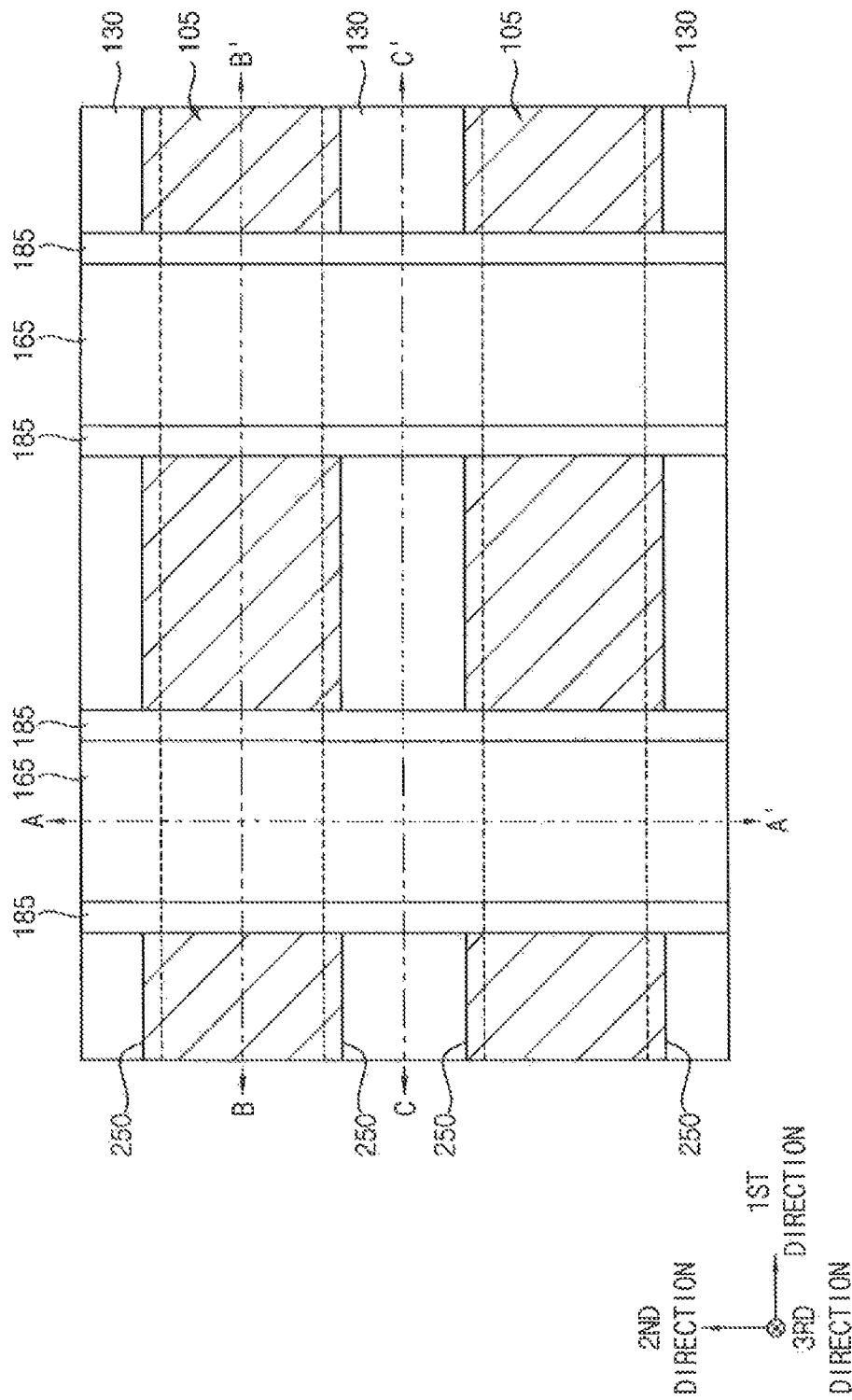
Figure 17:
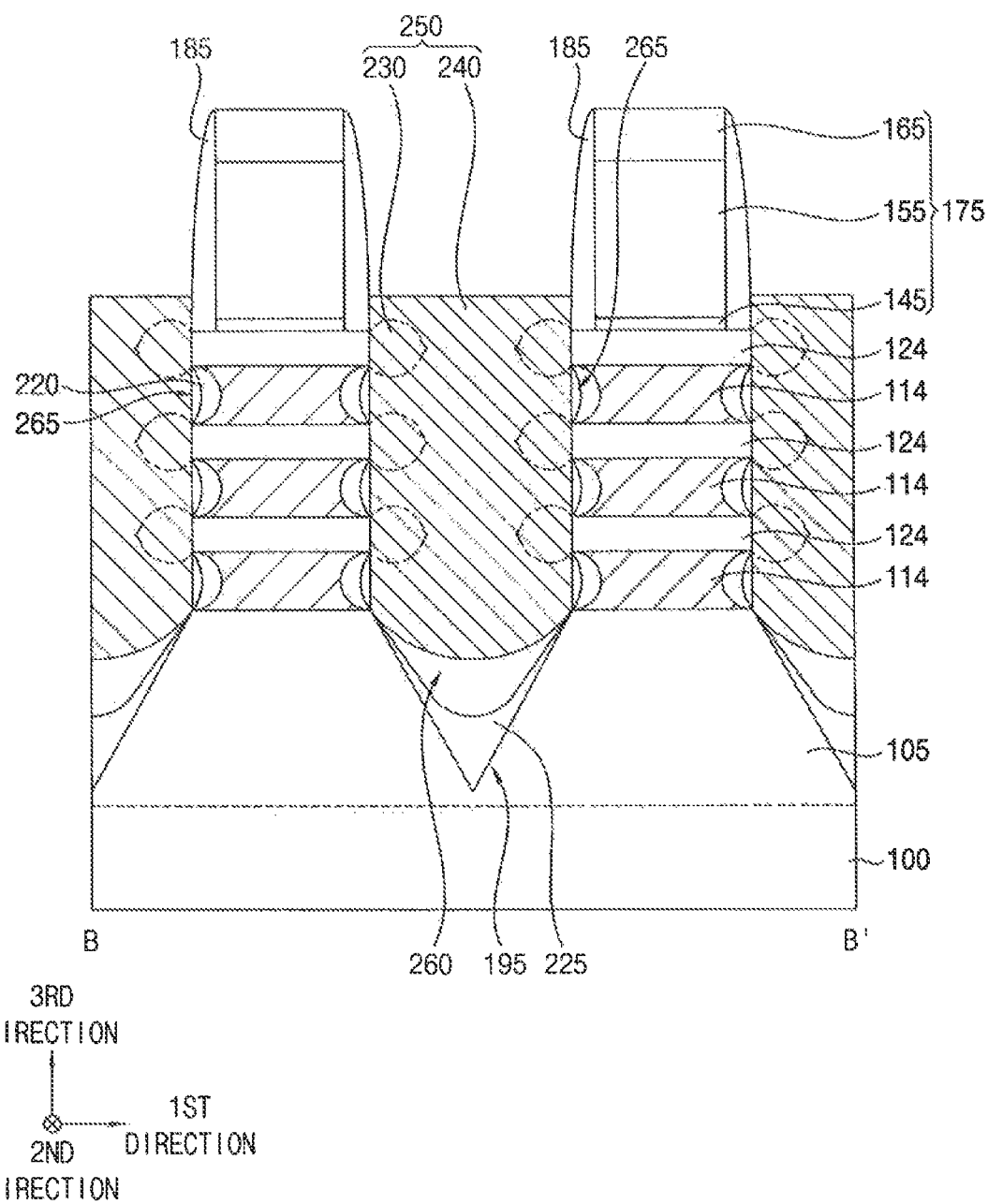

Referring to FIGS. 16 and 17, a second SEG process may be performed to form a second epitaxial layer 240.

The second SEG process may be performed using the silicon source gas, the carbon source gas, and the n-type impurity source gas, or using the silicon source/drain gas and the n-type impurity source gas to form a single crystalline silicon carbide layer doped with n-type impurities or a single crystalline silicon layer doped with n-type impurities. The second epitaxial layer 240 may have a second impurity concentration greater than the first impurity concentration.

In exemplary embodiments of the inventive concept, the second epitaxial layer 240 may fill the first opening 190 on the growth prevention pattern 225, and may be further grown in the third direction to contact a lower sidewall of the gate spacer 185.

In exemplary embodiments of the inventive concept, the second epitaxial layer 240 may not entirely fill the first recess 195 on the growth prevention pattern 225 due to the crystallinity of the second epitaxial layer 240, and thus, a first air gap 260 may be formed on the growth prevention pattern 225. In exemplary embodiments of the inventive concept, the second epitaxial layer 240 may not entirely fill the third recess 205 on the outer sidewall of the inner spacer 220 due to the crystallinity of the second epitaxial layer 240, and thus, a second air gap 265 may be formed on the outer sidewall of the inner spacer 220.

The first and second epitaxial layers 230 and 240 formed by the above processes may form a source/drain layer 250.

Figure 18:
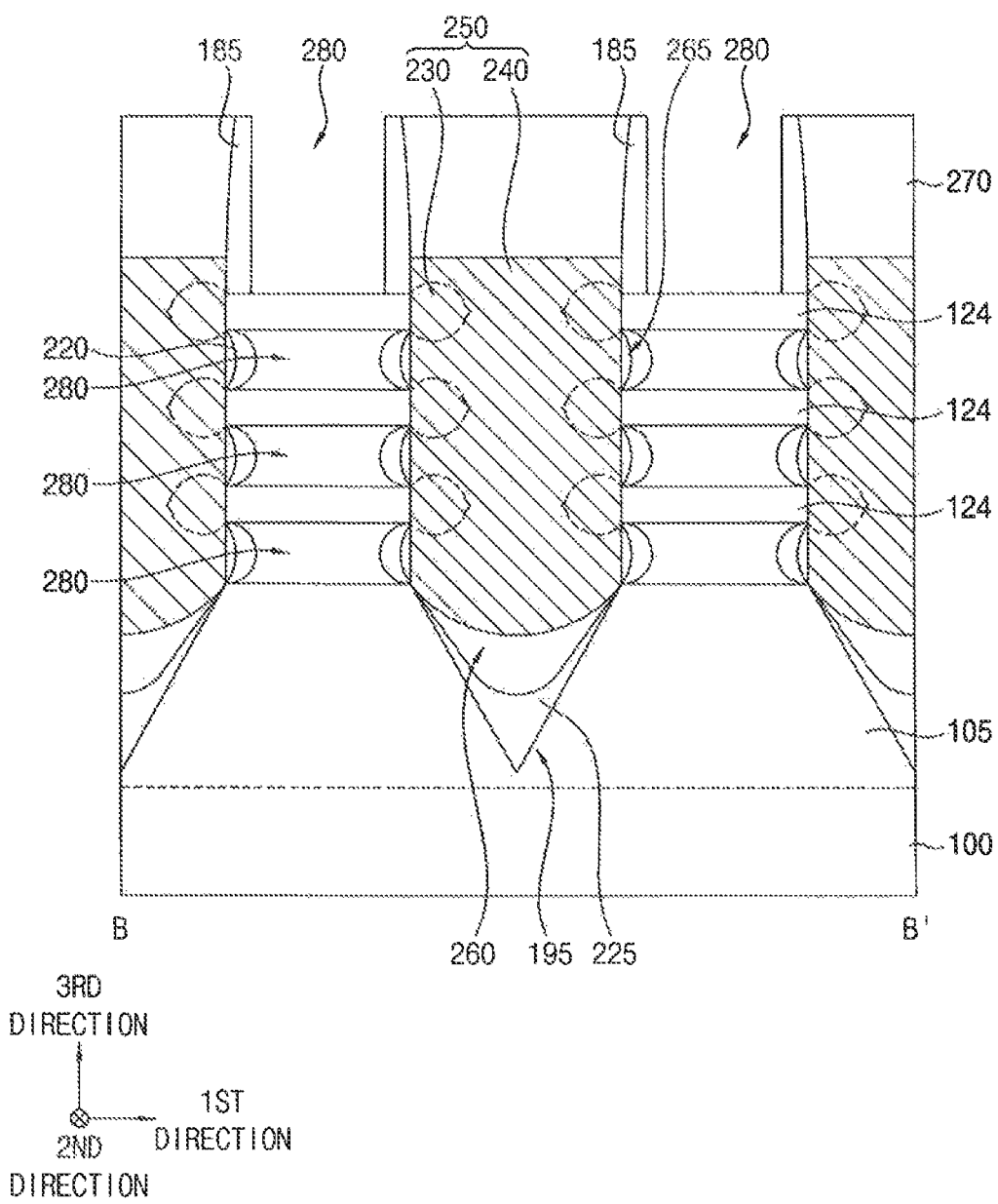

Referring to FIG. 18, an insulation layer 270 may be formed on the substrate 100 to cover the first structure and the source/drain layer 250, and may be planarized until an upper surface of the dummy gate electrode 155 of the first structure is exposed. During the planarization process, the dummy gate mask 165 may be also removed, and an upper portion of the gate spacer 185 may be removed.

The planarization process may be performed by a chemical mechanical polishing (CMP) process and/or an etch back process.

The exposed dummy gate electrode 155 and the dummy gate insulation pattern 145 thereunder may be removed by, e.g., a wet etching process and/or a dry etching process, to form a second opening 280 exposing an inner sidewall of the gate spacer 185, an inner sidewall of the inner spacer 220, surfaces of the semiconductor patterns 124, and the upper surface of the active pattern 105.

Referring to FIGS. 1 to 3 again, a gate structure 330 may be formed on the substrate 100 to fill the second opening 280.

For example, after a thermal oxidation process is performed on the upper surface of the active pattern 105 and the surface of the semiconductor pattern 124 exposed by the second opening 280 to form an interface pattern 290, a gate insulation layer and a workfunction control layer may be sequentially formed on a surface of the interface pattern 290, the inner sidewalls of the gate spacer 185 and the inner spacer 220, and an upper surface of the insulation layer 270. In addition, a gate electrode layer may be formed to fill a remaining portion of the second opening 280.

The gate insulation layer, the workfunction control layer, and the gate electrode layer may be formed by, e.g., a chemical vapor deposition (CVD) process, an atomic layer deposition (ALD) process, a physical vapor deposition (PVD) process, etc. The interface pattern 290 may be also formed by a CVD process, an ALD process, a PVD process, etc., instead of the thermal oxidation process, and in this case, the interface pattern 290 may be also formed on the inner sidewalls of the gate spacer 185 and the inner spacer 220.

The gate electrode layer, the workfunction control layer, and the gate insulation layer may be planarized until the upper surface of the insulation layer 270 is exposed to form a gate electrode 320, a workfunction control pattern 310, and a gate insulation pattern 300, respectively. The interface pattern 290, the gate insulation pattern 300, the workfunction control pattern 310, and the gate electrode 320 may form the gate structure 330.

The semiconductor device according to an exemplary embodiment of the inventive concept may be manufactured by the above processes.

Figure 19:
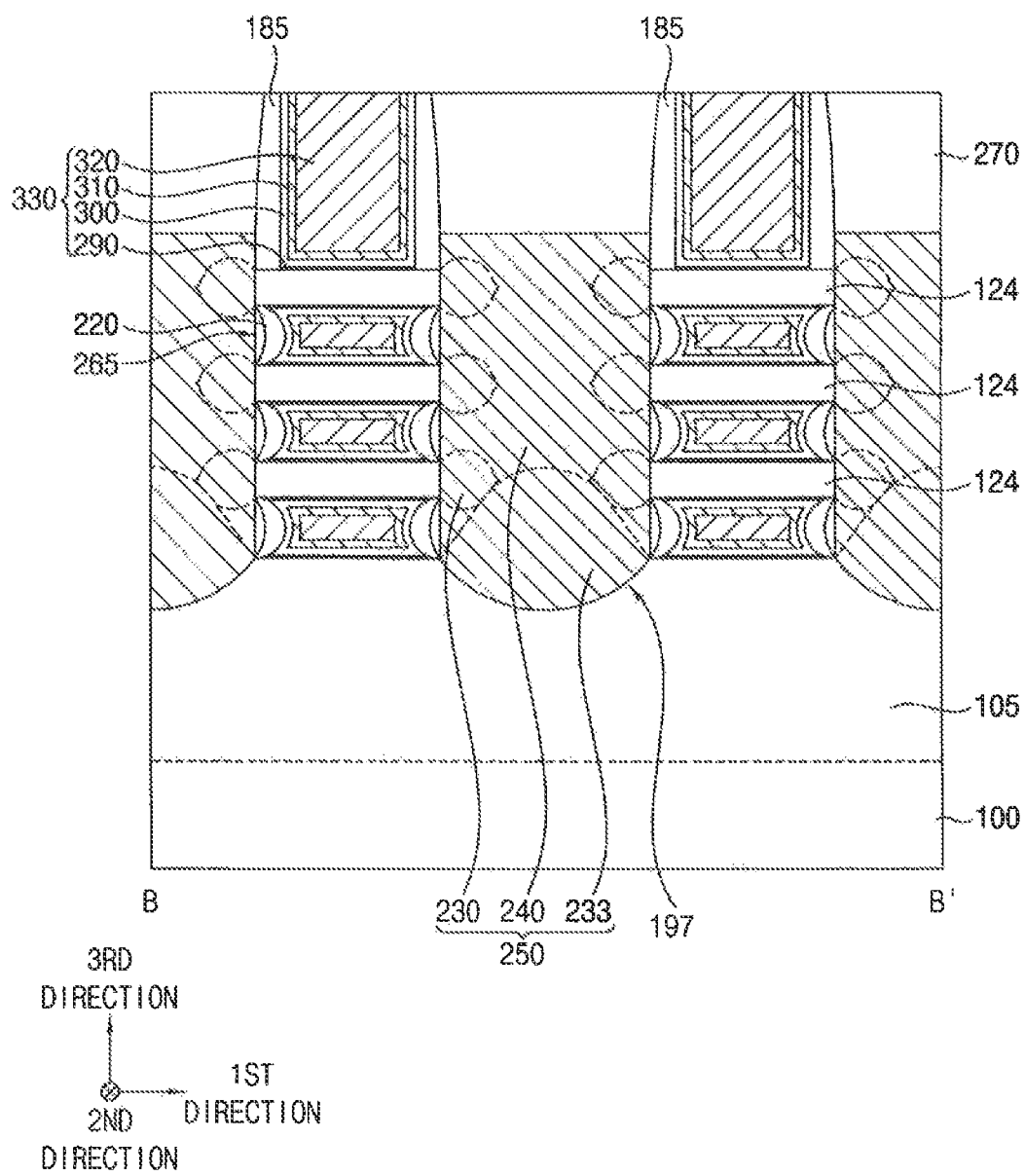
FIG. 19 is a cross-sectional view illustrating a semiconductor device in accordance with a comparative embodiment.

FIG. 19 is a cross-sectional view illustrating a semiconductor device in accordance with a comparative embodiment, for example, a cross-sectional view taken along the line B-B' of FIG. 1. This semiconductor device may be similar to that of FIGS. 1 to 3, except for some elements. Thus, like reference numerals may refer to like elements, and repetitive descriptions may be omitted.

Referring to FIG. 19, a fourth recess 197 having a shallow curved shape may be formed on the active pattern 105 instead of the first recess 195 having a cross-section of the "V" shape. In addition, no growth prevention pattern 225 may be formed on the active pattern 105.

Additionally, the source/drain layer 250 may further include a third epitaxial layer 233 in addition to the first and second epitaxial layers 230 and 240. The third epitaxial layer 233 may be grown in the third direction from the upper surface of the active pattern 105 exposed by the fourth recess 197, and may have an uppermost surface higher than a bottom surface of a lowermost one of the semiconductor patterns 124. In some cases, the third epitaxial layer 233 is merged with the lowermost one of the semiconductor patterns 124.

The third epitaxial layer 233 may have the first impurity concentration, which may be relatively low, like the first epitaxial layer 230. Thus, a lower portion of the source/drain layer 250 may have only the first impurity concentration between the lowermost ones of the semiconductor patterns 124 neighboring each other in the first direction, and thus, a transistor including one of the lowermost semiconductor patterns 124 may have deteriorated performance. However, in the semiconductor device in accordance with exemplary embodiments of the inventive concept illustrated with reference to FIGS. 1 to 3, the source/drain layer 250 may include a portion having the second impurity concentration between the semiconductor patterns 124 at each level, which may be relatively high, and thus, the deterioration of performance of the transistor may be prevented.

Figure 20:
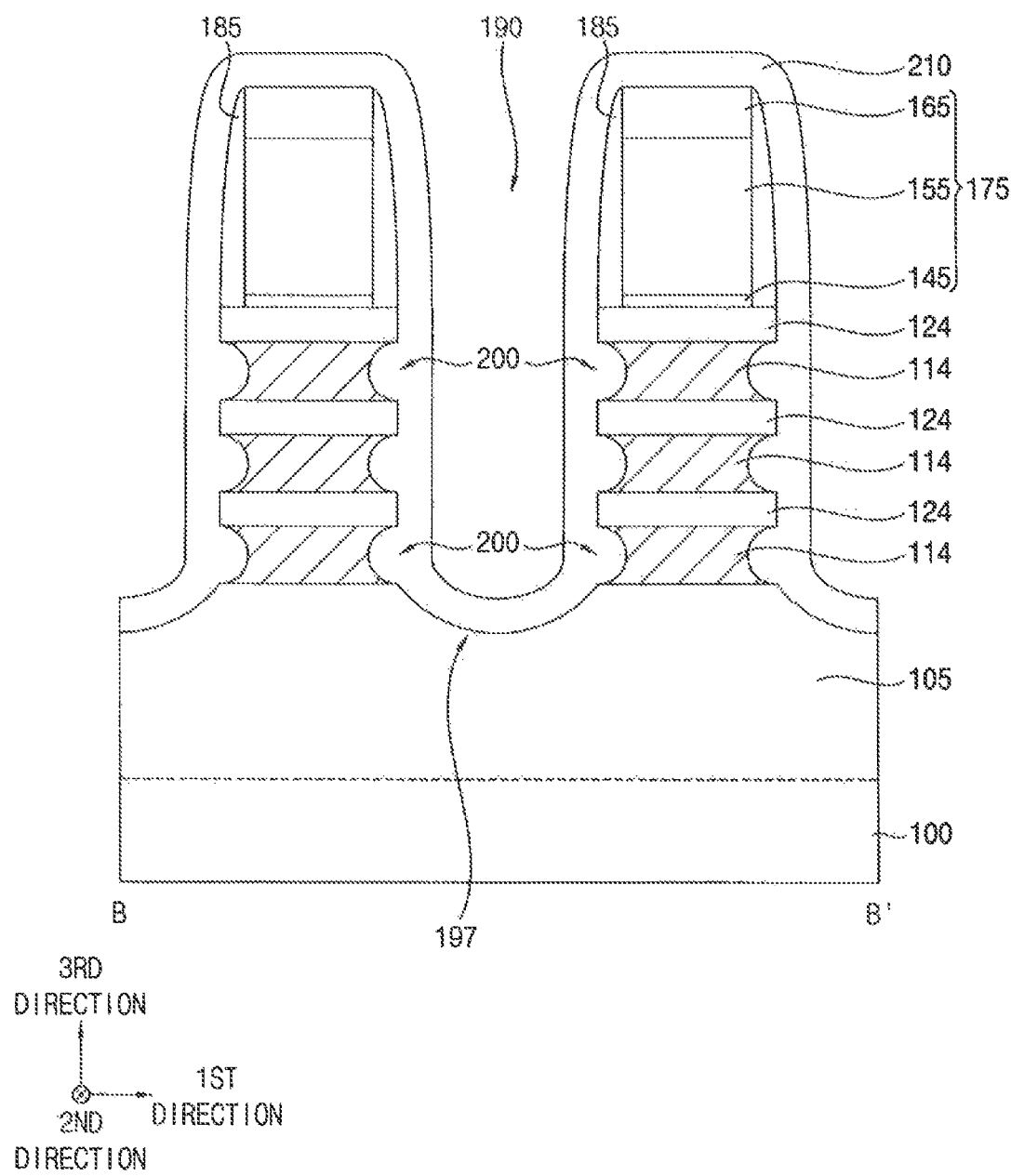
FIGS. 20, 21 and 22 are cross-sectional views illustrating a method of manufacturing a semiconductor device in accordance with a comparative embodiment.
Figure 21:
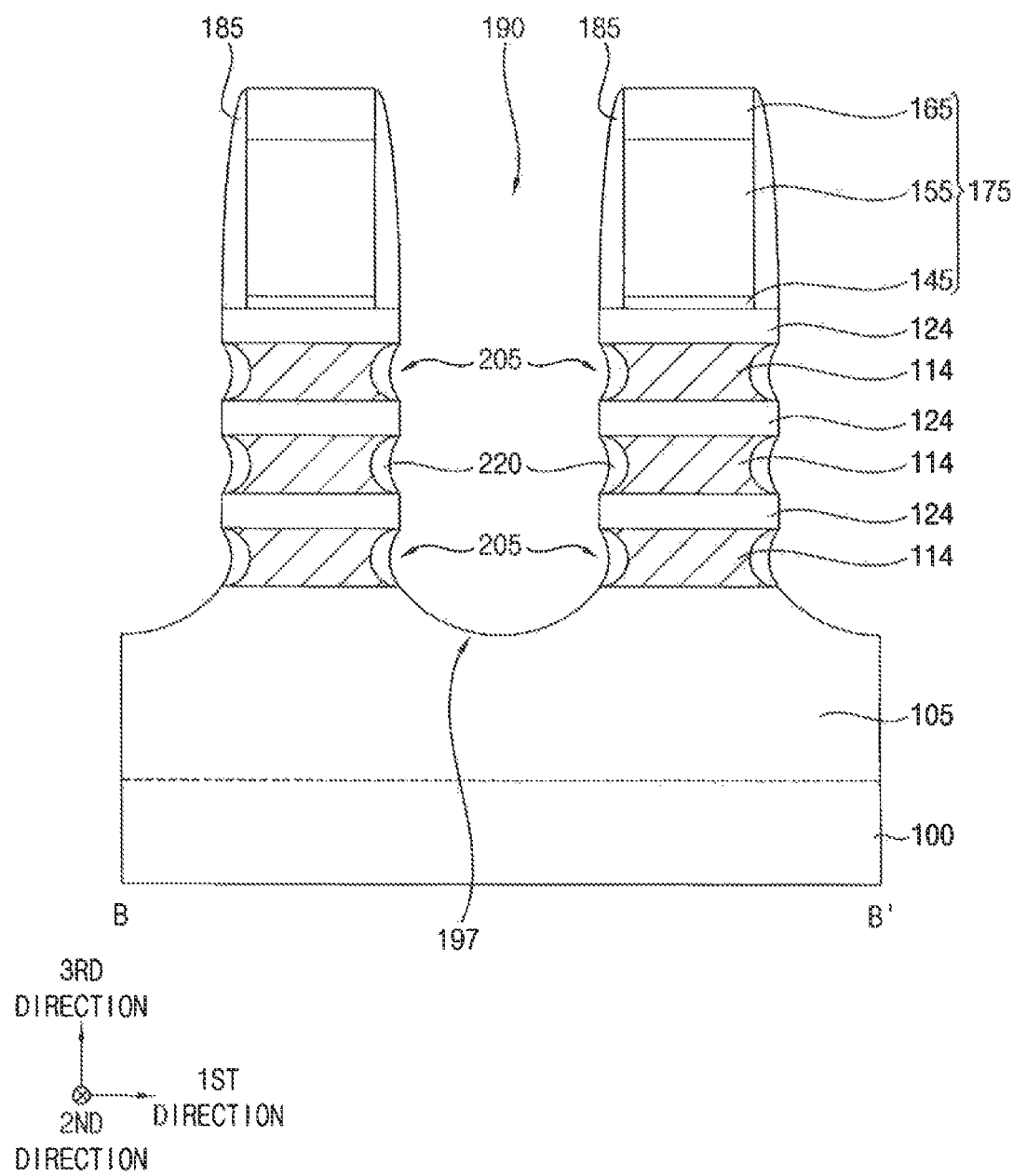
Figure 22:
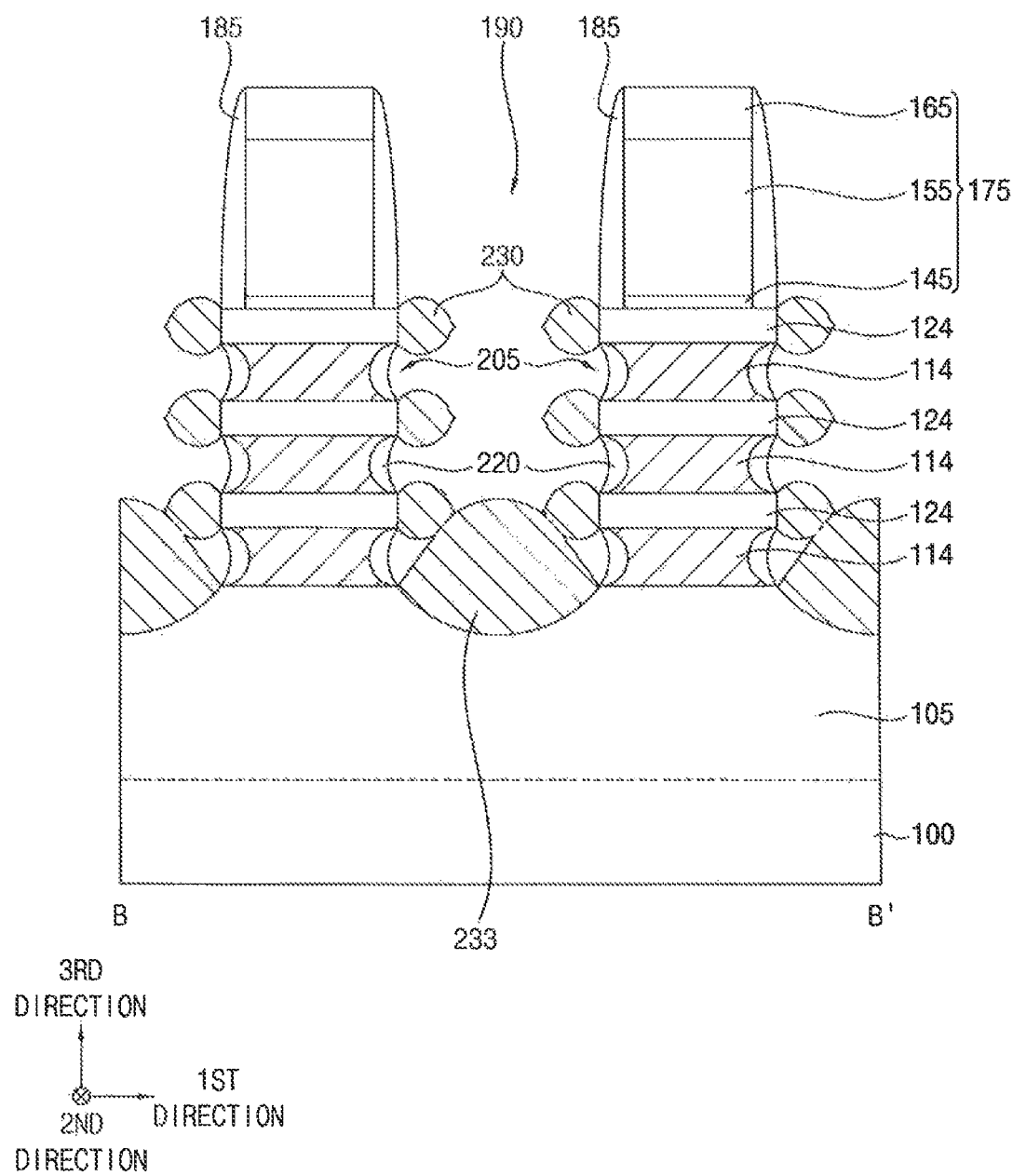

FIGS. 20 to 22 are cross-sectional views illustrating a method of manufacturing a semiconductor device in accordance with a comparative embodiment, for example, a cross-sectional view taken along lines B-B' of corresponding plan views, respectively. This method may include processes similar to those illustrated with reference to FIGS. 4 to 18 and FIGS. 1 to 3, and thus, repetitive descriptions may be omitted.

Referring to FIG. 20, processes similar to those illustrated with reference to FIGS. 4 to 13 may be performed.

However, a fourth recess 197 having a shallow curved shape may be formed on the active pattern 105 instead of the first recess 195 having a cross-section in the first direction with the "V" shape. Thus, the second spacer layer 210 may be conformally formed on the fourth recess 197.

Referring to FIG. 21, processes similar to those illustrated with reference to FIG. 14 may be performed. However, the second spacer layer 210 may not remain on the fourth recess 197, and thus, no growth prevention pattern may be formed.

Referring to FIG. 22, processes similar to those illustrated with reference to FIG. 15 may be performed.

However, since the growth prevention pattern 225 has not been formed on the fourth recess 197, during the first SEG process, the upper surface of the active pattern 105 exposed by the fourth recess 197 may also serve as a seed, and thus, a third epitaxial layer 233 having a first impurity concentration may be formed.

The third epitaxial layer 233 may be grown at a rate greater than that of the first epitaxial layer 230, and thus, an uppermost surface of the third epitaxial layer 233 may be higher than at least a bottom surface of a lowermost one of the semiconductor patterns 124. In addition, the first epitaxial layer 230 may be merged with the lowermost one of the semiconductor patterns 124.

Processes similar to those illustrated with reference to FIGS. 16 to 18 and FIGS. 1 to 3 may be performed to complete the fabrication of the semiconductor device.

Figure 23:
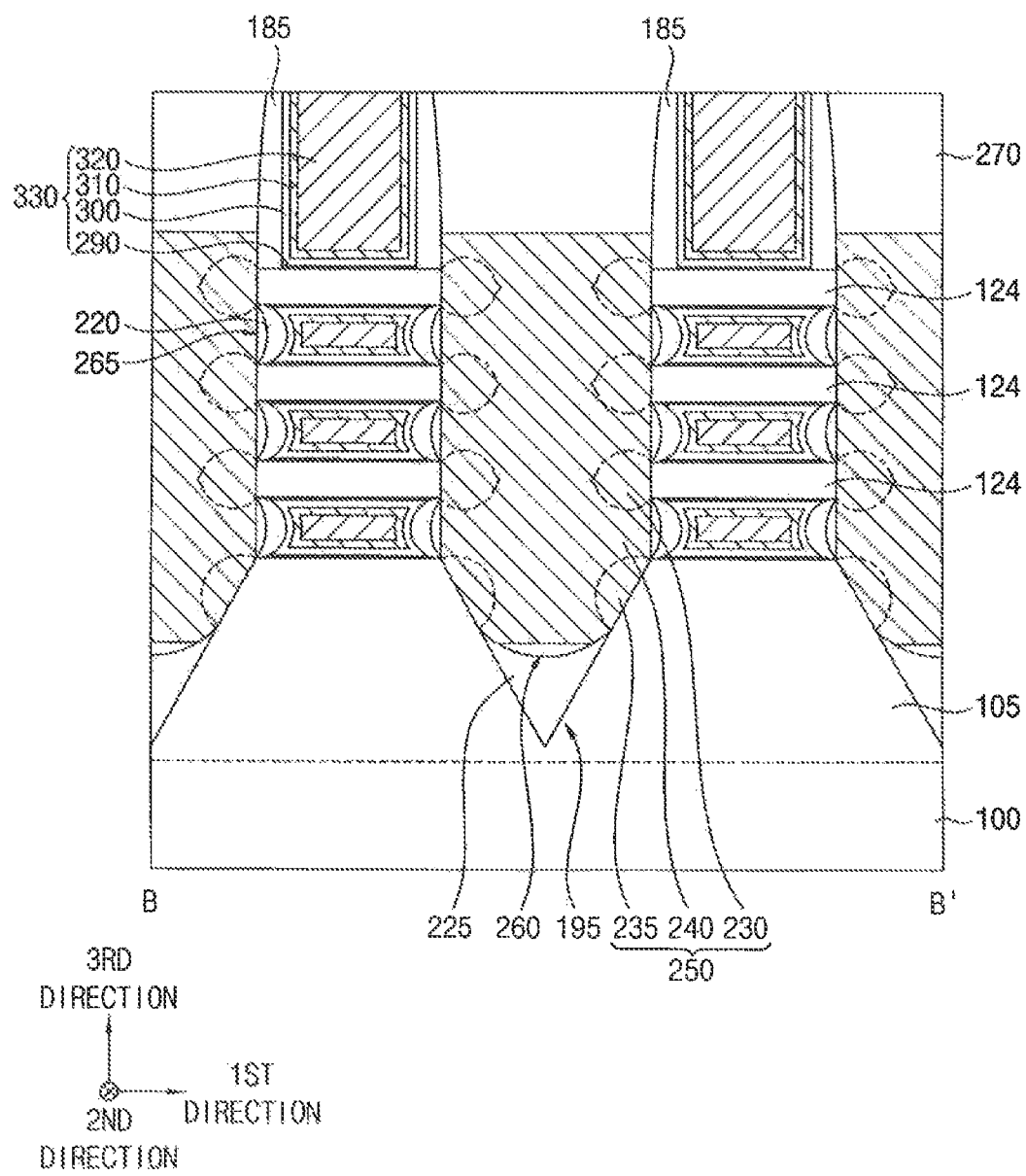
FIG. 23 is a cross-sectional view illustrating a semiconductor device in accordance with exemplary embodiments of the inventive concept.

FIG. 23 is a cross-sectional view illustrating a semiconductor device in accordance with exemplary embodiments of the inventive concept, for example, a cross-sectional view taken along the line B-B' of FIG. 1. This semiconductor device may be similar to that of FIGS. 1 to 3, except for some elements. Thus, like reference numerals refer to like elements, and repetitive descriptions may be omitted.

Referring to FIG. 23, the source/drain layer 250 may include a fourth epitaxial layer 235 in addition to the first and second epitaxial layers 230 and 240.

In exemplary embodiments of the inventive concept, the growth prevention pattern 225 on the first recess 195 may not entirely cover the upper surface of the active pattern 105 exposed by the first recess 195. In this case, opposite edges of the upper surface of the active pattern 105 in the first direction may exposed in the first recess 195, and thus, may not be connected to the inner spacer 220.

The fourth epitaxial layer 235 may be grown from a surface of the active pattern 105 not covered by the growth prevention pattern 225, and may have the first impurity concentration like the first epitaxial layer 230. The surface of the active pattern 105 from which the fourth epitaxial layer 235 is grown may be slanted with respect to the upper surface of the substrate 100. An uppermost surface of the fourth epitaxial layer 235 may be lower than a bottom surface of the lowermost one of the semiconductor patterns 124, and thus, each of the semiconductor patterns 124 may not be influenced by the low impurity concentration of the fourth epitaxial layer 235. Accordingly, the deterioration of performance of the transistor including the semiconductor patterns 124 may be prevented.

Figure 24:
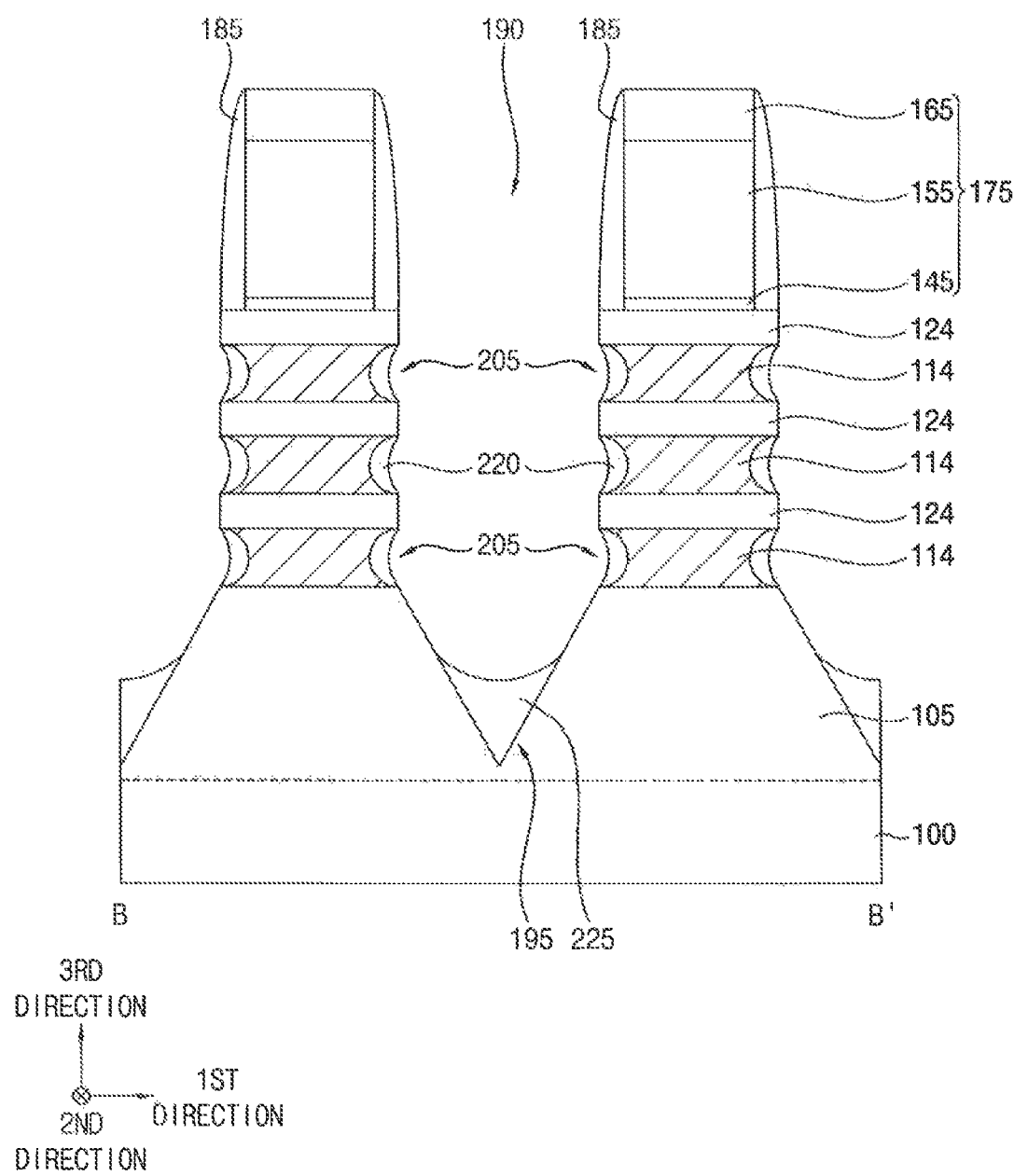
FIGS. 24 and 25 are cross-sectional views illustrating a method of manufacturing a semiconductor device in accordance with exemplary embodiments of the inventive concept.
Figure 25:
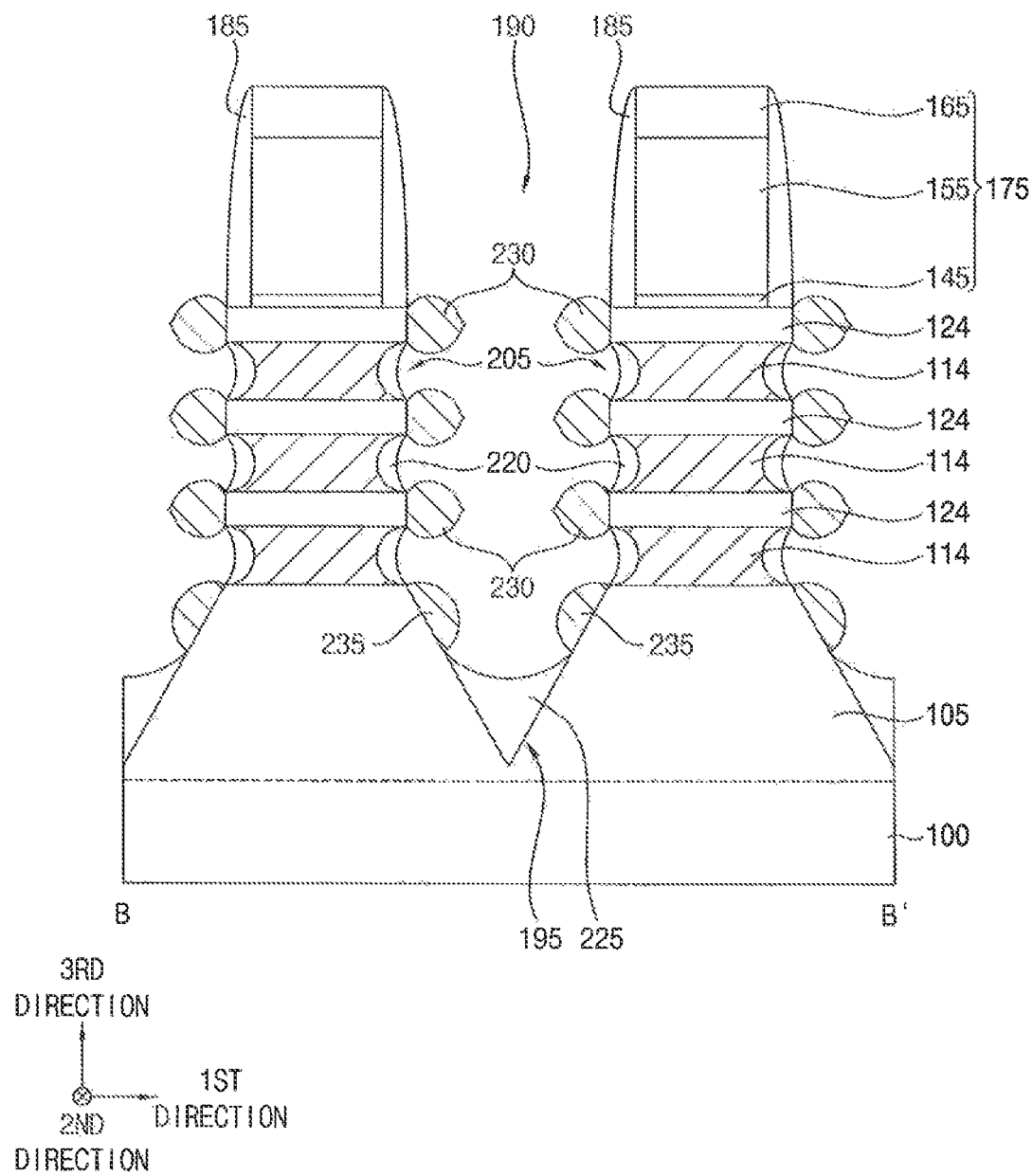

FIGS. 24 and 25 are cross-sectional views illustrating a method of manufacturing a semiconductor device in accordance with exemplary embodiments of the inventive concept, for example, cross-sectional views taken along lines B-B' of corresponding plan views, respectively. This method may include processes similar to those illustrated with reference to FIGS. 4 to 18 and FIGS. 1 to 3, and thus repetitive descriptions may be omitted.

Referring to FIG. 24, processes similar to those illustrated with reference to FIGS. 4 to 14 may be performed.

However, the growth prevention pattern 225 grown on the first recess 195 may not entirely cover the upper surface of the active pattern 105 exposed in the first recess 195. In this case, opposite edges of the upper surface of the active pattern 105 in the first direction are exposed within the first recess 195, and thus, may not be connected to the inner spacer 220.

Referring to FIG. 25, processes similar to those illustrated with reference to FIG. 15 may be performed.

However, the exposed opposite edges of the upper surface of the active pattern 105 may serve as a seed, and thus, a fourth epitaxial layer 235 having the first impurity concentration may be further formed.

The growth prevention pattern 225 has been formed on a central portion of the first recess 195 in the first direction, and thus, only the opposite edges of the upper surface of the active pattern 105 that are slanted with respect to the upper surface of the substrate 100 may serve as a seed. As a consequence, the fourth epitaxial layer 235 may have a low height with respect to the substrate 100. Thus, an uppermost surface of the fourth epitaxial layer 235 may be lower than a bottom surface of the lowermost one of the semiconductor patterns 124. In an exemplary embodiment of the inventive concept, a height of the uppermost surface of the fourth epitaxial layer 235 may be similar to that of a top surface of the active pattern 105.

Processes similar to those illustrated with reference to FIGS. 16 to 18 and FIGS. 1 to 3 may be performed to complete the fabrication of the semiconductor device.

Figure 26:
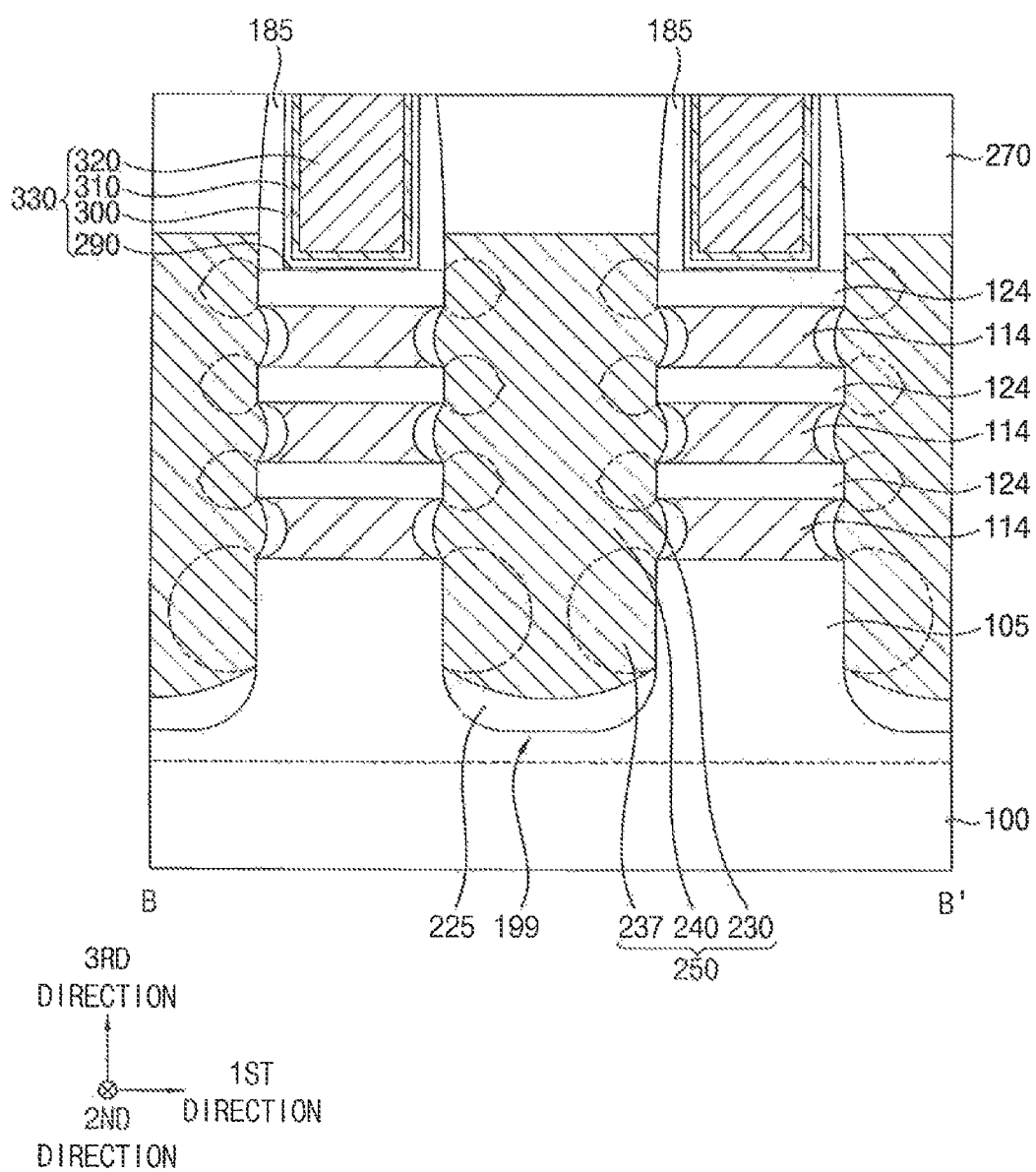
FIG. 26 is a cross-sectional view illustrating a semiconductor device in accordance with exemplary embodiments of the inventive concept.

FIG. 26 is a cross-sectional view illustrating a semiconductor device in accordance with exemplary embodiments of the inventive concept, for example, a cross-sectional view taken along the line B-B' of FIG. 1. This semiconductor device may be similar to that of FIGS. 1 to 3, except for some elements. Thus, like reference numerals may refer to like elements, and repetitive descriptions may be omitted.

Referring to FIG. 26, a fifth recess 199 having a cross-section of a "U" shape and being deep may be formed on the active pattern 105 instead of the first recess 195 having a cross-section of a "V" shape. In addition, the growth prevention pattern 225 may not entirely cover a portion of the active pattern 105 exposed by the fifth recess 199. The growth prevention pattern 225 may allow vertical opposite sidewalls of the active pattern 105 in the first direction to be exposed in the first recess 195, and thus, may not be connected to the inner spacer 220.

A fifth epitaxial layer 237 may be grown from each of the vertical opposite sidewalls of the active pattern 105 not covered by the growth prevention pattern 225, and may have the first impurity concentration like the first epitaxial layer 230. However, an uppermost surface of the fifth epitaxial layer 237 may be lower than the bottom surface of the lowermost one of the semiconductor patterns 124. In this case, each of the semiconductor patterns 124 may not be influenced by the low impurity concentration of the fifth epitaxial layer 237. Accordingly, the deterioration of performance of the transistor including the semiconductor patterns 124 may be prevented.

Figure 27:
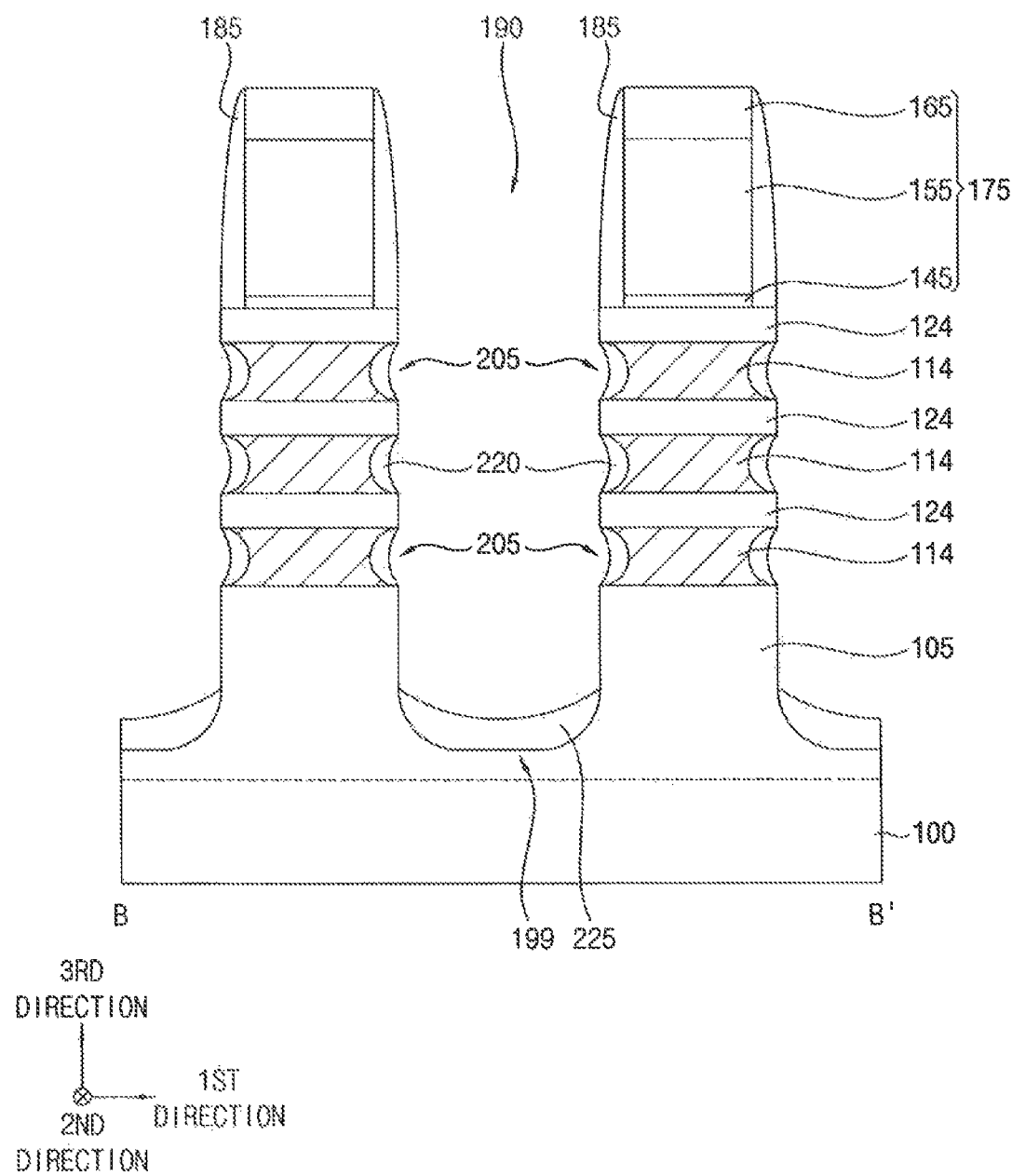
FIGS. 27 and 28 are cross-sectional views illustrating a method of manufacturing a semiconductor device in accordance with exemplary embodiments of the inventive concept.
Figure 28:
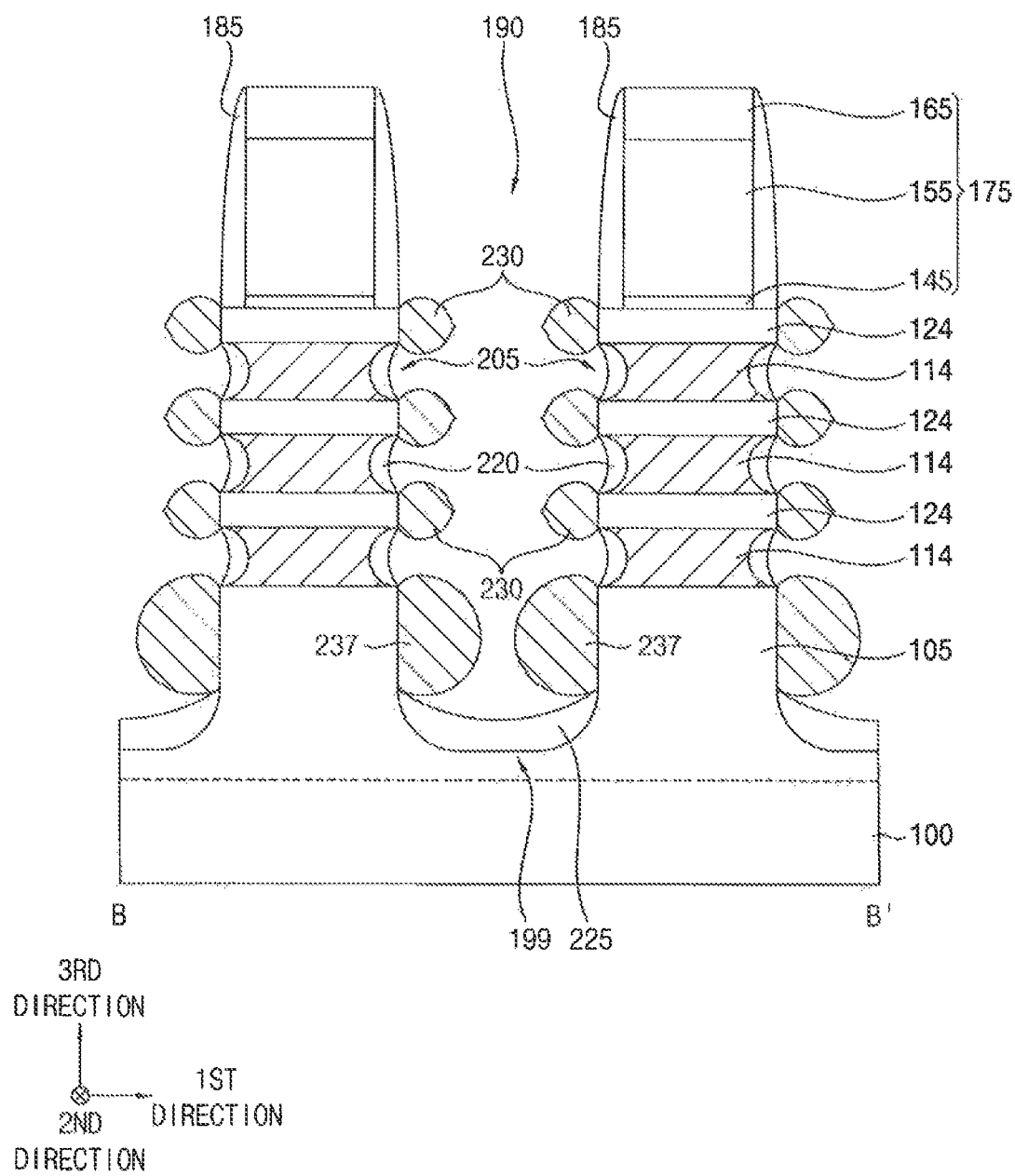

FIGS. 27 and 28 are cross-sectional views illustrating a method of manufacturing a semiconductor device in accordance with exemplary embodiments of the inventive concept, for example, cross-sectional views taken along lines B-B' of corresponding plan views, respectively. This method may include processes similar to those illustrated with reference to FIGS. 4 to 18 and FIGS. 1 to 3, and thus, repetitive descriptions may be omitted.

Referring to FIG. 27, processes similar to those illustrated with reference to FIGS. 4 to 14 may be performed.

However, a fifth recess 199 having a cross-section of a "U" shape may be formed on the active pattern 105 instead of the first recess 195 having a cross-section of the "V" shape, and the fifth recess 199 may be deeper than the fourth recess 197 of FIGS. 19-21.

Thus, when the second spacer layer 210 is anisotropically etched, the second spacer layer 210 may at least partially remain, and the growth prevention pattern 225 may be formed to fill at least a lower portion of the fifth recess 199. However, the growth prevention pattern 225 may not entirely cover the portion of the active pattern 105 exposed by the fifth recess 199. In this case, the growth prevention pattern 225 may allow opposite sidewalls of the active pattern 105 in the first direction to be exposed, and may not be connected to a lowermost one of the inner spacers 220. The opposite sidewalls of the active pattern 105 that are not covered by the growth prevention pattern 225 may extend vertically in the third direction.

Referring to FIG. 28, processes similar to those illustrated with reference to FIG. 15 may be performed.

However, the exposed opposite sidewalls of the active pattern 105 may serve as a seed, and thus, a fifth epitaxial layer 237 having the first impurity concentration may be formed.

The growth prevention pattern 225 has been formed in a lower portion of the fifth recess 199 in the first direction, and thus, only the vertical opposite sidewalls of the active pattern 105 may serve as a seed. As a consequence, the fifth epitaxial layer 237 may have a low height with respect to the substrate 100. Thus, an uppermost surface of the fifth epitaxial layer 237 may be lower than a bottom surface of the lowermost one of the semiconductor patterns 124.

Processes similar to those illustrated with reference to FIGS. 16 to 18 and FIGS. 1 to 3 may be performed to complete the fabrication of the semiconductor device.

Figure 29:
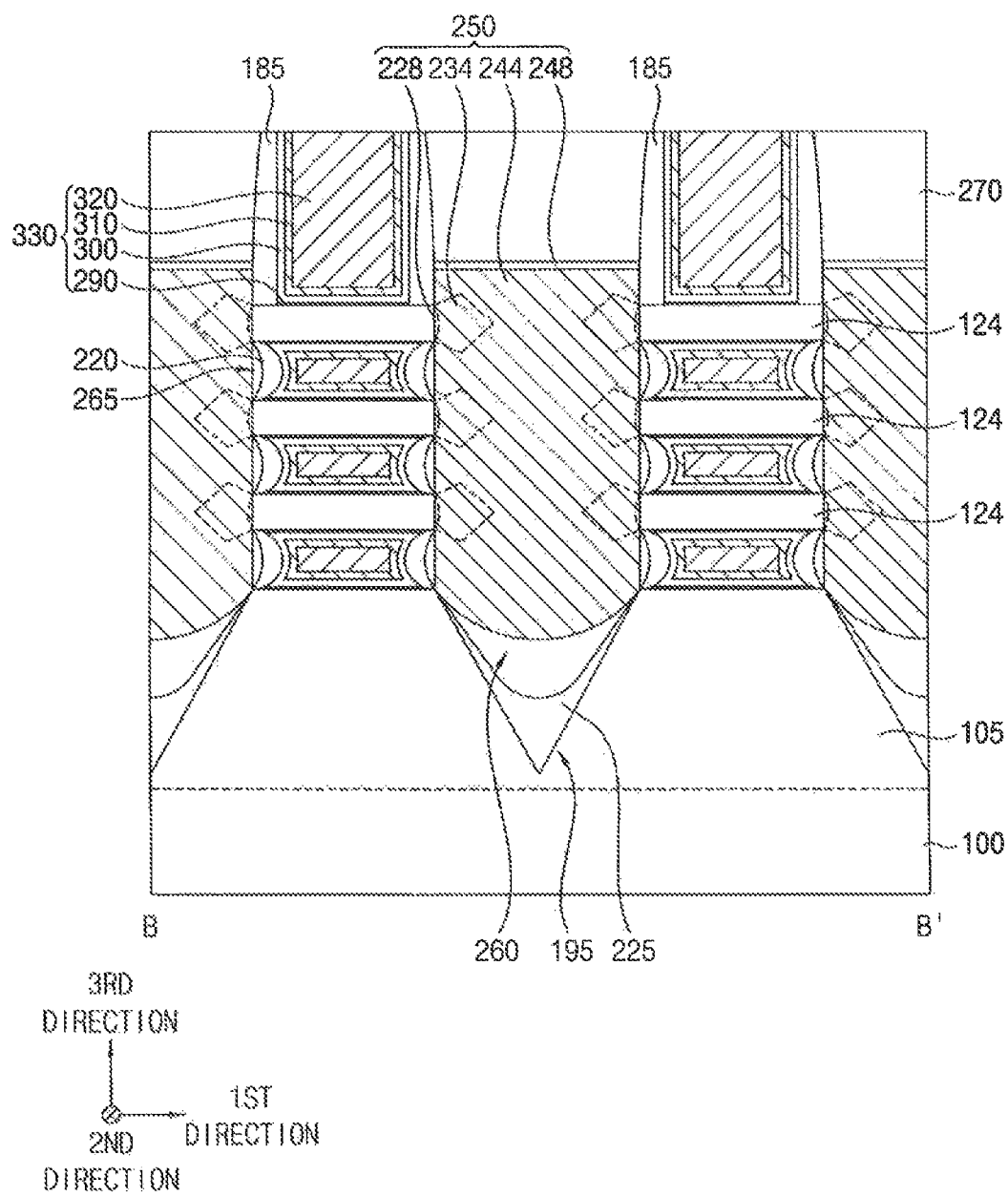
FIG. 29 is a cross-sectional view illustrating a semiconductor device in accordance with exemplary embodiments of the inventive concept.

FIG. 29 is a cross-sectional view illustrating a semiconductor device in accordance with exemplary embodiments of the inventive concept, for example, a cross-sectional view taken along the line B-B' of FIG. 1. This semiconductor device may be similar to that of FIGS. 1 to 3, except for some elements. Thus, like reference numerals may refer to like elements, and repetitive descriptions may be omitted.

Referring to FIG. 29, the source/drain layer 250 may include sixth, seventh, eighth and ninth epitaxial layers 228, 234, 244 and 248.

The sixth epitaxial layer 228 may be thinly formed on each of opposite sidewalls of semiconductor patterns 124 in the first direction, the seventh epitaxial layer 234 may protrude from the sixth epitaxial layer 228 in the first direction to have a cross-section in the first direction with a shape of, e.g., a pentagon, the eighth epitaxial layer 244 may be grown to fill the first opening 190 and contact a lower outer sidewall of the gate spacer 185, and the ninth epitaxial layer 248 may be thinly formed on the eighth epitaxial layer 244.

In exemplary embodiments of the present invention, the sixth to eighth epitaxial layers 228, 234 and 244 may include single crystalline silicon-germanium doped with p-type impurities, and may have fourth, fifth and sixth impurity concentrations, respectively. The sixth impurity concentration may be greater than the fifth impurity concentration, which may be greater than the fourth impurity concentration. Germanium concentrations of the sixth to eighth epitaxial layers 228, 234 and 244, respectively, may gradually increase in this order. In other words, the germanium concentration of the eighth epitaxial layer 244 may be greater than that of the seventh epitaxial layer 234, which may be greater than that of the sixth epitaxial layer 228.

The ninth epitaxial layer 248 may include undoped single crystalline silicon.

This semiconductor device may be an MBCFET including p-type metal-oxide semiconductor (PMOS) transistors unlike that of the FIGS. 1 to 3. The source/drain layer 250 of this semiconductor device may include not only the sixth and seventh epitaxial layers 228 and 234 having a relatively low impurity concentration but also the eighth epitaxial layer 244 having a relatively high impurity concentration between the channels at each level, and thus, the deterioration of performance of the transistor including the channels may be prevented.

Figure 30:
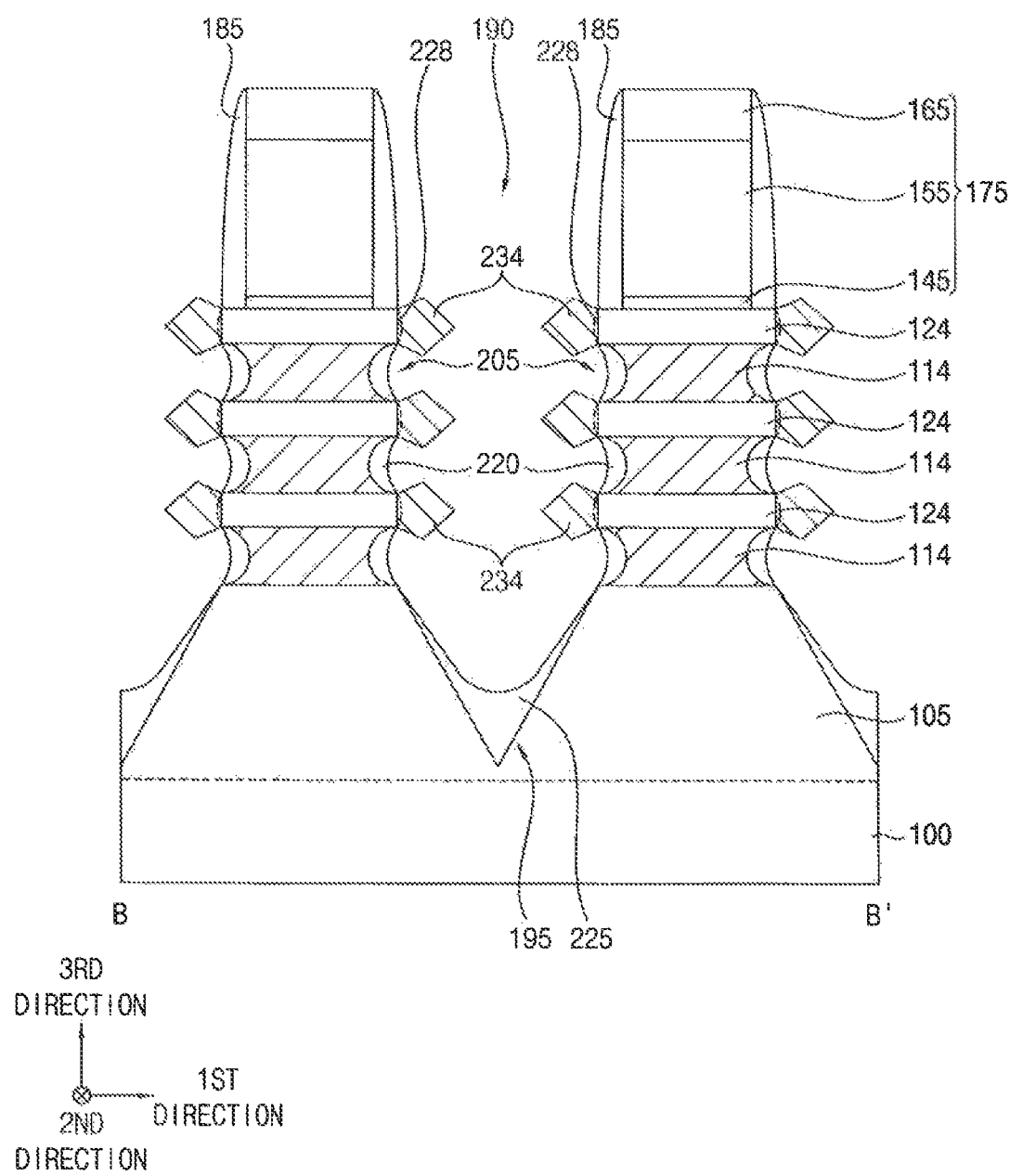
FIGS. 30 and 31 are cross-sectional views illustrating a method of manufacturing a semiconductor device in accordance with exemplary embodiments of the inventive concept.
Figure 31:
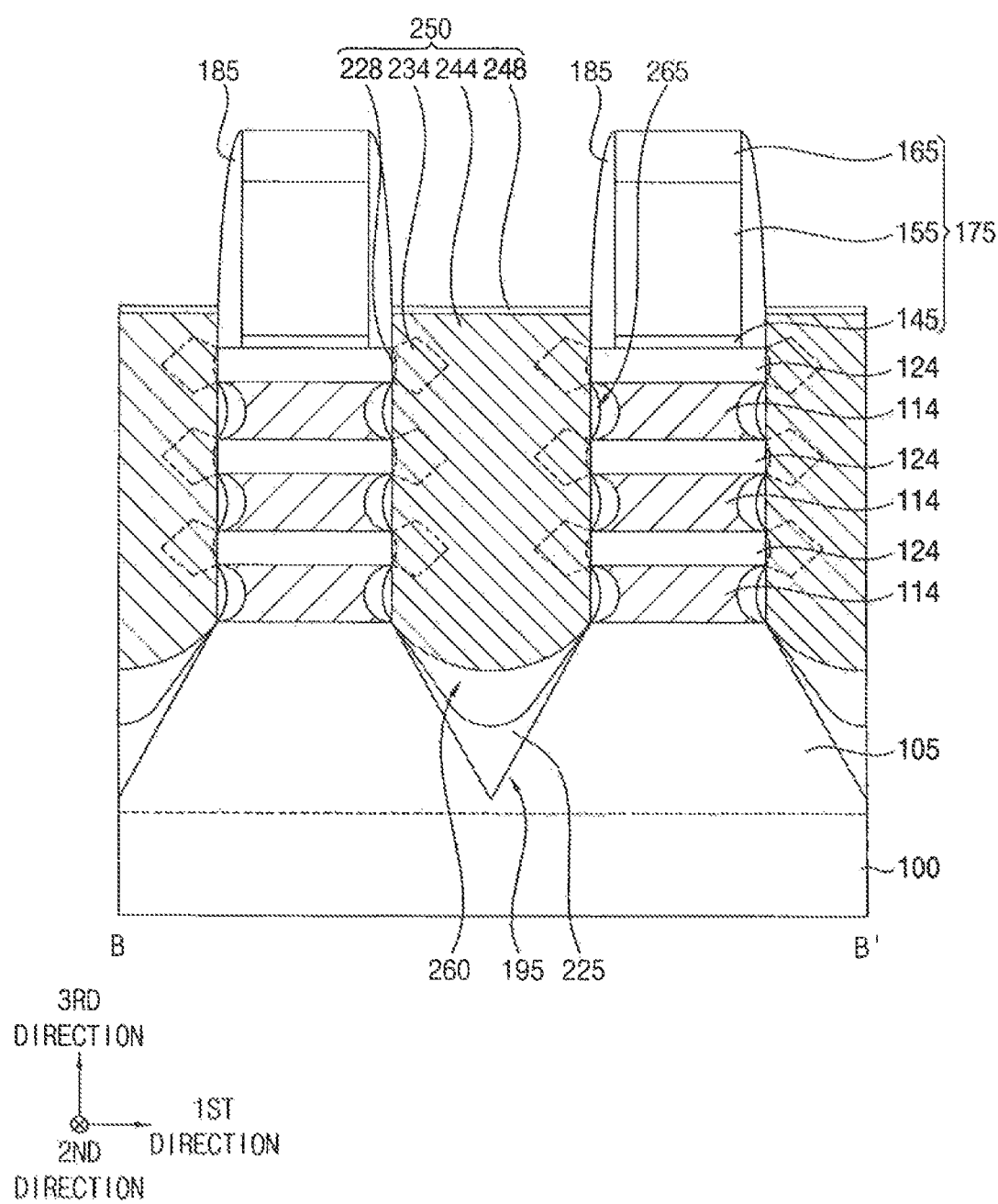

FIGS. 30 and 31 are cross-sectional views illustrating a method of manufacturing a semiconductor device in accordance with exemplary embodiments of the inventive concept, for example, cross-sectional views taken along lines B-B' of corresponding plan views, respectively. This method may include processes similar to those illustrated with reference to FIGS. 4 to 18 and FIGS. 1 to 3, and thus, repetitive descriptions may be omitted.

Referring to FIG. 30, processes similar to those illustrated with reference to FIGS. 4 to 15 may be performed.

However, a third SEG process may be performed instead of the first SEG process. The third SEG process may be performed using a silicon source gas, e.g., dichlorosilane (SiH$_2$Cl$_2$), a germanium source gas, e.g., germane (GeH$_4$), and a p-type impurity source gas, e.g., diborane (B$_2$H$_6$) to form a single crystalline silicon germanium (SiGe) layer doped with p-type impurities. The sixth epitaxial layer 228 may have a third impurity concentration.

In exemplary embodiments of the inventive concept, each of the sixth epitaxial layers 228 may be formed on each of opposite sidewalls of the sacrificial patterns 114 in the first direction.

A fourth SEG process may be performed using the silicon source gas, the germanium source gas, and the p-type impurity source gas to form a seventh epitaxial layer 234 including single crystalline silicon-germanium (SiGe) doped with p-type impurities. The seventh epitaxial layer 234 may have a fourth impurity concentration greater than the third impurity concentration. A germanium concentration of the seventh epitaxial layer 234 may be greater than that of the sixth epitaxial layer 228.

In exemplary embodiments of the inventive concept, the seventh epitaxial layer 234 may protrude from the sixth epitaxial layer 228 in the first direction, and may have a cross-section of a shape of, e.g., a pentagon.

Referring to FIG. 31, processes similar to those illustrated with reference to FIG. 16 may be performed.

However, a fifth SEG process may be performed instead of the second SEG process to form an eighth epitaxial layer 244. The fifth SEG process may be performed using the silicon source gas, the germanium source gas, and the p-type impurity source gas to form the eighth epitaxial layer 244 including single crystalline silicon-germanium (SiGe) doped with p-type impurities. The eighth epitaxial layer 244 may have a fifth impurity concentration greater than the fourth impurity concentration. A germanium concentration of the eighth epitaxial layer 244 may be greater than that of the seventh epitaxial layer 234.

In exemplary embodiments of the inventive concept, the eighth epitaxial layer 244 may fill the first opening 190 on the growth prevention pattern 225, and may contact a lower outer sidewall of the gate spacer 185. For example, the eighth epitaxial layer 244 may be disposed around the seventh epitaxial layer 234.

A sixth SEG process may be performed using the silicon source gas only to form a ninth epitaxial layer 248 including single crystalline silicon. The ninth epitaxial layer 248 may be thinly formed on the eighth epitaxial layer 244. For example, the ninth epitaxial layer 248 may be formed on an uppermost surface of the eighth epitaxial layer 244.

By the above processes, the source/drain layer 250 including the sixth to ninth epitaxial layers 228, 234, 244 and 248 may be formed.

Processes similar to those illustrated with reference to FIGS. 17 and 18 and FIGS. 1 to 3 may be performed to complete the fabrication of the semiconductor device.

Figure 32:
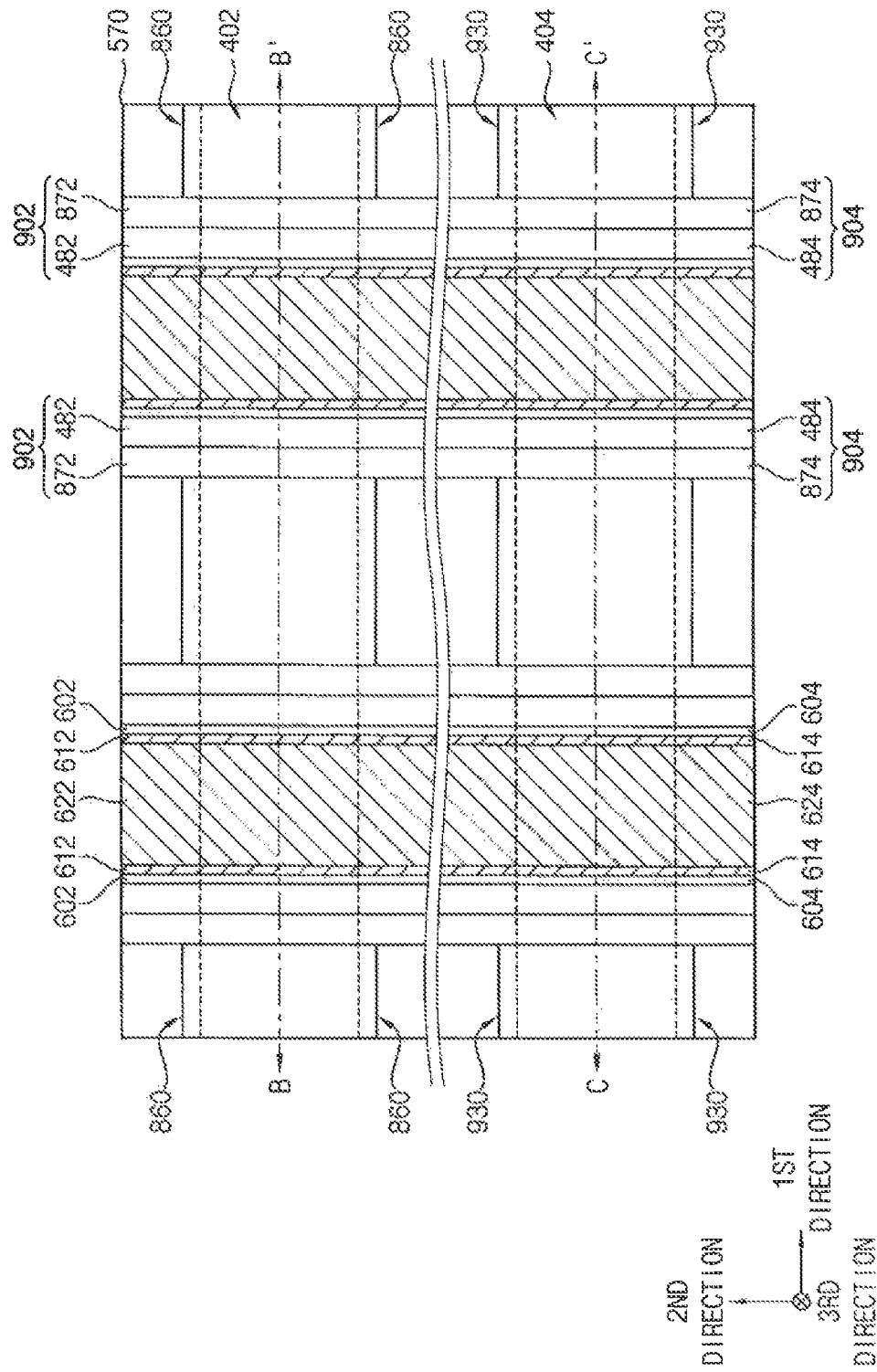
Figure 34:
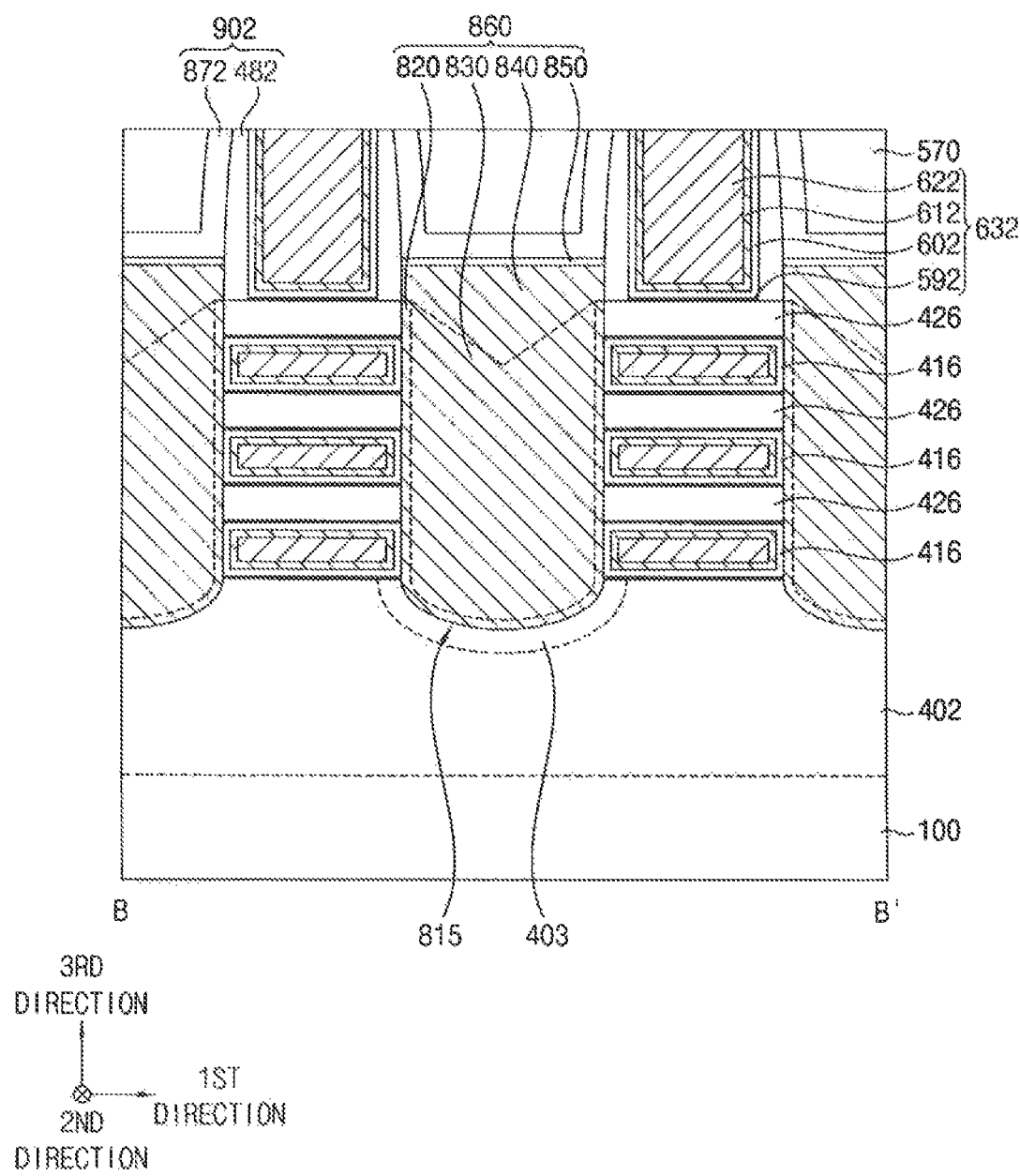
Figure 35:
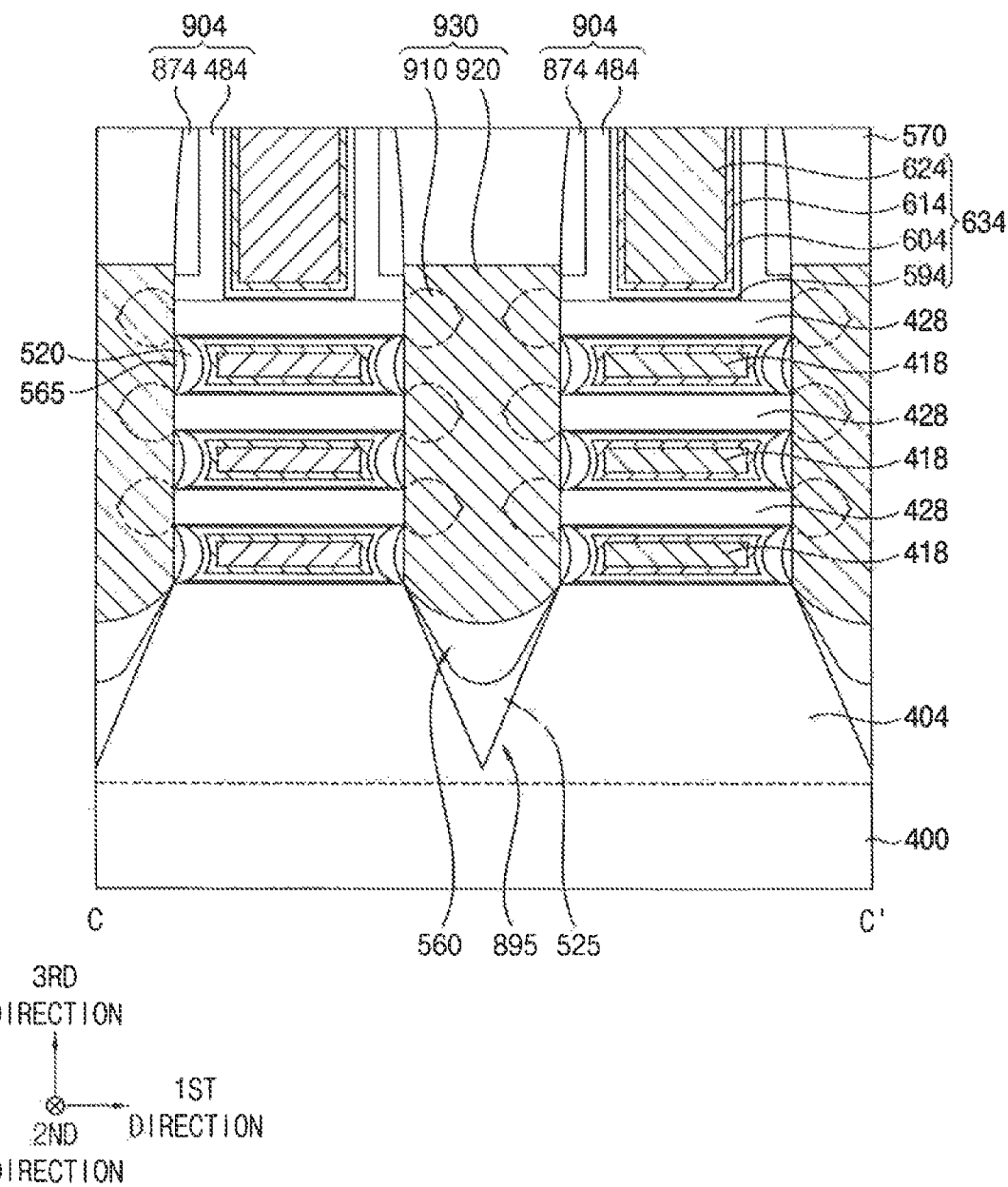

FIGS. 32 to 35 are a plan view and cross-sectional views illustrating a semiconductor device in accordance with exemplary embodiments of the inventive concept. FIG. 32 is the plan view, FIG. 33 is a cross-sectional view taken along a line A-A' of FIG. 32, FIG. 34 is a cross-sectional view taken long a line B-B' of FIG. 32, and FIG. 35 is a cross-sectional view taken along a line C-C' of FIG. 32.

This semiconductor device may be a complementary metal oxide semiconductor (CMOS) transistor including a PMOS transistor and an NMOS transistor to which exemplary embodiments of the inventive concept are applied. Thus, detailed descriptions on the NMOS transistor may be omitted.

Referring to FIGS. 32 to 35, the semiconductor device may include first and second MBCFETs on first and second regions I and II, respectively, of a substrate 400.

The first and second regions I and II of the substrate 400 may be PMOS and NMOS regions, respectively, and thus, the first MBCFET may include PMOS transistors and the second MBCFET may include NMOS transistors.

The first MBCFET may be formed on a first active pattern 402 on the first region I of the substrate 400, and may include a first gate structure 632, first semiconductor patterns 426, a first source/drain layer 860, a first gate spacer structure 902, and a leakage prevention pattern 403.

A sidewall of the first active pattern 402 may be covered by a first isolation pattern 432. A sixth recess 815 having a concave curved shape may be formed on an upper surface of the first active pattern 402 between the first gate structures 632, and the leakage prevention pattern 403 may be formed at an upper portion of the first active pattern 402 adjacent the sixth recess 815. The leakage prevention pattern 403 may include, e.g., silicon doped with n-type impurities.

The first semiconductor patterns 426 may be formed at a plurality of levels, respectively, spaced apart from each other on the upper surface of the first active pattern 402, and each of the first semiconductor patterns 426 may extend in the first direction through the first gate structure 632. Each of the first semiconductor patterns 426 may serve as a channel of the PMOS transistor, and thus, may be referred to as a first channel.

The first gate structure 632 may be formed on the first active pattern 402 and a portion of the first isolation pattern 432 adjacent to the first active pattern 402 in the second direction. In addition, the first gate structure 632 may cover the first semiconductor patterns 426.

The first gate structure 632 may include a first interface pattern 592, a first gate insulation pattern 602, a first workfunction control pattern 612, and a first gate electrode 622 sequentially stacked from a surface of each of the first semiconductor patterns 426 or the upper surface of the first active pattern 402.

The first gate spacer structure 902 may include a first gate spacer 482 covering each of opposite sidewalls of an upper portion of the first gate structure 632 in the first direction, and a second gate spacer 872 on an outer sidewall of the first gate spacer 482. In exemplary embodiments of the inventive concept, a bottom surface of the first gate spacer 482 may be lower than a bottom surface of the second gate spacer 872.

For convenience of explanation, the first gate structure 632, the first gate spacer 482 and the first semiconductor patterns 426 altogether may be referred to as a third structure.

The first source/drain layer 860 may extend in the third direction on the first active pattern 402, and may commonly contact respective sidewalls of the first semiconductor patterns 426 in the first direction at the plurality of levels, respectively, to be connected thereto. Additionally, the first source/drain layer 860 may contact a lower outer sidewall of the first gate spacer 482.

The first source/drain layer 860 may include tenth, eleventh, twelfth, and thirteenth epitaxial layers 820, 830, 840 and 850.

In exemplary embodiments of the inventive concept, the tenth epitaxial layer 820 may be thinly formed on the upper surface of the first active pattern 402 and each of opposite sidewalls of a lower portion of the first gate structure 632 and the first semiconductor patterns 426 in the first direction, and the eleventh epitaxial layer 830 may be formed on the tenth epitaxial layer 820 to fill most of a space between neighboring ones of the third structures in the first direction. An upper surface of the eleventh epitaxial layer 830 may have a cross-section in the first direction with a "V" shape, and an uppermost surface of the eleventh epitaxial layer 830 may be substantially coplanar with an upper surface of an uppermost one of the first semiconductor patterns 426. The twelfth epitaxial layer 840 may be formed on the eleventh epitaxial layer 830 to fill a space between neighboring ones of the third structures in the first direction, and contact a lower outer sidewall of the first gate spacer 482. The thirteenth epitaxial layer 850 may be thinly formed on an upper surface of the twelfth epitaxial layer 840.

In exemplary embodiments of the inventive concept, the tenth to twelfth epitaxial layers 820, 830 and 840 may include single crystalline silicon-germanium doped with p-type impurities. Impurity concentrations and germanium concentrations of the tenth to twelfth epitaxial layers 820, 830 and 840 may gradually increase in order. For example, the germanium concentration of the eleventh epitaxial layer 830 may be greater than that of the tenth epitaxial layer 820 and the germanium concentration of the twelfth epitaxial layer 840 may be greater than that of the eleventh epitaxial layer 830. The thirteenth epitaxial layer 850 may include undoped single crystalline silicon.

In exemplary embodiments of the inventive concept, the first source/drain layer 860 may have a cross-section in the second direction with a shape of, e.g., a polygon such as a pentagon.

The second MBCFET may be formed on a second active pattern 404 on the second region II of the substrate 400, and may include a second gate structure 634, second semiconductor patterns 428, a second source/drain layer 930, a second gate spacer structure 904, an inner spacer 520, and a growth prevention pattern 525.

A sidewall of the second active pattern 404 may be covered by a second isolation pattern 434. A seventh recess 895 having a cross-section of a "V" shape may be formed on an upper surface of the second active pattern 404 between the second gate structures 634, and the growth prevention pattern 525 may be formed on the seventh recess 895.

The second semiconductor patterns 428 may be formed at a plurality of levels, respectively, spaced apart from each other on the upper surface of the second active pattern 404, and each of the second semiconductor patterns 428 may extend in the first direction through the second gate structure 634. Each of the second semiconductor patterns 428 may serve as a channel of the NMOS transistor, and thus, may be referred to as a second channel.

The second gate structure 634 may be formed on the second active pattern 404 and a portion of the second isolation pattern 434 adjacent to the second active pattern 404 in the second direction. The second gate structure 634 may cover the second semiconductor patterns 428.

The second gate structure 634 may include a second interface pattern 594, a second gate insulation pattern 604, a second workfunction control pattern 614, and a second gate electrode 624 sequentially stacked from a surface of each of the second semiconductor patterns 428 or the upper surface of the second active pattern 404.

The second gate spacer structure 904 may include a third gate spacer 484 covering each of opposite sidewalls of an upper portion of the second gate structure 634 in the first direction and having a cross-section in the first direction of an "L" shape, and a fourth gate spacer 874 on an outer sidewall of the third gate spacer 484.

For convenience of explanation, the second gate structure 634, the second gate spacer structure 904 and the second semiconductor patterns 428 altogether may be referred to as a fourth structure.

The inner spacer 520 may be formed on each of opposite sidewalls in the first direction of a portion of the second gate structure 634 between the second semiconductor patterns 428. In addition, the inner spacer 520 may be formed between a portion of the second gate structure 634 between the upper surface of the second active pattern 404 and a lowermost one of the second semiconductor patterns 428. The inner spacer 520 may have a cross-section in the first direction with a shape of a horseshoe or a semicircle having a recess on an outer sidewall thereof. Alternatively, the inner spacer 520 may have a cross-section in the first direction with a rounded rectangle having a recess on an outer sidewall thereof.

The second source/drain layer 930 may extend in the third direction on the second active pattern 404, and may commonly contact respective sidewalls of the second semiconductor patterns 428 in the first direction at the plurality of levels, respectively, to be connected thereto. Additionally, the second source/drain layer 930 may contact a lower outer sidewall of the second gate spacer structure 904.

The second source/drain layer 860 may include fourteenth and fifteenth epitaxial layers 910 and 920.

In exemplary embodiments of the inventive concept, each of the fourteenth epitaxial layers 910 may protrude from the sidewall of each of the second semiconductor patterns 428 in the first direction, and may have a cross-section in the first direction having, e.g., a shape of a candle or an ellipse. In exemplary embodiments of the inventive concept, the fifteenth epitaxial layer 920 may fill a space between neighboring ones of the fourth structures in the first direction to contact a lower sidewall of the second gate spacer structure 904.

In exemplary embodiments of the inventive concept, each of the fourteenth and fifteenth epitaxial layers 910 and 920 may include single crystalline silicon carbide doped with n-type impurities or single crystalline silicon doped with n-type impurities. An impurity concentration of the fifteenth epitaxial layer 920 may be greater than that of the fourteenth epitaxial layer 910.

In exemplary embodiments of the inventive concept, the second source/drain layer 930 may have a cross-section in the second direction having a shape of, e.g., a candle or an ellipse.

A first air gap 560 may be formed between the source/drain layer 930 and the growth prevention pattern 525, and a second air gap 565 may be formed between the second source/drain layer 930 and the inner spacer 520.

In the second MBCFET of the semiconductor device, a portion of the second source/drain layer 930 between the second semiconductor patterns 428 at the same level may include not only the fourteenth epitaxial layer 910 having a relatively low impurity concentration but also the fifteenth epitaxial layer 920 having a relatively high impurity concentration. As a consequence, the deterioration of performance of the NMOS transistor including the second semiconductor patterns 428 may be prevented. Additionally, the growth prevention pattern 525 may be formed between the second source/drain layer 930 and the second active pattern 404, and thus, leakage currents may not be generated therebetween.

In the first MBCFET of the semiconductor device, the leakage prevention pattern 403 may be formed between the first source/drain layer 860 and the first active pattern 402, and thus, leakage currents may not be generated therebetween.

FIGS. 36 to 50 are plan views and cross-sectional views illustrating a method of manufacturing a semiconductor device in accordance with exemplary embodiments of the inventive concept. For example, FIGS. 36, 38, 41, 45 and 48 are the plan views, and FIGS. 37, 39-40, 42-44, 46-47 and 49-50 are the cross-sectional views.

Figure 37:
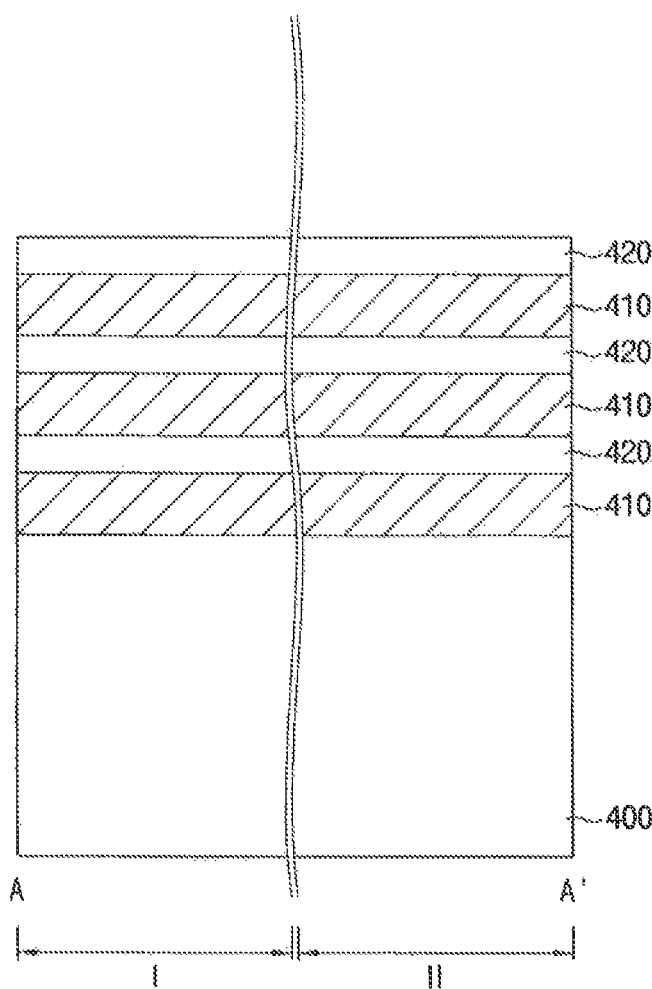
Figure 43:
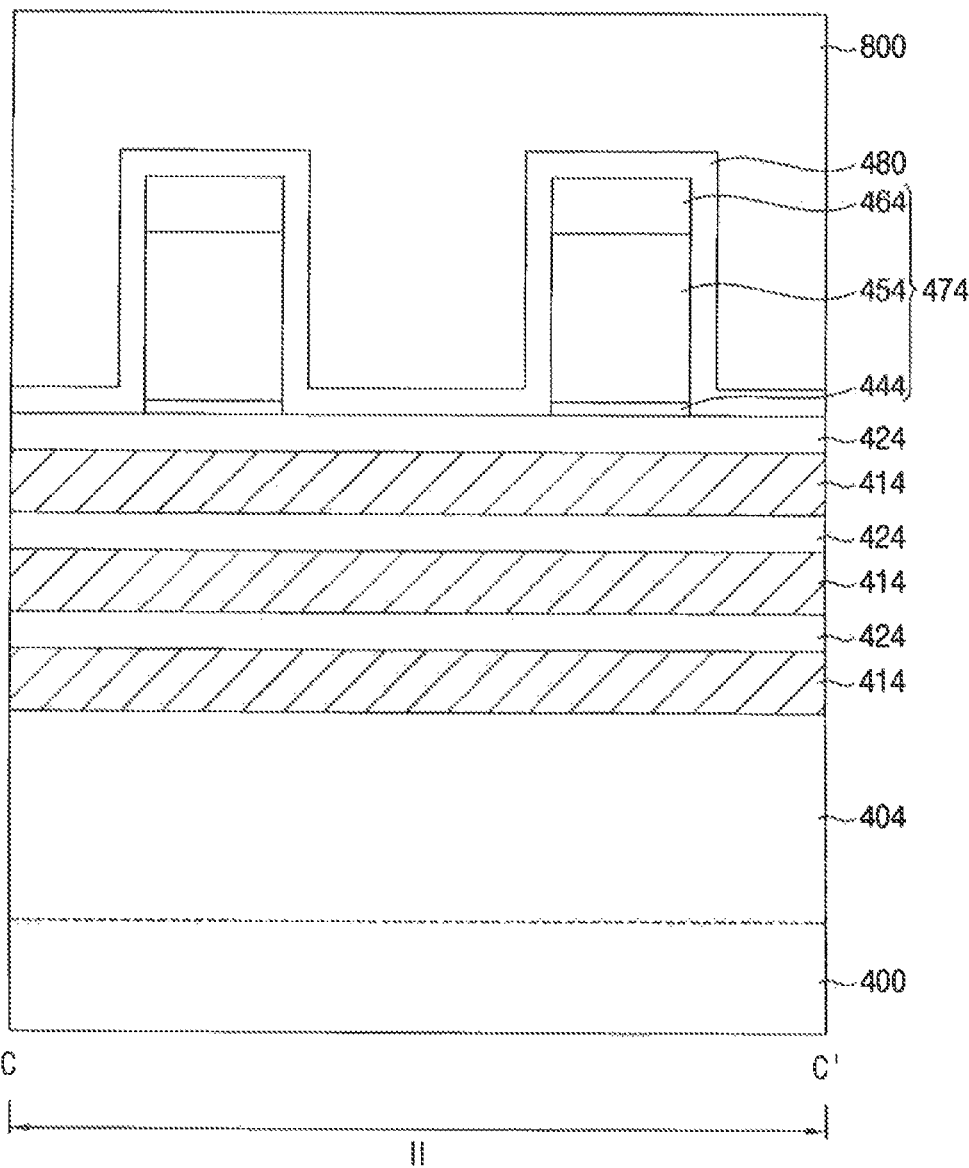
Figure 47:
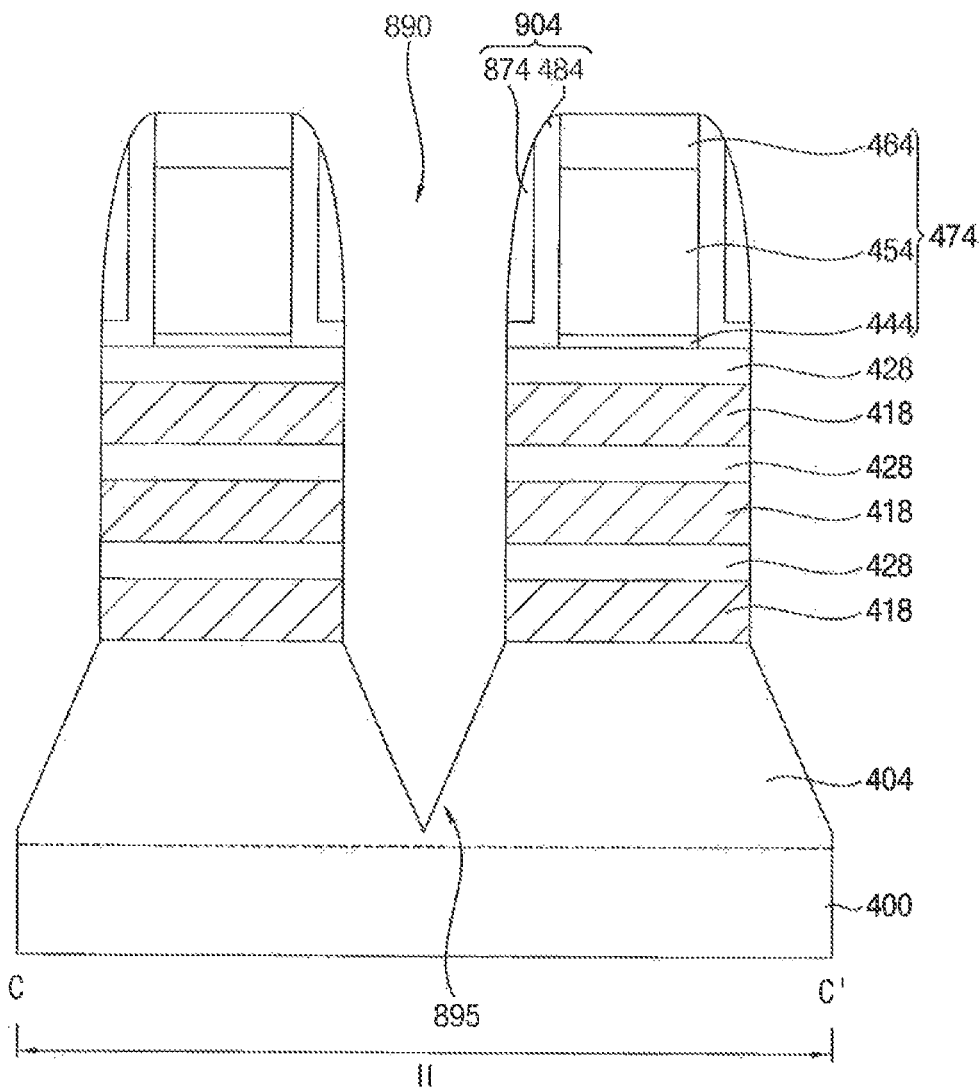

FIGS. 37 and 39 are cross-sectional views taken along lines A-A' of corresponding plan views, respectively, FIGS. 40, 42, 44, 46 and 49 are cross-sectional views taken along lines B-B' of corresponding plan views, respectively, and FIGS. 43, 47 and 50 are cross-sectional views taken along lines C-C' of corresponding plan views, respectively.

This method may include processes similar to those illustrated with reference to FIGS. 4 to 18 and FIGS. 1 to 3, and thus, repetitive descriptions may be omitted.

Figure 36:
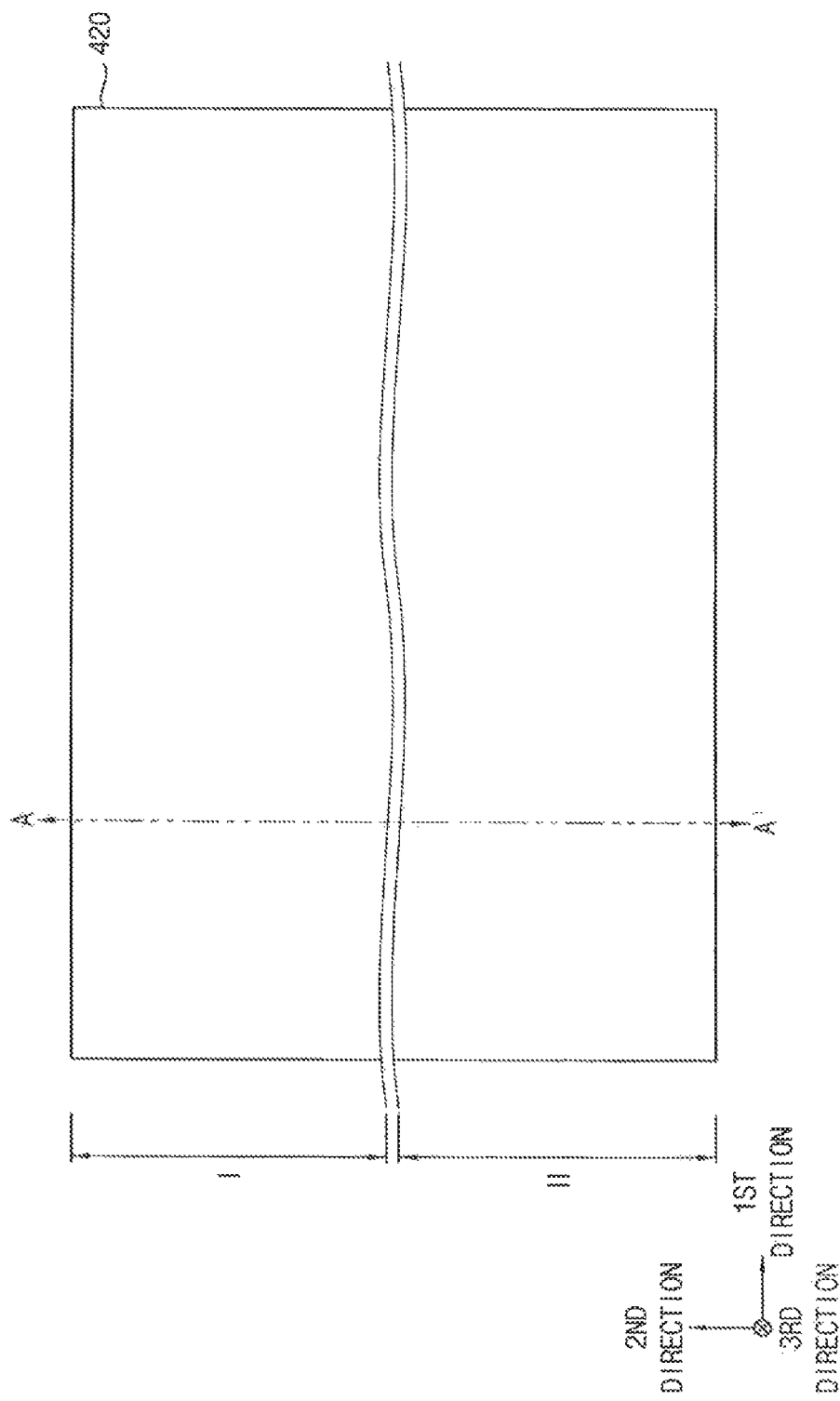

Referring to FIGS. 36 and 37, a sacrificial layer 410 and a semiconductor layer 420 may be alternately and repeatedly stacked on a substrate 400 including first and second regions I and II.

Figure 38:
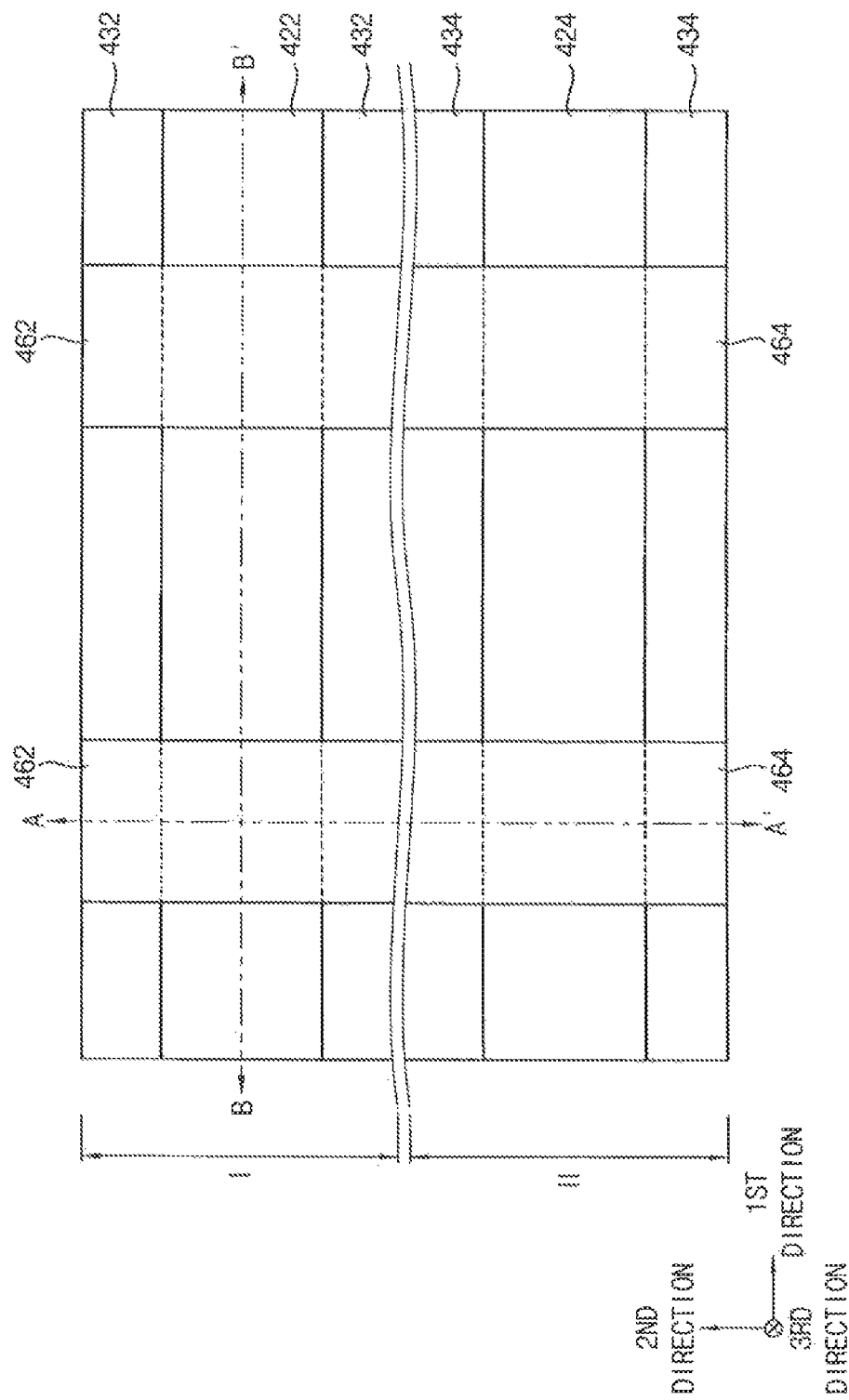
Figure 40:
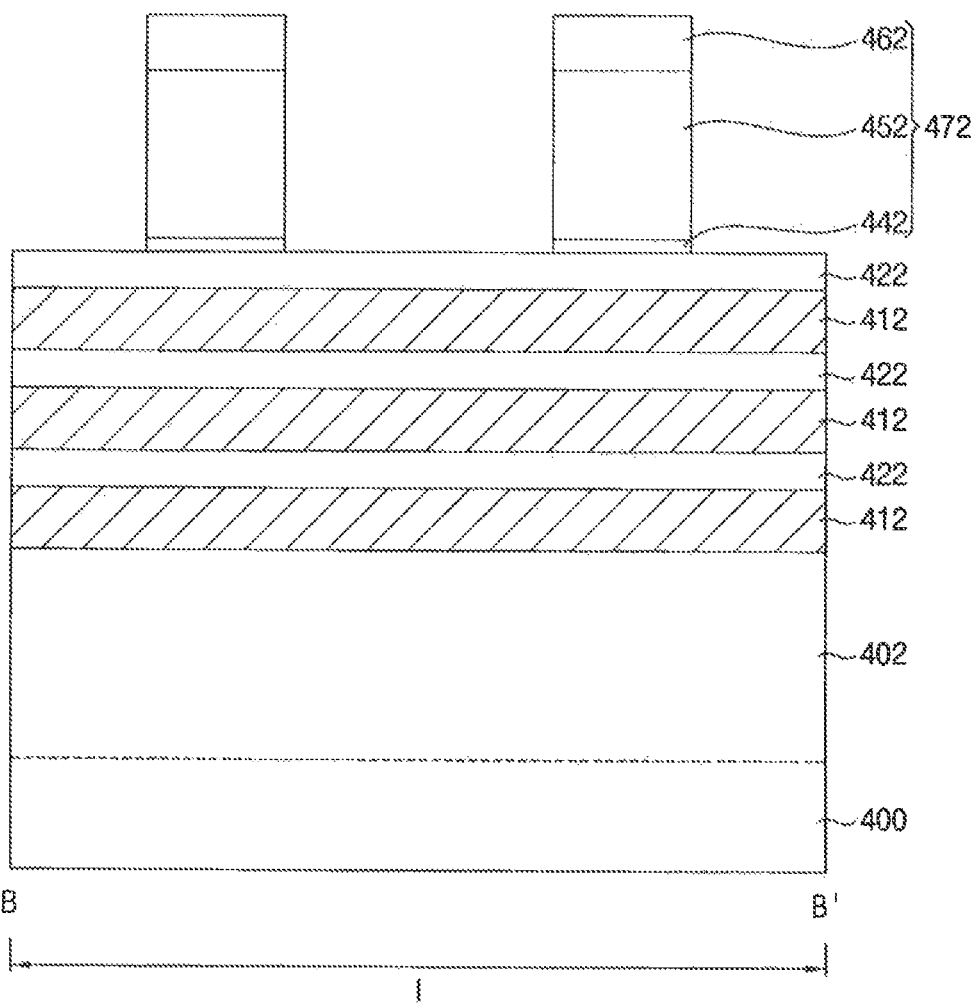

Referring to FIGS. 38 to 40, first and second etching masks extending in the first direction may be formed on an uppermost one of the semiconductor layers 420, and the semiconductor layers 420, the sacrificial layers 410 and an upper portion of the substrate 400 may be etched using the first and second etching masks to form first and second active patterns 402 and 404 on the first and second regions I and II, respectively, of the substrate 400.

Thus, a first fin structure including first sacrificial lines 412 and first semiconductor lines 422 alternately and repeatedly stacked may be formed on the first active pattern 402, and a second fin structure including second sacrificial lines 414 and second semiconductor lines 424 alternately and repeatedly stacked may be formed on the second active pattern 404.

First and second isolation patterns 432 and 434 may be formed on the first and second regions I and II, respectively, of the substrate 400 to cover sidewalls of the first and second active patterns 402 and 404, respectively.

First and second dummy gate structures 472 and 474 may be formed on the first and second isolation patterns 432 and 434, respectively, to partially cover the first and second fin structures, respectively.

The first dummy gate structure 472 may include a first dummy gate insulation pattern 442, a first dummy gate electrode 452, and a first dummy gate mask 462 sequentially stacked on the first fin structure and a portion of the first isolation pattern 432 adjacent thereto. The second dummy gate structure 474 may include a second dummy gate insulation pattern 444, a second dummy gate electrode 454, and a second dummy gate mask 464 sequentially stacked on the second fin structure and a portion of the second isolation pattern 434.

Figure 41:
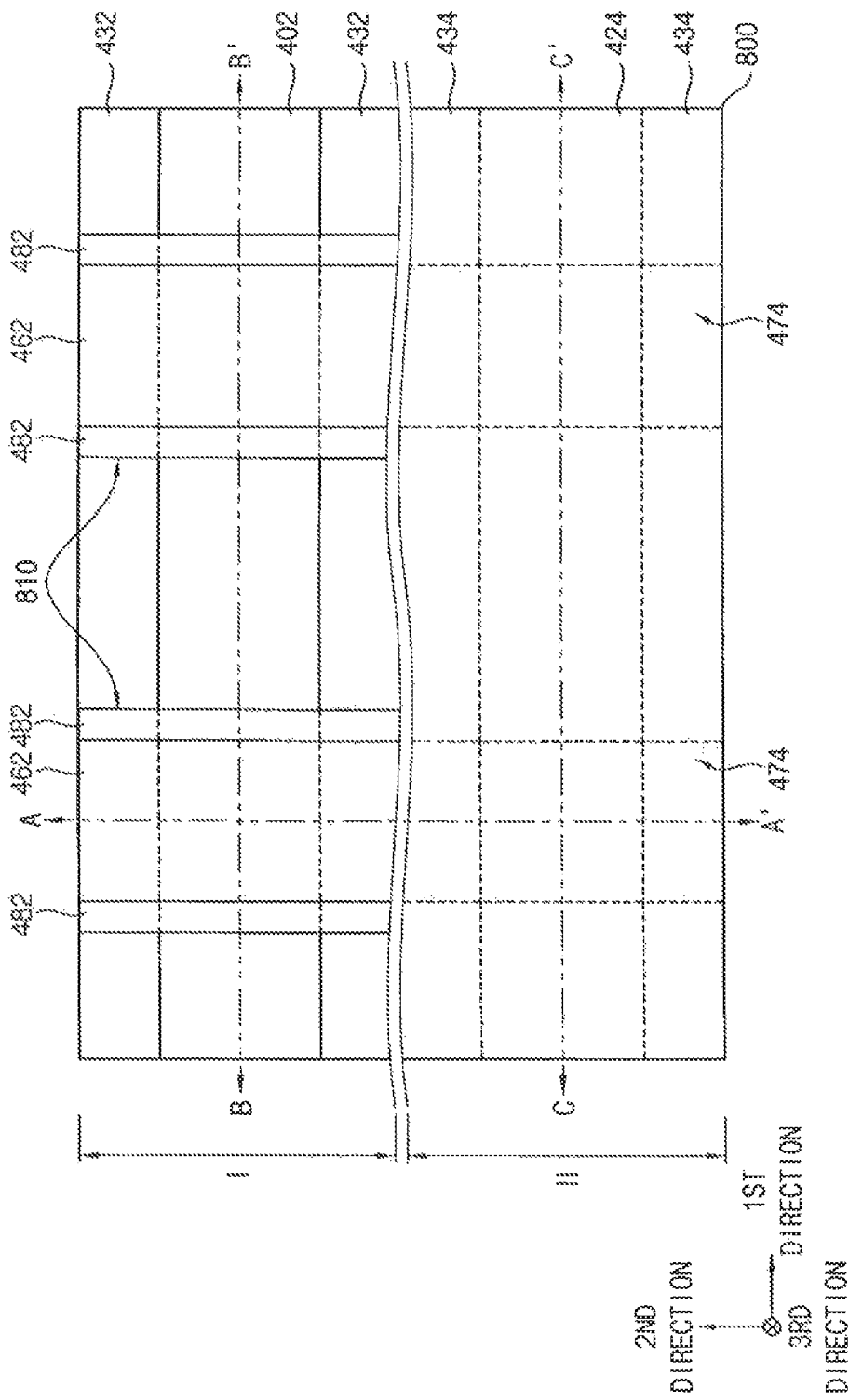

Referring to FIGS. 41 to 43, a first spacer layer 480 may be formed on the substrate 400 having the first and second fin structures, the first and second isolation patterns 432 and 434, and the first and second dummy gate structures 472 and 474 thereon. A first photoresist pattern 800 covering the second region II of the substrate 400 may be formed on the first spacer layer 480, and a portion of the first spacer layer 480 on the first region I of the substrate 400 may be etched using the first photoresist pattern 800 as an etching mask.

Thus, a first gate spacer 482 may be formed to cover each of opposite sidewalls of the first dummy gate structure 472 in the first direction.

The first fin structure may be etched using the first dummy gate structure 472 and the first gate spacer 482 as an etching mask to form a third opening 810 exposing an upper surface of the first active pattern 402, and a sixth recess 815 may be formed on the upper surface of the first active pattern 402 exposed by the third opening 810.

Thus, the first sacrificial lines 412 and the first semiconductor lines 422 under the first dummy gate structure 472 and the first gate spacer 482 may be transformed into first sacrificial patterns 416 and first semiconductor patterns 426, respectively, and the first fin structure extending in the first direction may be divided into a plurality of parts spaced apart from each other in the first direction. Hereinafter, the first dummy gate structure 472, the first gate spacer 482, and the first fin structure altogether may be referred to as a first structure.

In exemplary embodiments of the inventive concept, the sixth recess 815 may be shallow, and may have a curved shape.

A leakage prevention pattern 403 may be formed on the upper surface of the first active pattern 402 exposed by the sixth recess 815.

Referring to FIG. 44, after removing the first photoresist pattern 800, a first source/drain layer 860 may be formed on the upper surface of the first active pattern 402 exposed by the sixth recess 815.

In exemplary embodiments of the inventive concept, the first source/drain layer 860 may be formed by first, second, third and fourth SEG processes using the exposed upper surface of the first active pattern 402 and sidewalls of the first sacrificial patterns 416 and the first semiconductor patterns 426 as a seed.

Each of the first to third SEG processes may be performed using a silicon source gas, a germanium source gas, and a p-type impurity source gas, so that tenth, eleventh and twelfth epitaxial layers 820, 830 and 840 including single crystalline silicon-germanium doped with p-type impurities may be formed. The tenth to twelfth epitaxial layers 820, 830 and 840 may have impurity concentrations and germanium concentrations gradually increasing in this order. The fourth SEG process may be performed using the silicon source gas only, and thus, a thirteenth epitaxial layer 850 including undoped single crystalline silicon may be formed.

Figure 45:
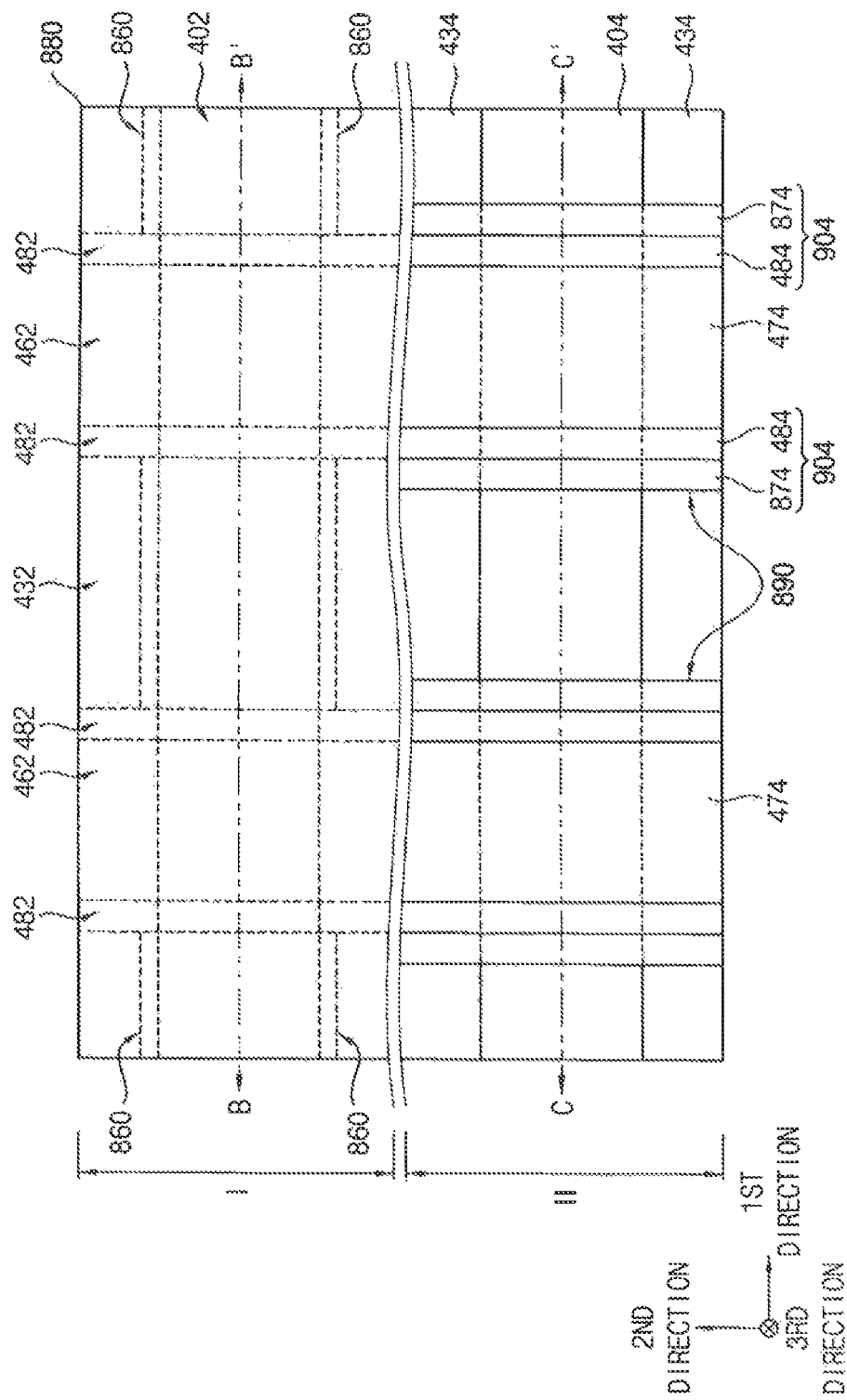

Referring to FIGS. 45 to 47, a second spacer layer 870 may be formed on the substrate 400 having the first structure, the first source/drain layer 860, the first isolation pattern 432, and the first spacer layer 480 thereon, a second photoresist pattern 880 covering the first region I of the substrate 400 may be formed on the second spacer layer 870, and a portion of the second spacer layer 870 on the second region II of the substrate 400 may be etched using the second photoresist pattern 880 as an etching mask.

Thus, a fourth gate spacer 874 may be formed to cover each of opposite sidewalls of the first spacer layer 480 in the first direction on the second dummy gate structure 474.

The first spacer layer 480 may be anisotropically etched to form a third gate spacer 484 covering each of opposite sidewalls of the second dummy gate structure 474 in the first direction. A portion of the third gate spacer 484 under the fourth gate spacer 874 may remain, and thus, the third gate spacer 484 may have a cross-section in the first direction with an "L" shape. The third and fourth gate spacers 484 and 874 sequentially stacked may form a second gate spacer structure 904.

The second fin structure may be etched using the second dummy gate structure 474 and the second gate spacer structure 904 as an etching mask to form a fourth opening 890 exposing an upper surface of the second active pattern 404, and the exposed upper surface of the second active pattern 404 may be further etched to form a seventh recess 895 in the fourth opening 890.

Thus, the second sacrificial lines 414 and the second semiconductor lines 424 under the second dummy gate structure 474 and the second gate spacer structure 904 may be transformed into second sacrificial patterns 418 and second semiconductor patterns 428, respectively, and the second fin structure extending in the first direction may be divided into a plurality of parts spaced apart from each other in the first direction. Hereinafter, the second dummy gate structure 474, the second gate spacer structure 904, and the second fin structure altogether may be referred to as a second structure.

In exemplary embodiments of the inventive concept, the seventh recess 895 may have a cross-section in the first direction of a "V" shape.

Figure 48:
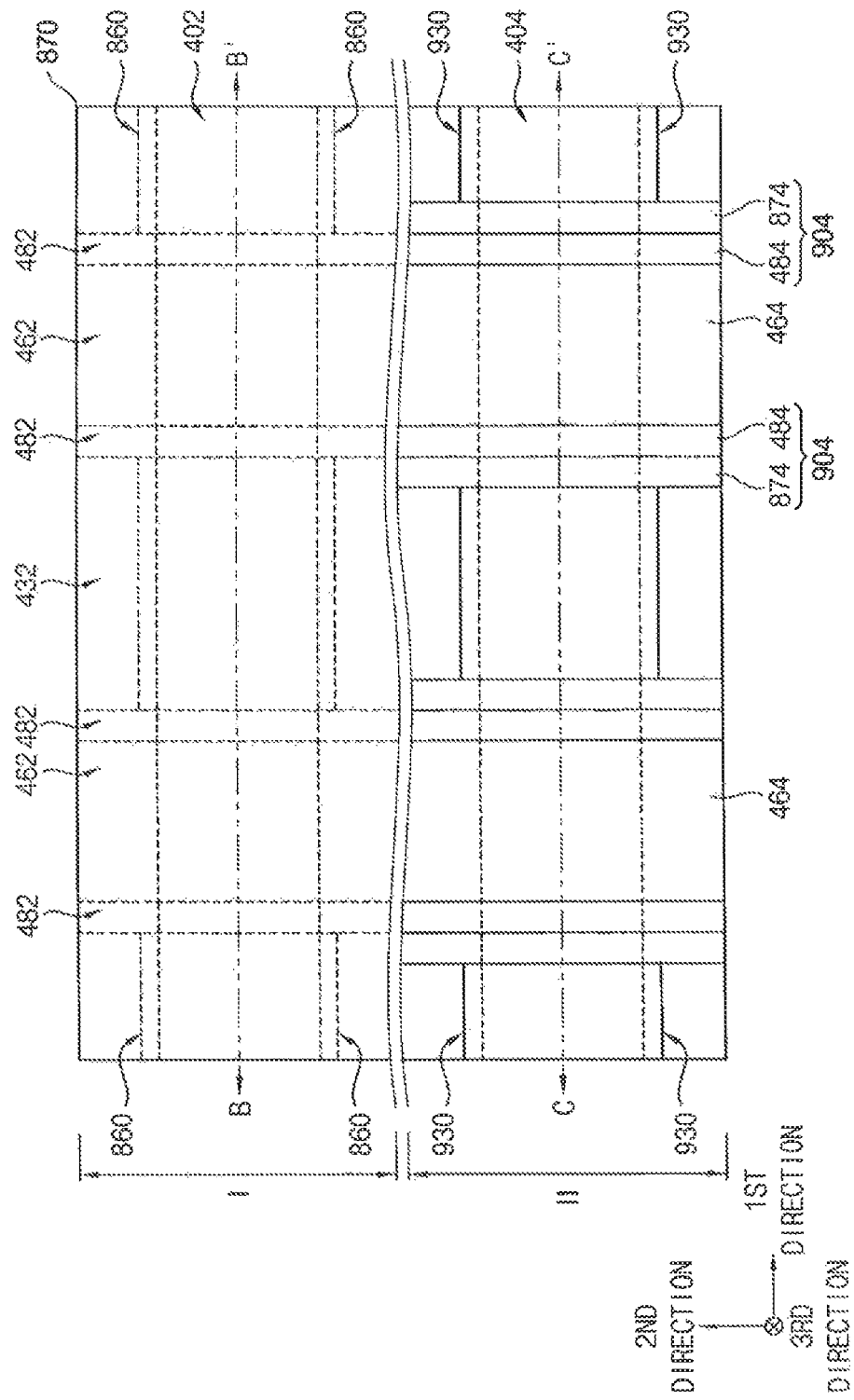

Referring to FIGS. 48 to 50, after removing the second photoresist pattern 880, opposite sidewalls in the first direction of the second sacrificial patterns 418 exposed by the fourth opening 890 may be etched to form eighth recesses, respectively, and an inner spacer 520 may be formed to fill each of the eighth recesses.

In exemplary embodiments of the inventive concept, the inner spacer 520 may be formed by forming a third spacer layer on the substrate 400 to fill the eighth recesses and anisotropically etching the third spacer layer. A growth prevention pattern 525 may be formed on the seventh recess 895.

A second source/drain layer 930 may be formed on the growth prevention pattern 525 to fill the fourth opening 890.

In exemplary embodiments of the inventive concept, the second source/drain layer 930 may be formed by fifth and sixth SEG processes using the second semiconductor patterns 428 as a seed.

Each of the fifth and sixth SEG processes may be performed using a silicon source gas, a carbon source gas and an n-type impurity source gas, or using a silicon source gas and an n-type source gas. Thus, fourteenth and fifteenth epitaxial layers 910 and 920 including single crystalline silicon carbide doped with n-type impurities or single crystalline silicon doped with n-type impurities may be formed. An impurity concentration of the fifteenth epitaxial layer 920 may be greater than that of the fourteenth epitaxial layer 910.

In exemplary embodiments of the inventive concept, the fourteenth epitaxial layer 910 may protrude from each of opposite sidewalls of the second semiconductor patterns 428 in the first direction, and may have a cross-section of a shape of, e.g., a candle or an ellipse. The fifteenth epitaxial layer 920 may fill the fourth opening 890, and may contact a lower outer sidewall of the second gate spacer structure 904.

In exemplary embodiments of the inventive concept, a first air gap 560 may be formed between the second source/drain layer 930 and the growth prevention pattern 525, and a second air gap 565 may be formed between the second source/drain layer 930 and the inner spacer 520.

Referring to FIGS. 32 to 35 again, an insulation layer 570 may be formed on the second isolation pattern 434 to cover the first and second structures, the second spacer layer 870, and the first and second source/drain layers 860 and 930. In addition, the first and second dummy gate structures 472 and 474 of the first and second structures may be replaced with first and second gate structures 632 and 634, respectively, to complete the fabrication of the semiconductor device.

During the replacement of the first and second gate structures 632 and 634, an upper portion of the second spacer layer 870 may be removed to form a second gate spacer 872 on an outer sidewall of the first gate spacer 482, and the first and second gate spacers 482 and 872 may form a first gate spacer structure 902.

The first gate structure 632 may include a first interface pattern 592, a first gate insulation pattern 602, a first workfunction control pattern 612 and a first gate electrode 622, and the second gate structure 634 may include a second interface pattern 594, a second gate insulation pattern 604, a second workfunction control pattern 614 and a second gate electrode 624.

Figure 51:
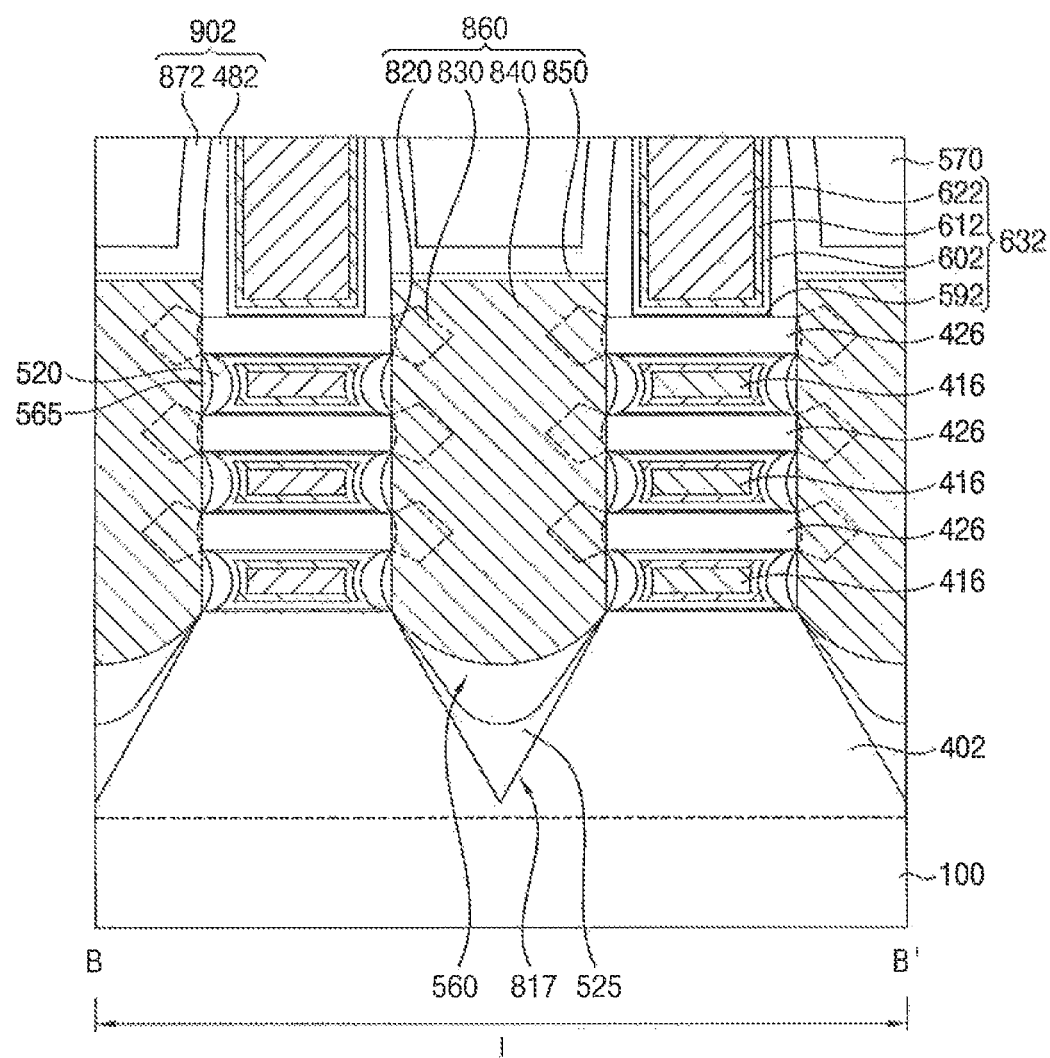
FIG. 51 is a cross-sectional view illustrating a semiconductor device in accordance with exemplary embodiments of the inventive concept.

FIG. 51 is a cross-sectional view illustrating a semiconductor device in accordance with exemplary embodiments of the inventive concept, for example, a cross-sectional view taken along a line B-B' of FIG. 32. This semiconductor device may be a CMOS transistor including a PMOS transistor and an NMOS transistor to which exemplary embodiments of the inventive concept are applied. Thus, detailed descriptions on elements of the PMOS and NMOS transistors may be omitted.

Referring to FIG. 51, a ninth recess 817 having a cross-section in the first direction of a "V" shape may be formed on the first active pattern 402 between the first gate structures 632, and the growth prevention pattern 525 may be formed on the ninth recess 817.

The first source/drain layer 860 may extend in the third direction on the growth prevention pattern 525, and may commonly contact sidewalls of the first semiconductor patterns 426 in the first direction to be connected thereto. The first source/drain layer 860 may contact a lower outer sidewall of the first gate spacer 482.

The first source/drain layer 860 may include the tenth to thirteenth epitaxial layers 820, 830, 840 and 850.

In exemplary embodiments of the inventive concept, the tenth epitaxial layer 820 may be thinly formed on each of opposite sidewalls of the first semiconductor patterns 426 in the first direction, the eleventh epitaxial layer 830 may be formed on the tenth epitaxial layer 820 to protrude in the first direction, and may have a cross-section of a shape of, e.g., a polygon such as a pentagon. The twelfth epitaxial layer 840 may be formed on the growth prevention pattern 525 to fill a space between neighboring ones of the third structures to contact a lower outer sidewall of the first gate spacer 482, and the thirteenth epitaxial layer 850 may be thinly formed on an upper surface of the twelfth epitaxial layer 840.

While the inventive concept has been shown and described with reference to exemplary embodiments thereof, it will be apparent to those of ordinary skill in the art that various modifications in form and details may be made thereto without departing from the spirit and scope of the inventive concept as set forth by the following claims.

What is claimed is:

1. A semiconductor device, comprising:
an active pattern on a substrate, the active pattern including a recess thereon;
a growth prevention pattern on the recess;
gate structures on a first portion of the active pattern at a first side of the recess and a second portion of the active pattern at a second side of the recess;
channels spaced apart from each other in a vertical direction perpendicular to an upper surface of the substrate, each of the channels extending through one of the gate structures; and
a source/drain layer on the growth prevention pattern, the source/drain layer being connected to the channels and including a semiconductor material doped with impurities,
wherein the growth prevention pattern covers an upper surface of an entire portion of the active pattern exposed by the recess and does not overlap a surface of the active pattern covered by the gate structures.

2. The semiconductor device of claim 1, wherein an area of the growth prevention pattern is substantially equal to an area of the recess in a plan view.

3. The semiconductor device of claim 1, wherein the recess has a "V" shape.

4. The semiconductor device of claim 1, further comprising an inner spacer on a sidewall of each of the gate structures between the channels, and on a sidewall of each of the gate structures between an upper surface of the active pattern and a lowermost one of the channels.

5. The semiconductor device of claim 4, wherein the inner spacer includes a material substantially the same as that of the growth prevention pattern.

6. The semiconductor device of claim 5, wherein each of the growth prevention pattern and the inner spacer includes a nitride.

7. The semiconductor device of claim 4, wherein the inner spacer is connected to the growth prevention pattern.

8. The semiconductor device of claim 1, wherein an uppermost surface of the growth prevention pattern is substantially coplanar with an upper surface of a portion of the active pattern on which the recess is not formed.

9. The semiconductor device of claim 1, further comprising an air gap between the growth prevention pattern and the source/drain layer.

10. A semiconductor device, comprising:
an active pattern on a substrate, the active pattern including a recess thereon;
a growth prevention pattern on the recess;
gate structures on a first portion of the active pattern at a first side of the recess and a second portion of the active pattern at a second side of the recess;
channels spaced apart from each other in a vertical direction perpendicular to an upper surface of the substrate, each of the channels extending through one of the gate structures; and
a source/drain layer on the growth prevention pattern, the source/drain layer being connected to the channels and including a semiconductor material doped with impurities,
wherein the growth prevention pattern partially covers an upper surface of a first portion of the active pattern that is exposed by the recess, an uppermost surface of the growth prevention pattern is lower than an upper surface of a second portion of the active pattern on which the recess is not formed, and the second portion of the active pattern being spaced apart from the growth prevention pattern.

11. The semiconductor device of claim 10, wherein the recess has a "V" shape.

12. The semiconductor device of claim 10, wherein an area of the growth prevention pattern is smaller than an area of the recess in a plan view.

13. The semiconductor device of claim 10, further comprising an inner spacer on a sidewall of each of the gate structures between the channels, and a sidewall of each of the gate structures between an upper surface of the active pattern and a lowermost one of the channels.

14. The semiconductor device of claim 13, wherein the inner spacer includes a material substantially the same as that of the growth prevention pattern.

15. The semiconductor device of claim 10, further comprising an air gap between the growth prevention pattern and the source/drain layer.

16. The semiconductor device of claim 15, wherein a top end of the air gap is lower than the upper surface of the second portion of the active pattern on which the recess is not formed.

17. A semiconductor device, comprising:
an active pattern on a substrate, the active pattern including a recess thereon;
a growth prevention pattern on the recess;
gate structures on a first portion of the active pattern at a first side of the recess and a second portion of the active pattern at a second side of the recess;
channels spaced apart from each other in a vertical direction perpendicular to an upper surface of the substrate, each of the channels extending through one of the gate structures; and
a source/drain layer on the growth prevention pattern, the source/drain layer being connected to the channels and including a semiconductor material doped with impurities,
wherein the source/drain layer directly contacts an upper surface of the growth prevention pattern, and the upper surface of the growth prevention pattern is lower than an uppermost surface of the active pattern.

18. The semiconductor device of claim 17, wherein the recess has a "U" shape.

19. The semiconductor device of claim 17, further comprising an inner spacer on a sidewall of each of the gate structures between the channels, and on a sidewall of each of the gate structures between an upper surface of the active pattern and a lowermost one of the channels.

20. The semiconductor device of claim 19, wherein each of the growth prevention pattern and the inner spacer includes a nitride.

* * * * *